(12) United States Patent
Kaiser et al.

(10) Patent No.: US 8,941,297 B2
(45) Date of Patent: Jan. 27, 2015

(54) ORGANIC ELECTROLUMINESCENT DEVICE

(75) Inventors: Joachim Kaiser, Darmstadt (DE); Horst Vestweber, Gilserberg (DE); Simone Leu, Dittelsheim-Hessloch (DE); Holger Heil, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 26 days.

(21) Appl. No.: 13/697,030

(22) PCT Filed: Apr. 13, 2011

(86) PCT No.: PCT/EP2011/001870
§ 371 (c)(1),
(2), (4) Date: Nov. 9, 2012

(87) PCT Pub. No.: WO2011/141109
PCT Pub. Date: Nov. 17, 2011

(65) Prior Publication Data
US 2013/0049579 A1 Feb. 28, 2013

(30) Foreign Application Priority Data
May 11, 2010 (DE) .......................... 10 2010 020 044

(51) Int. Cl.
*H01L 51/50* (2006.01)
*H01L 51/00* (2006.01)

(52) U.S. Cl.
CPC ........ *H01L 51/5016* (2013.01); *H01L 51/5036* (2013.01); *H01L 51/0059* (2013.01); *H01L 51/0067* (2013.01); *H01L 51/0085* (2013.01); *H01L 51/0087* (2013.01)
USPC .......................................... 313/504; 428/690

(58) Field of Classification Search
USPC .................................... 313/504, 506; 428/690
See application file for complete search history.

(56) References Cited

U.S. PATENT DOCUMENTS

| 7,175,922 | B2 * | 2/2007 | Jarikov et al. ................. 428/690 |
| 2005/0260439 | A1 * | 11/2005 | Shiang et al. ................. 428/690 |
| 2006/0125380 | A1 * | 6/2006 | Nagara et al. ................. 313/504 |
| 2006/0158104 | A1 * | 7/2006 | Iijima et al. ................... 313/504 |
| 2006/0279203 | A1 * | 12/2006 | Forrest et al. ................. 313/504 |

FOREIGN PATENT DOCUMENTS

| EP | 1670082 A3 | 7/2009 |
| EP | 1670083 A3 | 7/2009 |
| EP | 0929104 B1 | 8/2009 |
| EP | 1434284 A3 | 10/2009 |

OTHER PUBLICATIONS

International Search Report for PCT/EP2011/001870 mailed Sep. 6, 2011.

* cited by examiner

*Primary Examiner* — Mary Ellen Bowman
(74) *Attorney, Agent, or Firm* — Drinker Biddle & Reath LLP

(57) ABSTRACT

The present invention relates to white-emitting organic electroluminescent devices which have a fluorescent emitter layer and a phosphorescent emitter layer.

16 Claims, 1 Drawing Sheet

Structure of the electroluminescent device according to the invention

Structure of the electroluminescent device according to the invention
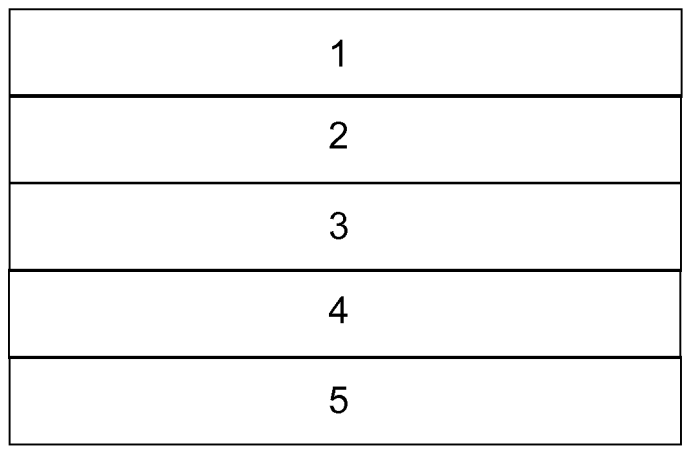

ORGANIC ELECTROLUMINESCENT DEVICE

RELATED APPLICATIONS

This application is a national stage application (under 35 U.S.C. §371) of PCT/EP2011/001870, filed Apr. 13, 2011, which claims benefit of German Application No. 10 2010 020 044.1, filed May 11, 2010. Both are incorporated by reference herein in their entirety.

The present invention relates to white-emitting organic electroluminescent devices having two emitting layers which comprise an emitting layer comprising a phosphorescent dopant and an emitting layer comprising a fluorescent dopant.

The structure of organic electroluminescent devices (OLEDs) in which organic semiconductors are employed as functional materials is described, for example, in U.S. Pat. Nos. 4,539,507, 5,151,629, EP 0676461 and WO 98/27136. A development in the area of organic electroluminescent devices are white-emitting OLEDs. These can be employed either for monochrome-white displays or, with coloured filters, for full-colour displays. They are furthermore suitable for lighting applications. White-emitting organic electroluminescent devices based on low-molecular-weight compounds generally have at least two emission layers. Electroluminescent devices having precisely two emission layers are used, in particular, for passive-matrix applications, where frequently in accordance with the prior art only fluorescent emitters are used for this purpose. The electroluminescent devices mostly have at least three emission layers, which exhibit blue, green and orange or red emission. Either fluorescent or phosphorescent emitters are used in the emission layers, where the phosphorescent emitters exhibit significant advantages owing to the higher achievable efficiency. The general structure of a white-emitting OLED of this type having at least one phosphorescent layer is described, for example, in WO 2005/011013. Owing to the higher achievable efficiency, a white-emitting OLED which comprises only phosphorescent emitter layers would be desirable. However, since blue-phosphorescent emitters generally do not meet current requirements, in particular with respect to the operating lifetime, hybrid OLEDs, i.e. a fluorescent blue emitter layer combined with phosphorescent orange or red and green emitter layers (in the case of three-colour white) or a fluorescent blue emitter layer combined with a phosphorescent yellow to orange emitter layer (in the case of two-colour white), are used in accordance with the prior art in most applications.

A basic problem of such hybrid OLEDs consists in that common matrix and emitter materials which are used in the blue-phosphorescent emitter layer have an excessively low triplet level for phosphorescent dopants, which may lead to triplet excitons being extinguished via the blue emitter layer. This results in low efficiency of the OLED. In order to achieve maximum efficiency from a white hybrid OLED, care must be taken to prevent this extinguishing of triplet excitons. One possibility in accordance with the prior art consists in preventing direct contact between the fluorescent emitter layer and the phosphorescent emitter layer by the introduction of a non-luminous interlayer. This interlayer usually consists of a mixture of two materials, where one tends to have hole-conducting properties and the other tends to have electron-conducting properties.

Appl. Phys. Lett. 2008, 93, 073302 discloses an OLED having a three-colour white, where the red and green emitters are combined in one layer. The interlayer between the blue-fluorescent emitter layer and the red- and green-phosphorescent emitter layer consists of TCTA and TPBI. There is still considerable need for improvement here with respect to the efficiency. It is furthermore evident that it is difficult to set the correct colour, since only one device having acceptable warm white was obtained. The lifetime is not indicated.

US 2006/130883 discloses an interlayer between the fluorescent emitter layer and phosphorescent emitter layer in a white-emitting OLED, where the same material is preferably used in the interlayer and in the two adjacent emitter layers.

EP 1670082 and EP 1670083 disclose an interlayer between the fluorescent emitter layer and phosphorescent emitter layer in a white-emitting OLED, where the interlayer preferably comprises a hole-transport material and an electron-transport material.

US 2007/0099026 discloses white-emitting organic electroluminescent devices in which the green-, yellow- or red-emitting layer comprises a phosphorescent emitter and a mixture of a hole-conducting matrix material and an electron-conducting matrix material. Hole-conducting materials indicated are, inter alia, triarylamine and carbazole derivatives. Electron-conducting materials indicated are, inter alia, aluminium compounds and zinc compounds, oxadiazole compounds and triazine or triazole compounds. Good efficiencies and a long lifetime are disclosed for these OLEDs. The use of an interlayer between the blue emission layer and the green, yellow or red emission layer is not disclosed.

There is also a need for improvement in the prior art described above on use of interlayers between the emitting layer of a white-emitting OLED. This applies, in particular, to OLEDs which are based on a two-colour white, i.e. which have only precisely two emitting layers. Whereas OLEDs having precisely two emitting layers are of less interest for displays based on white with colour filters, these OLEDs are of interest for monochrome-white displays and for lighting applications owing to the simpler device structure. In particular, there is also a need for improvement here with respect to the efficiency, the operating lifetime, the ability to adjust the colour location, and the stability of the colour location at various luminances.

It is known that high demands are made of the materials of the interlayer, meaning that it is frequently difficult to achieve OLEDs comprising interlayers which simultaneously have the desired colour location, high efficiency and a long lifetime. In particular, the following demands are made of the interlayer:

1.) The interlayer must not significantly influence the charge balance. It must be capable of transporting holes and electrons to a sufficient and balanced extent, so that the emitter layers on both sides of the interlayer are supplied with both types of charge carrier in the correct amount. Only in this way can a white colour location be achieved. This greatly restricts the suitable materials with respect to HOMO and LUMO energies.
2.) The materials of the interlayer must have a sufficiently high triplet level in order not to extinguish triplet excitons themselves.
3.) The interlayer must not significantly shorten the operating lifetime of the OLED.

The technical problem on which the present invention is based therefore consists in providing a device architecture for a hybrid OLED having precisely two emitting layers which enables a desired white colour location to be set simply and reproducibly and at the same time enables high efficiency to be combined with a long operating lifetime.

Surprisingly, it has been found that an OLED having precisely two emitting layers in which a non-emitting interlayer is inserted between the phosphorescent emitter layer and the fluorescent emitter layer and in which at least one of the emitting layers comprises a dopant doped into a mixture of at least two matrix materials achieves very good efficiency, and the operating lifetime is significantly improved compared with an OLED which does not have a device structure of this type. Furthermore, the colour location can be set very well using a device structure of this type.

The invention thus relates to an organic electroluminescent device comprising anode, cathode and precisely two emitting layers, of which one emitting layer comprises a phosphorescent compound and the other emitting layer comprises a fluorescent compound, characterised in that at least one interlayer is present between the two emitting layers, and in that furthermore at least one of the two emitting compounds has been doped into a mixture of at least two materials.

In a preferred embodiment of the invention, the layer emitting at longer wavelength comprises the phosphorescent compound, and the layer emitting at shorter wavelength comprises the fluorescent compound.

The at least two materials into which the one of the two emitting compounds has been doped are matrix materials. A matrix material here is a material which can be used in an emission layer in order to dope the emitting material into the latter in typically a volume concentration of <25%, but which does not itself significantly contribute to light emission, in contrast to the doped-in emitter material. What materials significantly contribute to light emission in an emitter layer and what do not, and what materials can thus be regarded as emitters and what can be regarded as matrix materials, can be recognised by a comparison of the electroluminescence spectrum of the OLED in which the emitter layer is present with photoluminescence spectra of the individual materials. The photoluminescence spectrum of the individual materials is measured here in solution in a concentration of 1.5 mg in 250 ml of solvent, where the measurement takes place at room temperature and any solvent in which the substance dissolves in the said concentration is suitable. Particularly suitable solvents are usually toluene, but also dichloromethane.

In a preferred embodiment of the invention, precisely one interlayer is present between the two emitting layers. This is preferably a non-emitting interlayer, i.e. this layer exhibits no emission during operation of the OLED. This can again be recognised by a comparison of the electroluminescence spectrum of the OLED with photoluminescence spectra of the materials from the interlayer.

In a preferred embodiment of the invention, the device is a white-emitting organic electroluminescent device. This is characterised in that it emits light having CIE colour coordinates in the range 0.25<CIE x<0.45 and 0.25<CIE y<0.48, preferably 0.28<CIE x<0.38 and 0.29<CIE y<0.38 and particularly preferably 0.30<CIE x<0.35 and 0.31<CIE y<0.35. Alternatively, preference is also given to CIE colour coordinates in the range 0.38<x<0.47 and 0.38<y<0.44 and particularly preferably 0.41<x<0.46 and 0.40<y<0.43.

The organic electroluminescent device according to the invention comprises, as described above, anode, cathode and precisely two emitting layers which are arranged between the anode and the cathode. The organic electroluminescent device need not necessarily comprise only layers which are built up from organic or organometallic materials. Thus, it is also possible for anode, cathode and/or one or more layers to comprise inorganic materials or to be built up entirely from inorganic materials.

In a preferred embodiment of the invention, the fluorescent emitter layer is a blue-emitting layer and the phosphorescent emitter layer is a yellow-, orange- or red-emitting emitter layer. The blue-emitting layer can be a deep-blue- or a pale-blue-emitting layer. Particular preference is given to the combination of a pale-blue emitter layer with an orange emitter layer.

The yellow-, orange- or red-phosphorescent layer can be arranged on the anode side and the blue-phosphorescent layer on the cathode side. It is likewise possible for the yellow- or orange-phosphorescent layer to be arranged on the cathode side and the blue-fluorescent layer on the anode side.

In a preferred embodiment of the invention, the organic electroluminescent device according to the invention has the following layer structure: anode-phosphorescent emitter layer-interlayer-fluorescent emitter layer-cathode. This structure is depicted diagrammatically in FIG. 1, where (1) stands for the anode, (2) stands for the phosphorescent emitter layer, (3) stands for the interlayer, (4) stands for the fluorescent emitter layer and (5) stands for the cathode. The organic electroluminescent layer according to the invention may also comprise further layers which are not depicted in FIG. 1. The fluorescent emitter layer emitting at shorter wavelength is thus preferably arranged on the cathode side.

A yellow-emitting layer here is taken to mean a layer whose photoluminescence maximum is in the range from 540 to 570 nm. A orange-emitting layer is taken to mean a layer whose photoluminescence maximum is in the range from 570 to 600 nm. A red-emitting layer is taken to mean a layer whose photoluminescence maximum is in the range from 600 to 750 nm. A green-emitting layer is taken to mean a layer whose photoluminescence maximum is in the range from 490 to 540 nm. A pale-blue-emitting layer is taken to mean a layer whose photoluminescence maximum is in the range from 460 to 490 nm, a deep-blue-emitting layer is taken to mean a layer whose photoluminescence maximum is in the range from 440 to 460 nm. The photoluminescence maximum here is determined by measurement of the photoluminescence spectrum of the layer with a layer thickness of 50 nm, where the layer has the same composition as in the organic electroluminescent device, i.e. comprises emitter and matrix.

A phosphorescent compound in the sense of this invention, as is present in the phosphorescent emitter layer of the organic device according to the invention, is a compound which exhibits luminescence from an excited state having relatively high spin multiplicity, i.e. a spin state >1, in particular from an excited triplet state, at room temperature. In the sense of this invention, all luminescence transition-metal complexes, in particular all luminescent iridium, platinum and copper compounds, are to be regarded as phosphorescent compounds.

A fluorescent compound in the sense of this invention, as is present in the fluorescent emitter layer, is a compound which exhibits luminescence from an excited singlet state at room temperature. In the sense of this invention, all luminescent compounds which are built up only from the elements C, H, N, O, S, F, B and P are to be taken to be fluorescent compounds.

The structure of the interlayer which is present between the phosphorescent emitter layer and the fluorescent emitter layer is described in greater detail below.

In a preferred embodiment of the invention, the organic electroluminescent device comprises precisely one interlayer between the two emitting layers.

The interlayer must have both hole-conducting and electron-conducting properties. The interlayer here may be built up from a single material which has both hole-conducting properties and electron-conducting properties. In a preferred embodiment of the invention, however, the interlayer comprises a mixture of at least one hole-conducting material and at least one electron-conducting material. In a particularly preferred embodiment of the invention, the interlayer comprises a mixture of precisely one hole-conducting material and precisely one electron-conducting material.

Both the hole-conducting material and the electron-conducting material here are preferably materials whose triplet energy is greater than the triplet energy of the emitter of the adjacent phosphorescent emitter layer. The triplet energy of the hole-conducting and electron-conducting materials of interlayer 1 is preferably >2.1 eV, particularly preferably >2.3 eV.

The triplet energy $E(T_1)$ of a molecule is defined as the energy difference between the energy of the ground state $E(G)$ of a molecule and the energy of the lowest triplet state $E(T)$ of this molecule, both energies in eV. This quantity can be determined experimentally or calculated via quantum-chemical methods. For experimental determination, use is made of the optical transition from the lowest triplet state into the ground state. This transition is also referred to as phosphorescence, which typically has an emitting lifetime in the range from µs to s. In contrast to fluorescence (=optical transition from the lowest singlet state), phosphorescence is usually quite weak since this transition is spin-forbidden. In the case of molecules, such as, for example, tris(phenylpyridine) iridium, in which the transition is less forbidden, the phosphorescence can be measured with the aid of a simple photoluminescence spectrometer. The corresponding triplet energy is obtained from the emission edge (the greatest energy) of the phosphorescence spectrum. Suitable samples for this purpose are dilute solutions (about $10^{-5}$ mol $l^{-1}$) or thin films (about 50 nm thick) of the corresponding molecule. The crucial factor for the concentration or thickness is the absorbance of the sample at the excitation wavelength. It should be about 0.1. In the case of molecules whose phosphorescence cannot be observed so simply, it is possible on the one hand to increase the phosphorescence by suppressing interfering competing processes, such as, for example, extinction on oxygen or thermal deactivation. In order to exclude oxygen, it is advisable to degas the solution by means of the so-called pump-and-freeze technique. In order to suppress thermal deactivation of the phosphorescence, it is advisable to cool the sample in a cryostat with the aid of liquid nitrogen or helium. This increases the intensity of the phosphorescence. If the sample used is a solution, it is advisable to use a solvent or solvent mixture which forms a glass at low temperatures, such as, for example, 2-methyl-THF. The sensitivity of the apparatus compared with a simple photoluminescence spectrometer can be increased by using a (pulsed) laser for the excitation to the absorption maximum and carrying out the detection using a spectrometer which enables time-delayed detection in order to exclude, for example, on a time basis intense fluorescence which likewise occurs.

If the triplet energy cannot be determined experimentally by the above-mentioned method, an alternative consists in determining the triplet energy with the aid of a quantum-chemical calculation, for example by means of time-dependent density functional theory (TD-DFT). This is carried out via the commercially available Gaussian 03W software (Gaussian Inc.) using method B3PW91/6-31G(d). For the calculation of transition-metal complexes, the LANL2DZ base set is used.

The hole-conducting material used in interlayer 1 preferably has an HOMO (highest occupied molecular orbital) of >−5.4 eV, particularly preferably >−5.2 eV.

The electron-conducting material used in interlayer 1 preferably has an LUMO (lowest unoccupied molecular orbital) of <−2.4 eV, particularly preferably <−2.6 eV.

In an alternative embodiment of the invention, the interlayer comprises a material which is capable of transporting both electrons and holes. This material preferably has an HOMO of >−5.6 eV, particularly preferably >−5.4 eV, and an LUMO of <−2.4 eV, particularly preferably <−2.6 eV.

The mixing ratio of the hole-conducting compound and the electron-con-ducting compound in interlayer 1 is preferably between 90:10 and 10:90, particularly preferably between 80:20 and 20:80, in each case based on the volume.

The layer thickness of the interlayer is preferably between 1 and 20 nm, particularly preferably between 2 and 10 nm, very particularly preferably between 4 and 8 nm.

In a preferred embodiment of the invention, the electron-conducting material of interlayer 1 is an aromatic ketone.

An aromatic ketone in the sense of this invention is taken to mean a carbonyl group to which two aryl or heteroryl groups or aromatic or heteroaromatic ring systems are bonded directly.

In a preferred embodiment of the invention, the aromatic ketone is a compound of the following formula (1),

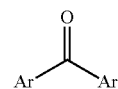

formula (1)

where the following applies to the symbols used:

Ar is on each occurrence, identically or differently, an aromatic or heteroaromatic ring system having 5 to 60 aromatic ring atoms, which may in each case be substituted by one or more groups $R^1$;

$R^1$ is on each occurrence, identically or differently, H, D, F, Cl, Br, I, CHO, C($=$O)Ar$^1$, P($=$O)(Ar$^1$)$_2$, S($=$O)Ar$^1$, S($=$O)$_2$Ar$^1$, CR$^2$$=$CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent CH$_2$ groups may be replaced by R$^2$C$=$CR$^2$, C$\equiv$C, Si(R$^2$)$_2$, Ge(R$^2$)$_2$, Sn(R$^2$)$_2$, C$=$O, C$=$S, C$=$Se, C$=$NR$^2$, P($=$O)(R$^2$), SO, SO$_2$, NR$^2$, O, S or CONR$^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

Ar$^1$ is on each occurrence, identically or differently, an aromatic or heteroaromatic ring system having 5 to 40 aromatic ring atoms, which may be substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another.

An aryl group in the sense of this invention contains at least 6 C atoms; a heteroaryl group in the sense of this invention contains at least 2 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a short non-aromatic unit, such as, for example, a C, N or O atom or a carbonyl group. Thus, for example, systems such as 9,9'-spirobifluorene, 9,9-diarylfluorene, triarylamine, diaryl ether, diarylmethane, stilbene, benzophenone, etc., are also intended to be taken to be aromatic ring systems in the sense of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methyl-pentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl or cyclooctenyl. A $C_2$- to $C_{40}$-alkynyl group is preferably taken to mean ethynyl, propynyl, butynyl, pentynyl, hexynyl, heptynyl and octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy and 2-methylbutoxy. An aromatic or heteroaromatic ring system having 5-60 aromatic ring atoms, which may also in each case be substituted by the above-mentioned radicals R and which may be linked to the aromatic or hetero-aromatic ring system via any desired positions, is taken to mean, in particular, groups derived from benzene, naphthalene, anthracene, phenanthrene, benzanthracene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Suitable compounds of the formula (1) are, in particular, the ketones disclosed in WO 2004/093207 and WO 2010/006680. These are incorporated into the present invention by way of reference.

It is evident from the definition of the compounds of the formula (1) that they do not have to contain just one carbonyl group, but instead may also contain a plurality of carbonyl groups.

The group Ar in compounds of the formula (1) is preferably an aromatic ring system having 6 to 40 aromatic ring atoms, i.e. it does not contain any heteroaryl groups. As defined above, the aromatic ring system does not necessarily have to contain only aromatic groups, but instead two aryl groups may also be interrupted by a non-aromatic group, for example by a further carbonyl group.

In a further preferred embodiment of the invention, the group Ar contains not more than two condensed rings. It is thus preferably built up only from phenyl and/or naphthyl groups, particularly preferably only from phenyl groups, but does not contain any larger condensed aromatic groups, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenyl-methanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3-or 4-pyridyl, 2-, 4- or 5-pyrimidinyl, 2- or 3-pyrazinyl, 3- or 4-pyridazinyl, 2-(1,3,5-triazin)yl, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals.

The groups Ar may be substituted by one or more radicals $R^1$. These radicals $R^1$ are preferably selected, identically or differently on each occurrence, from the group consisting of H, D, F, $C(=O)Ar^1$, $P(=O)(Ar^1)_2$, $S(=O)Ar^1$, $S(=O)_2Ar^1$, a straight-chain alkyl group having 1 to 4 C atoms or a branched or cyclic alkyl group having 3 to 5 C atoms, each of which may be substituted by one or more radicals $R^2$, where one or more H atoms may be replaced by D or F, or an aromatic ring system having 6 to 24 aromatic ring atoms, which may be substituted by one or more radicals $R^2$, or a combination of these systems; two or more adjacent substituents R¹ here may also form a mono- or polycyclic, aliphatic or aromatic ring system with one another. If the organic electroluminescent device is applied from solution, straight-chain, branched or cyclic alkyl groups having up to 10 C atoms are also preferred as substituents R¹. The radicals R¹ are particularly preferably selected, identically or differently on each occurrence, from the group consisting of H, C(=O)Ar¹ or an aromatic ring system having 6 to 24 aromatic ring atoms, which may be substituted by one or more radicals R², but is preferably unsubstituted.

In a further preferred embodiment of the invention, the group Ar¹ is, identically or differently on each occurrence, an aromatic ring system having 6 to 24 aromatic ring atoms, which may be substituted by one or more radicals R². Ar¹ is particularly preferably, identically or differently on each occurrence, an aromatic ring system having 6 to 12 aromatic ring atoms.

Particular preference is given to benzophenone derivatives which are substituted in each of the 3,5,3',5'-positions by an aromatic or heteroaromatic ring system having 5 to 30 aromatic ring atoms, which may in turn be substituted by one or more radicals R¹ as defined above. Preference is furthermore given to ketones which are substituted by at least one spirobifluorene group.

Preferred aromatic ketones are therefore furthermore the compounds of the following formula (2) to (5),

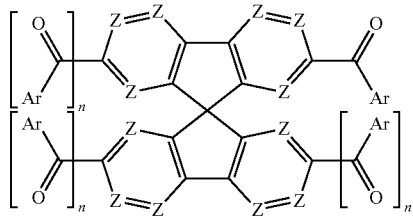

formula (2)

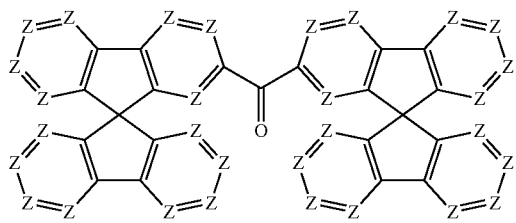

formula (3)

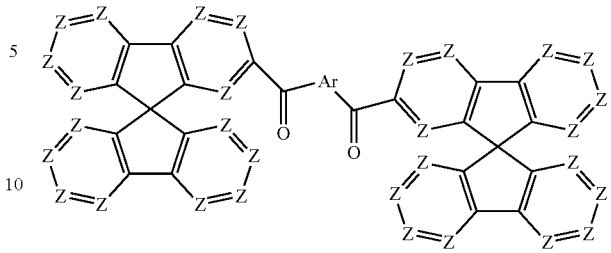

formula (4)

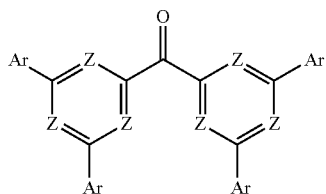

formula (5)

where Ar and R¹ have the same meaning as described above for formula (1), and furthermore:

Z is, identically or differently on each occurrence, $CR^1$ or N;

n is, identically or differently on each occurrence, 0 or 1.

Ar in the formulae (2), (4) and (5) preferably stands for an aromatic or heteroaromatic ring system having 5 to 30 aromatic ring atoms, which contains no condensed aryl groups having more than 10 aromatic ring atoms, preferably no condensed aryl groups at all, and which may be substituted by one or more radicals R¹. Particular preference is given to the groups Ar mentioned as preferred above. Particular preference is likewise given to the groups R¹ mentioned as preferred above.

Examples of suitable compounds of the formula (1) to (5) which can be employed as electron-conducting material in the interlayer are compounds (1) to (59) depicted below.

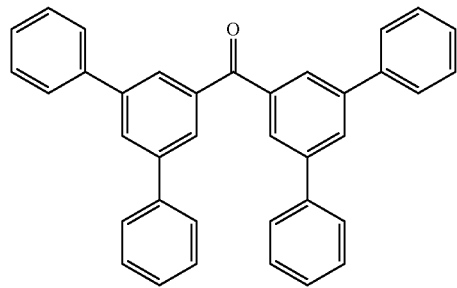

(1)

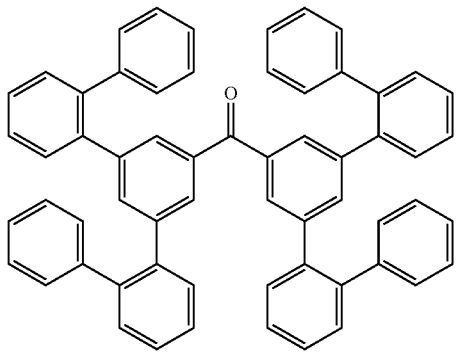

(2)

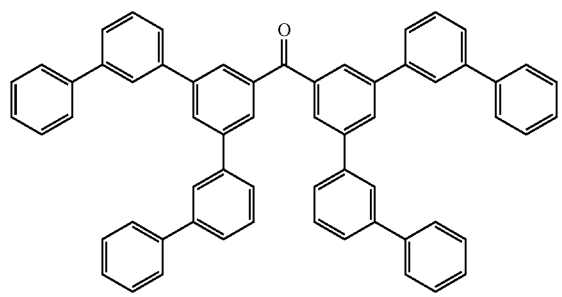
(3)
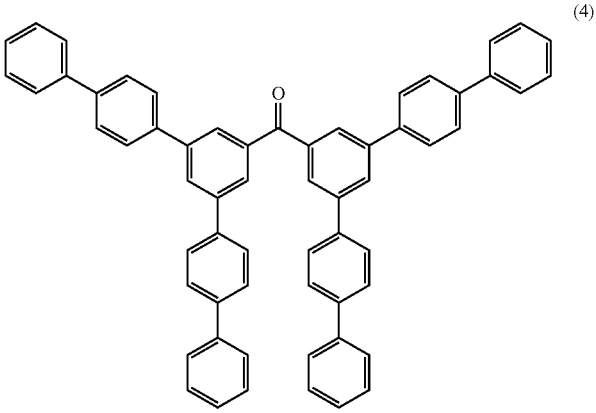
(4)
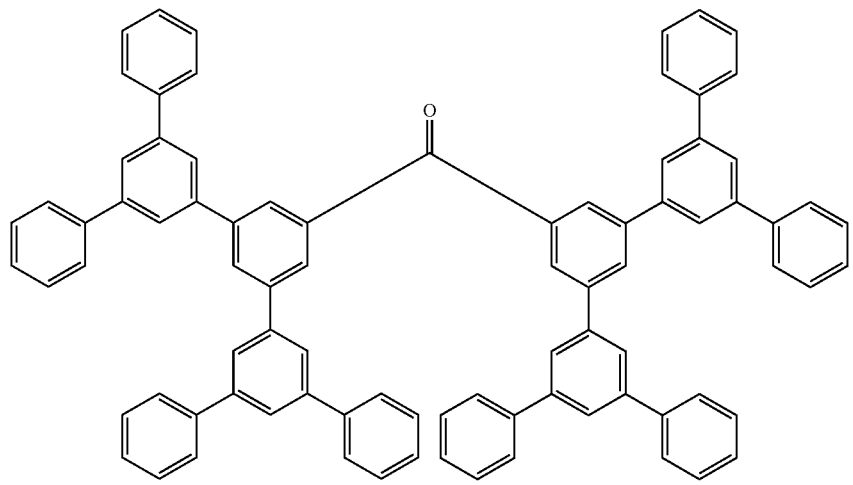
(5)
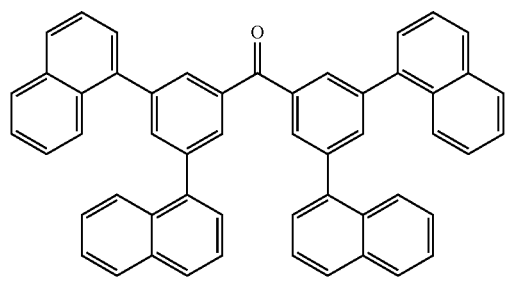
(6)
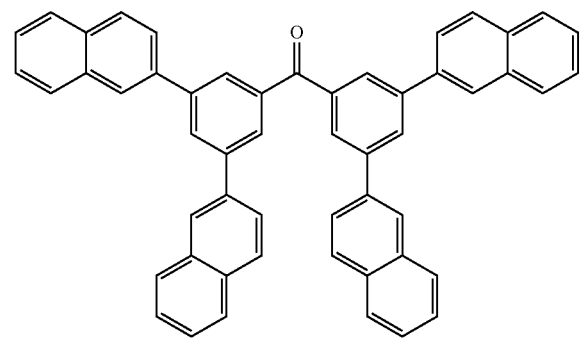
(7)
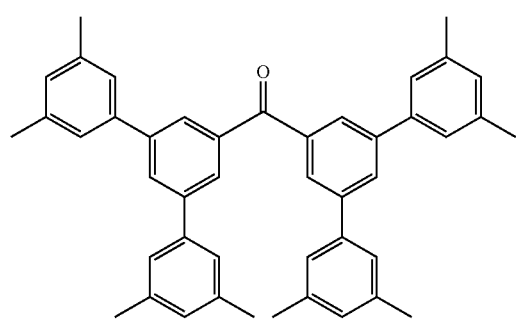
(8)
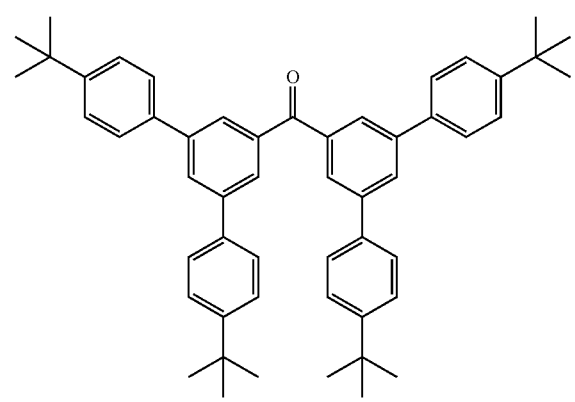
(9)

-continued
(10)
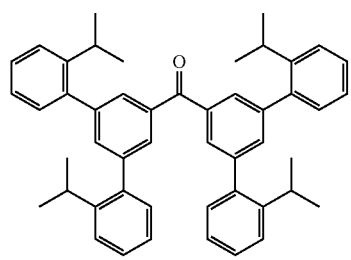
(11)
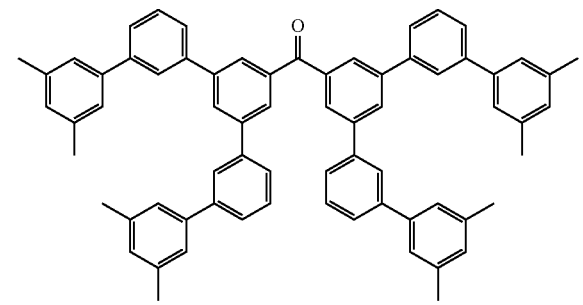
(12)
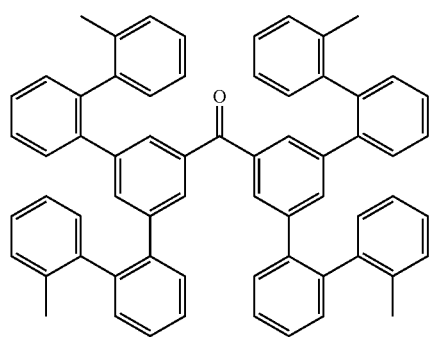
(13)
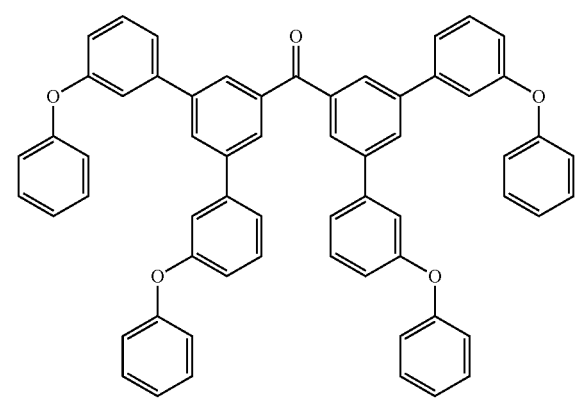
(14)
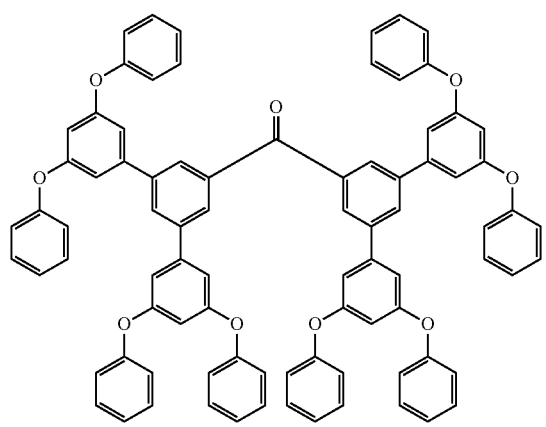
(15)
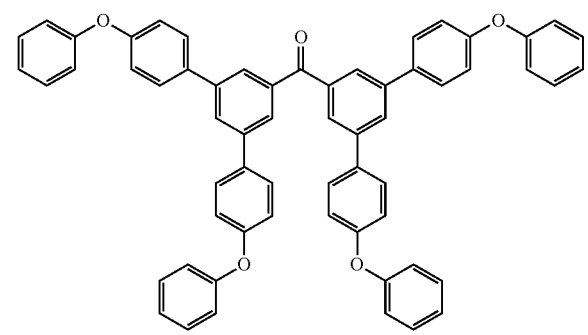
(16)
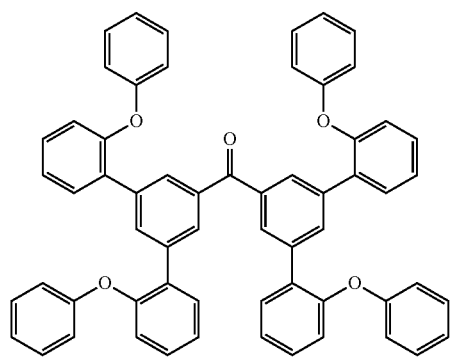
(17)
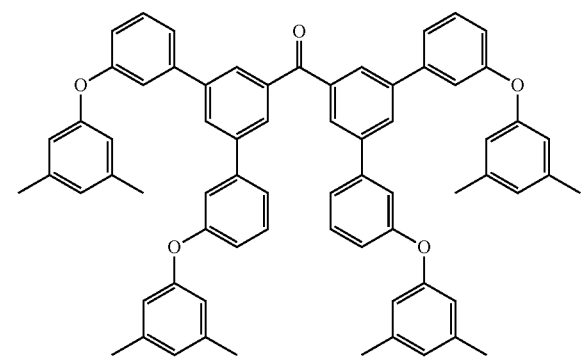

(18)
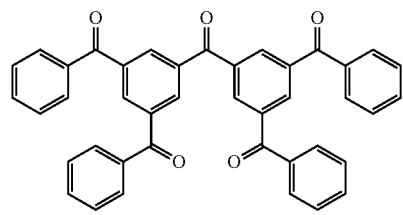
(19)
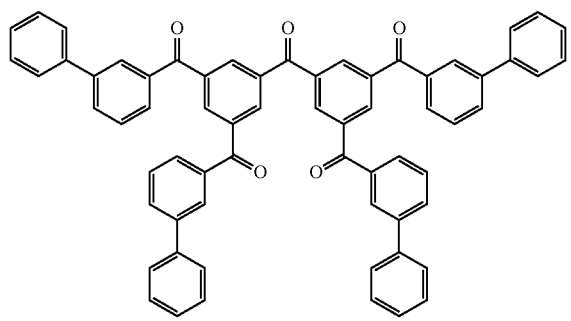
(20)
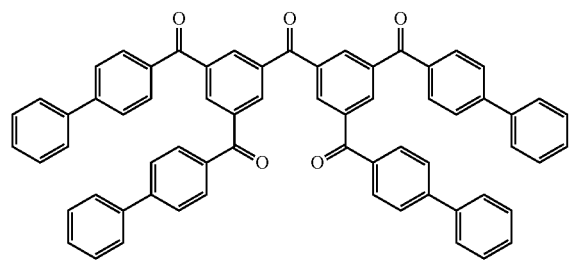
(21)
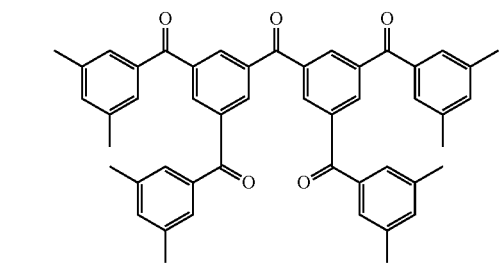
(22)
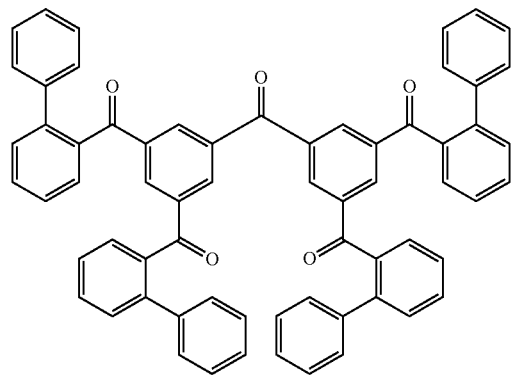
(23)
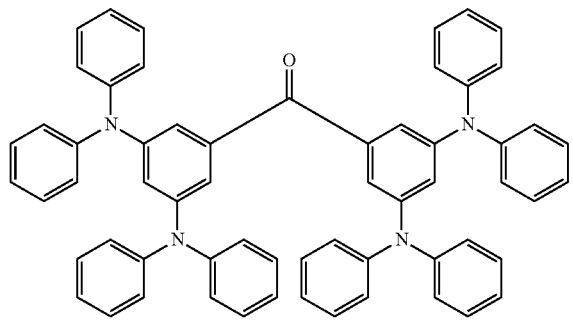
(24)
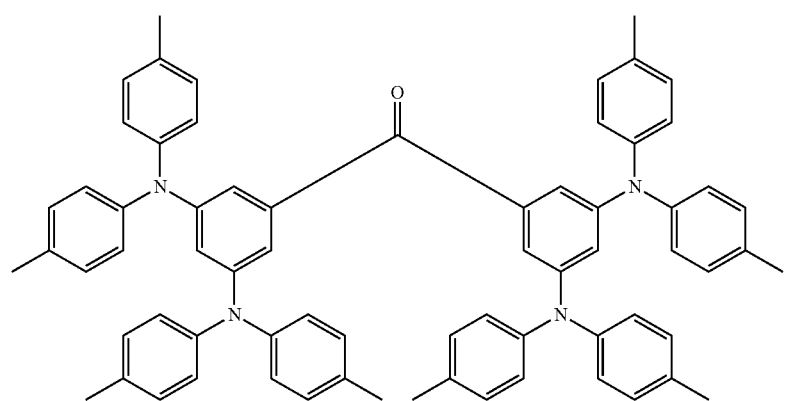

-continued
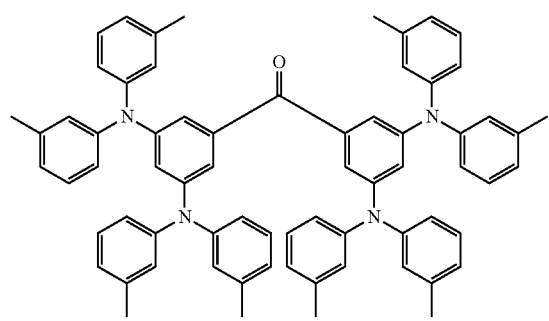
(25)
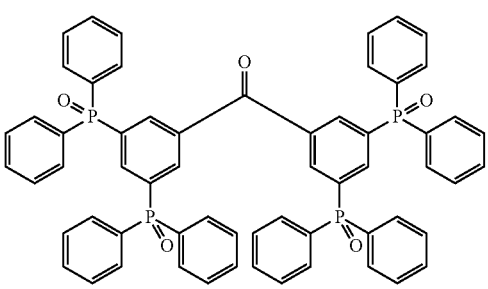
(26)
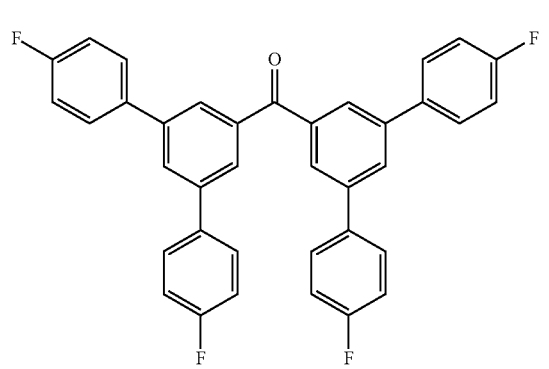
(27)
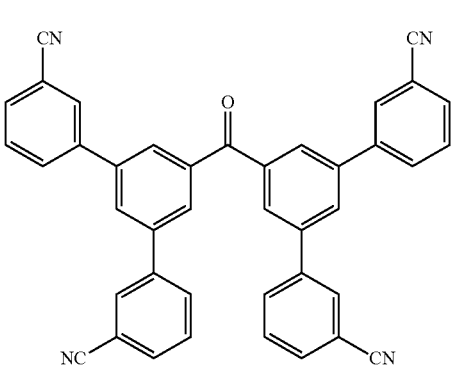
(28)
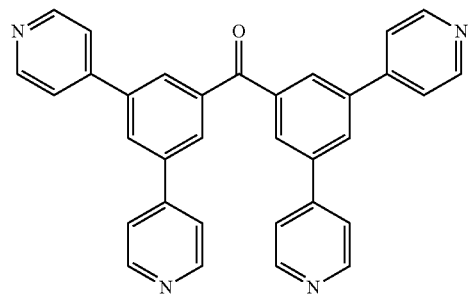
(29)
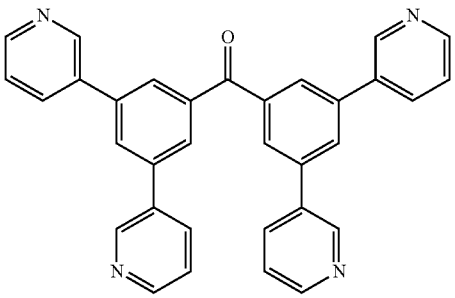
(30)
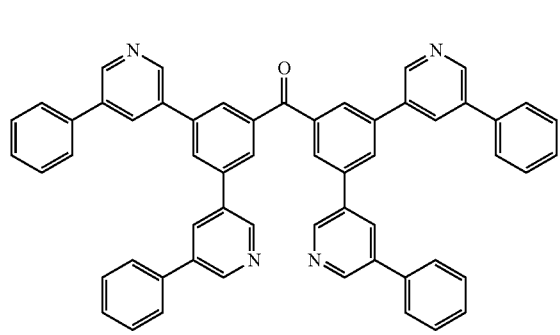
(31)
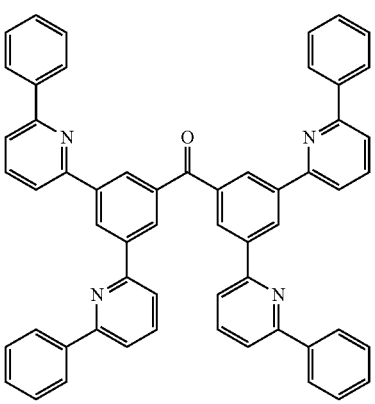
(32)

-continued
(33)
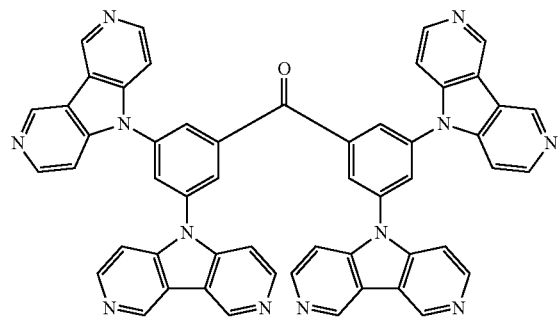
(34)
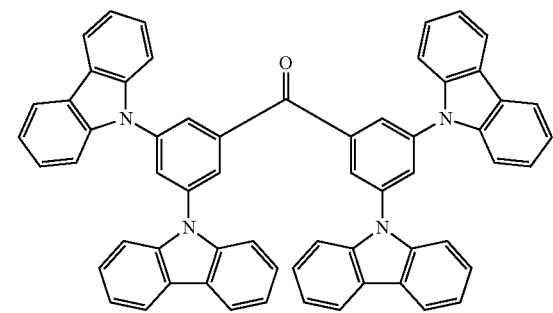
(35)
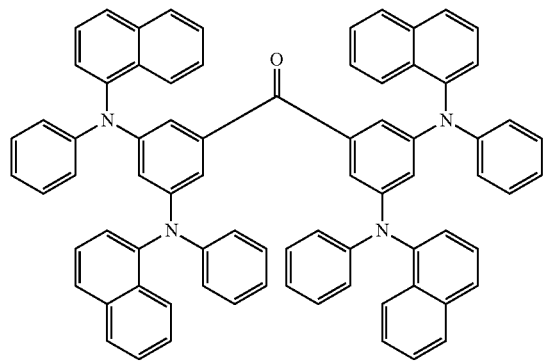
(36)
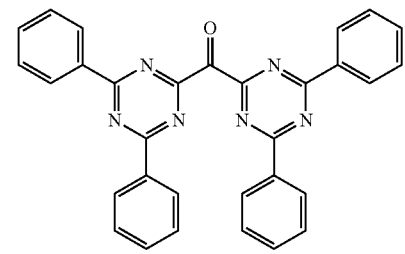
(37)
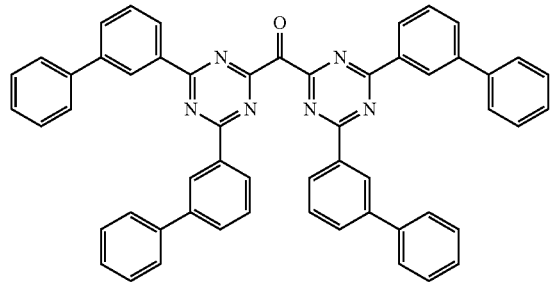
(38)
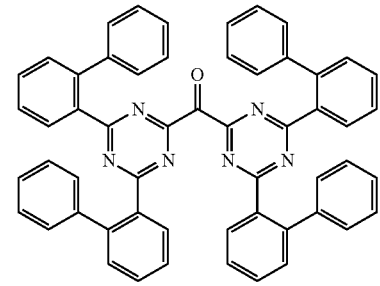
(39)
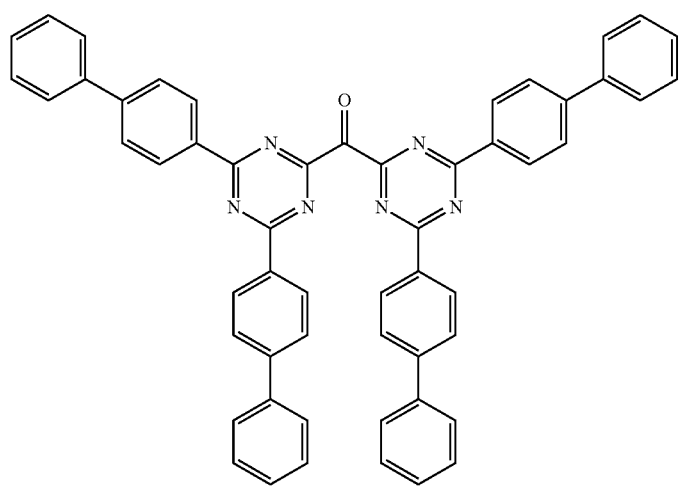

(40)
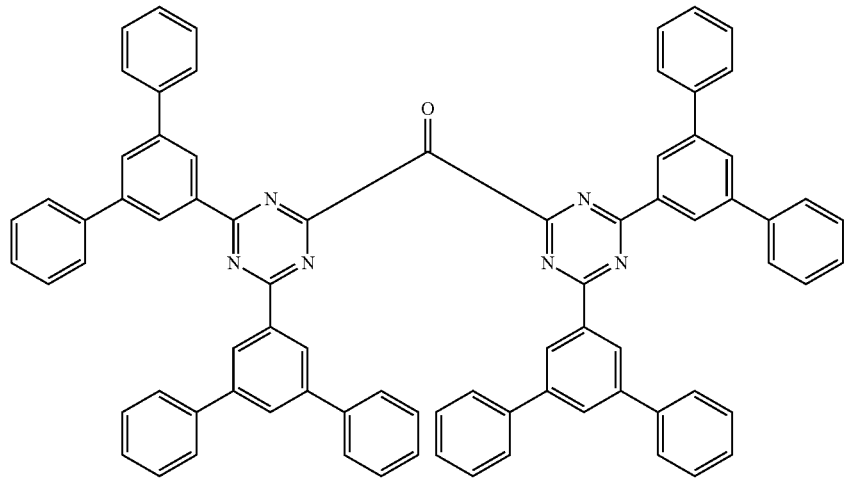
(41)
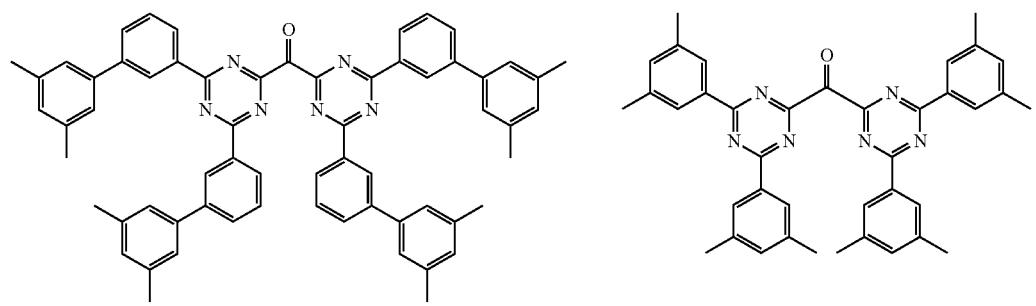
(42)
(43)
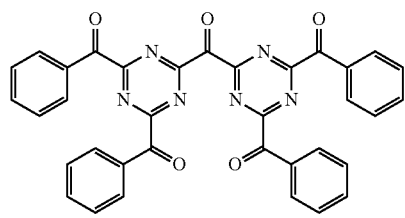
(44)
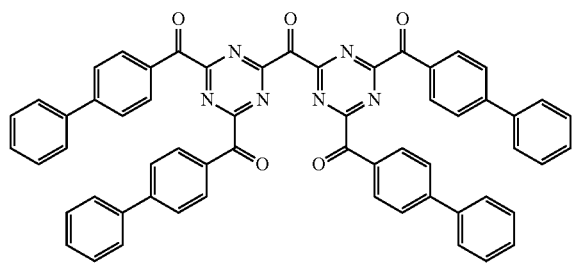
(45)
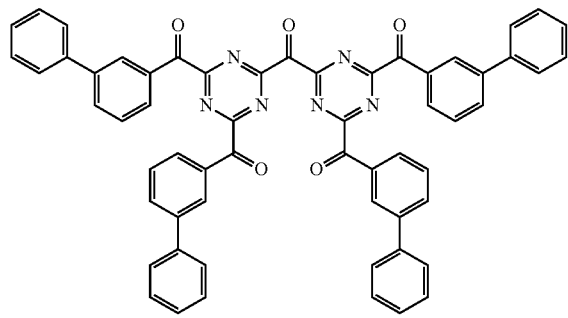
(46)
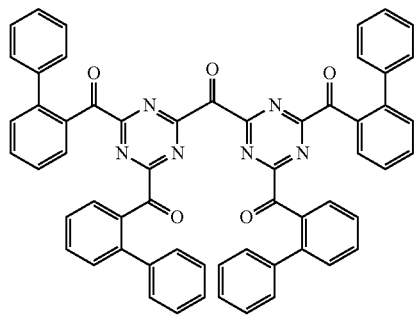

-continued
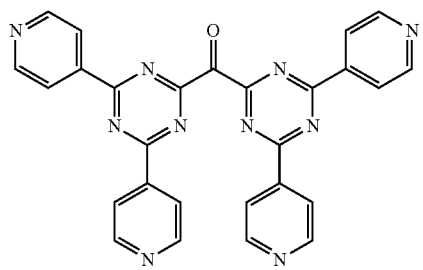
(47)
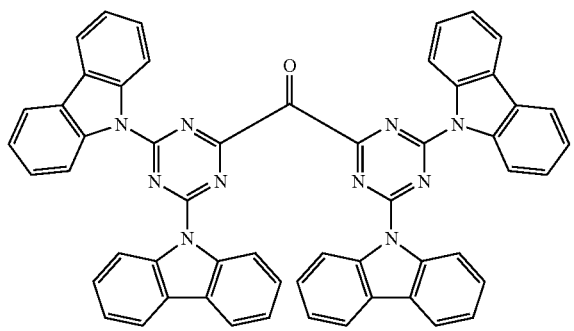
(48)
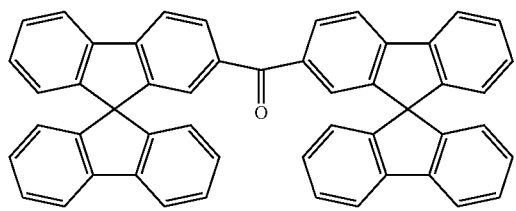
(49)
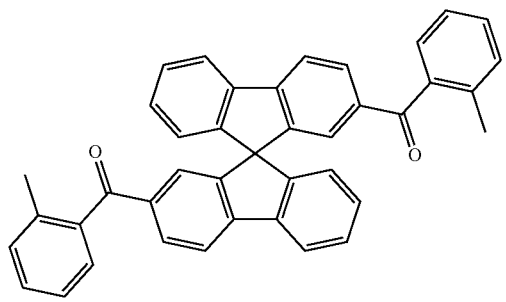
(51)
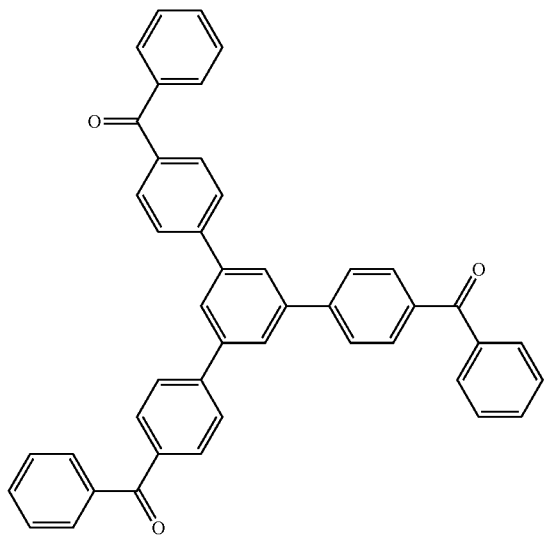
(50)
(52)
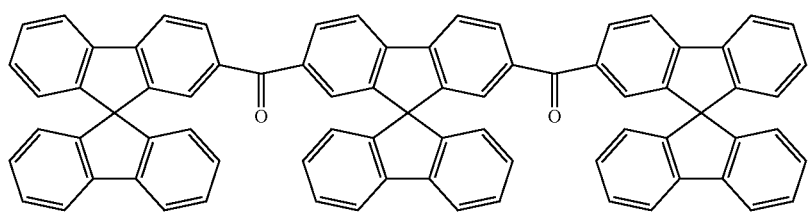
(53)
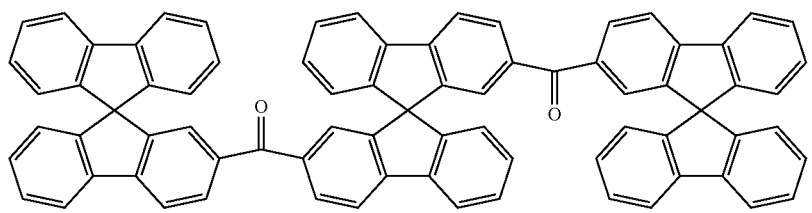
(54)

-continued
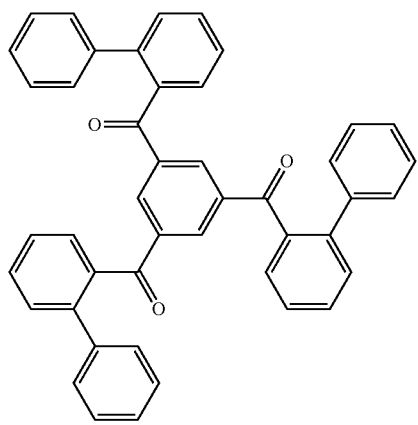
(55)
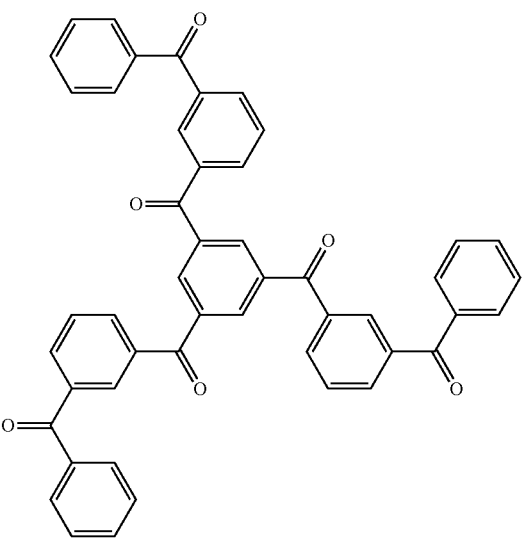
(56)
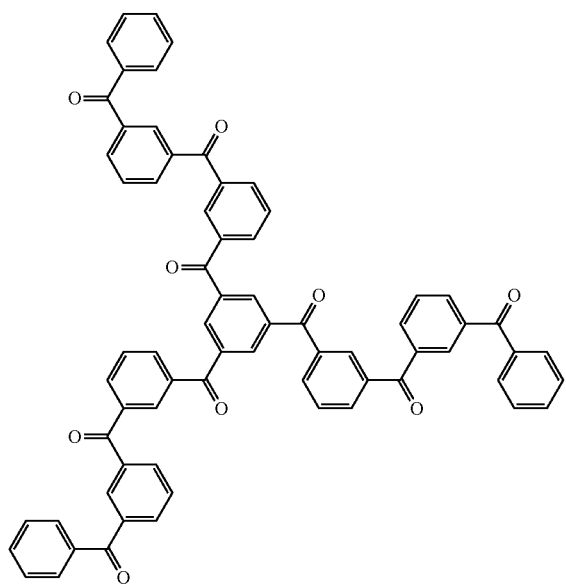
(57)
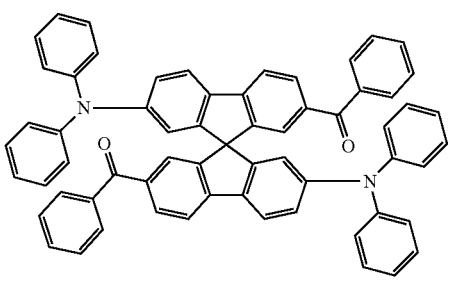
(58)
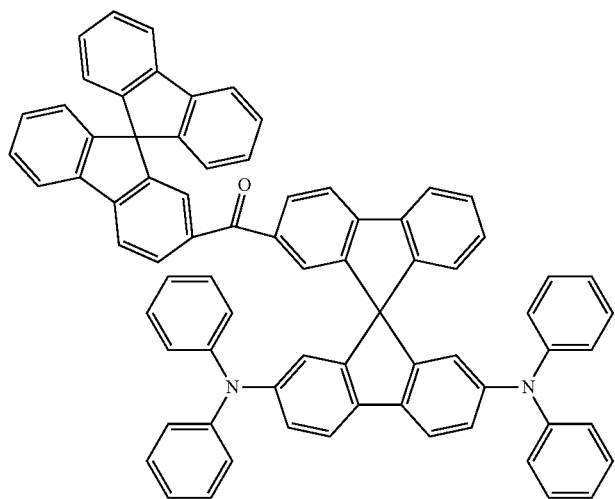
(59)

In a further preferred embodiment of the invention, the electron-conducting material is a triazine derivative which is substituted by at least one aromatic or heteroaromatic ring system, preferably by at least two aromatic or heteroaromatic ring systems, particularly preferably by three aromatic or heteroaromatic ring systems. Suitable triazine derivatives which can be used as electron-conducting material are thus compounds of the following formula (6) or (7).

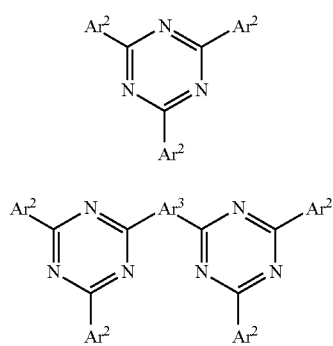

formula (6)

formula (7)

where $R^1$ has the meaning mentioned above, and the following applies to the other symbols used:

$Ar^2$ is, identically or differently on each occurrence, a monovalent aromatic or heteroaromatic ring system having 5 to 60 aromatic ring atoms, which may in each case be substituted by one or more radicals $R^1$;

$Ar^3$ is a divalent aromatic or heteroaromatic ring system having 5 to 60 aromatic ring atoms, which may be substituted by one or more radicals $R^1$.

In compounds of the formula (6) and (7), it is preferred for at least one group $Ar^2$ to be selected from the groups of the following formulae (8) to (15) and for the other groups $Ar^2$ to have the meaning indicated above,

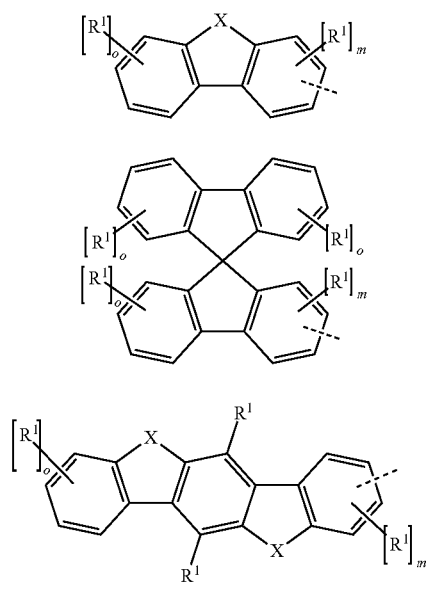

formula (8)

formula (9)

formula (10)

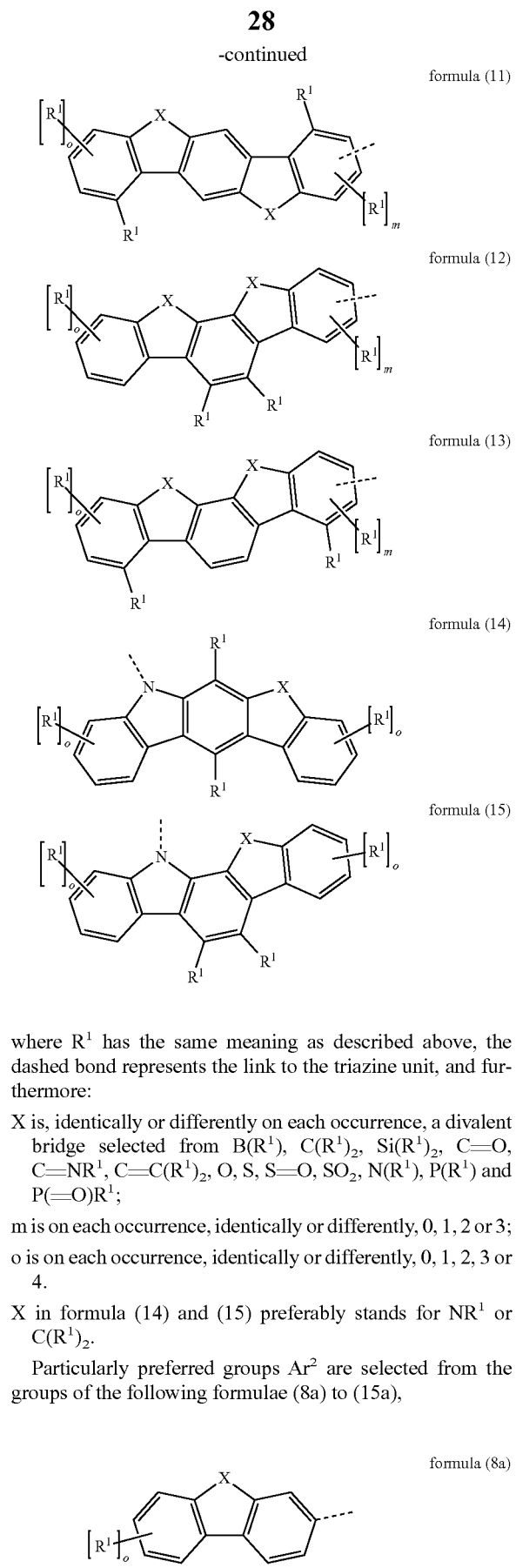

formula (11)

formula (12)

formula (13)

formula (14)

formula (15)

where $R^1$ has the same meaning as described above, the dashed bond represents the link to the triazine unit, and furthermore:

X is, identically or differently on each occurrence, a divalent bridge selected from $B(R^1)$, $C(R^1)_2$, $Si(R^1)_2$, $C=O$, $C=NR^1$, $C=C(R^1)_2$, O, S, $S=O$, $SO_2$, $N(R^1)$, $P(R^1)$ and $P(=O)R^1$;

m is on each occurrence, identically or differently, 0, 1, 2 or 3;

o is on each occurrence, identically or differently, 0, 1, 2, 3 or 4.

X in formula (14) and (15) preferably stands for $NR^1$ or $C(R^1)_2$.

Particularly preferred groups $Ar^2$ are selected from the groups of the following formulae (8a) to (15a), formula (8a)

-continued

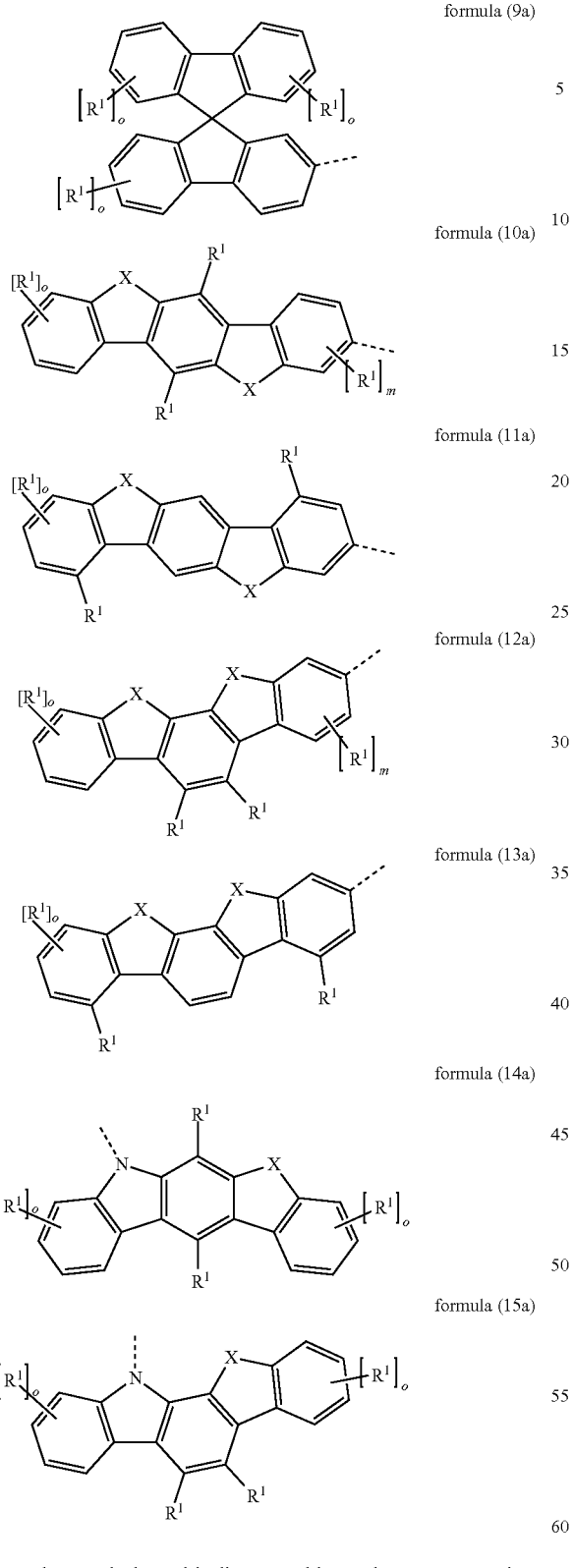

formula (9a)

formula (10a)

formula (11a)

formula (12a)

formula (13a)

formula (14a)

formula (15a)

where the symbols and indices used have the same meaning as described above. X here is preferably selected, identically or differently, from $C(R^1)_2$, $N(R^1)$, O and S, particularly preferably $C(R^1)_2$.

Preferred compounds of the formula (6) have one or two groups of the above-mentioned formula (8) to (15), in particular one group, and have two or one groups which are selected from phenyl, 1-naphthyl, 2-naphthyl, ortho-, meta- or para-biphenyl, each of which may be substituted by one or more radicals $R^1$.

Preferred groups $Ar^3$ in compounds of the formula (7) are selected from the groups of the following formulae (16) to (22),

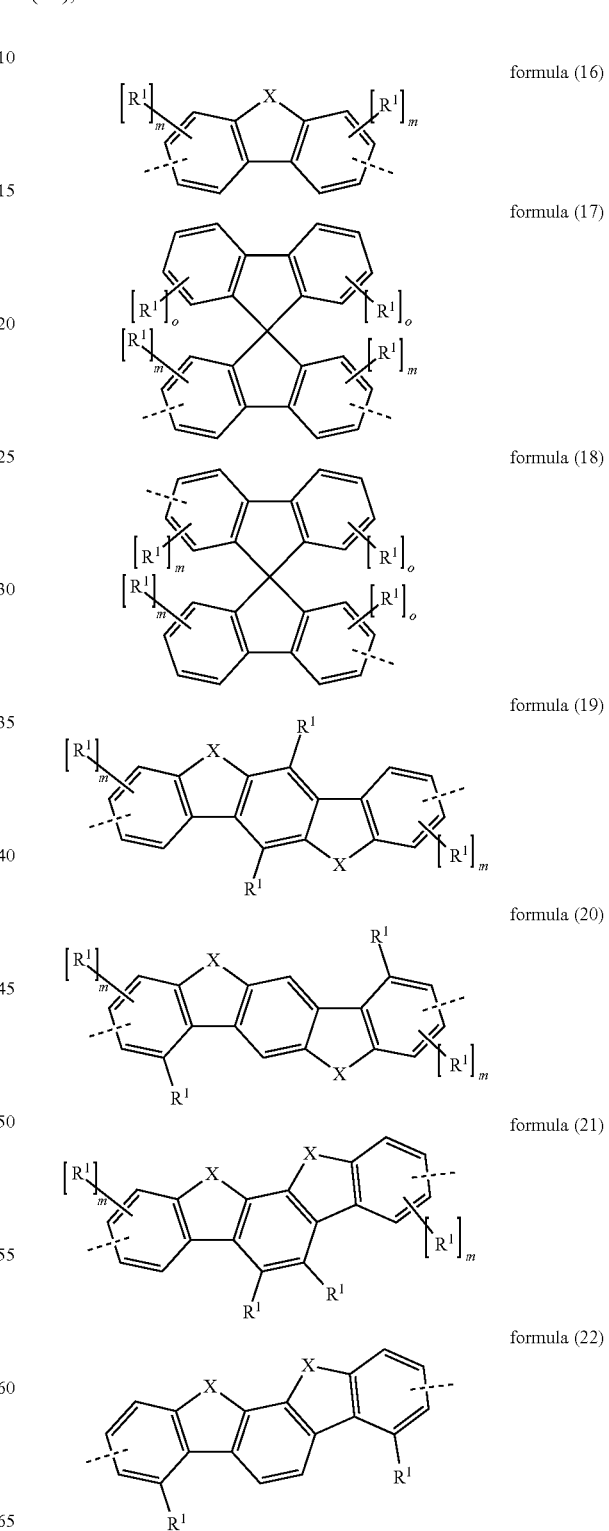

formula (16)

formula (17)

formula (18)

formula (19)

formula (20)

formula (21)

formula (22)

where the symbols and indices used have the same meaning as described above, and the dashed bond represents the link to the two triazine units.

Particularly preferred groups Ar³ are selected from the groups of the following formulae (16a) to (22a),

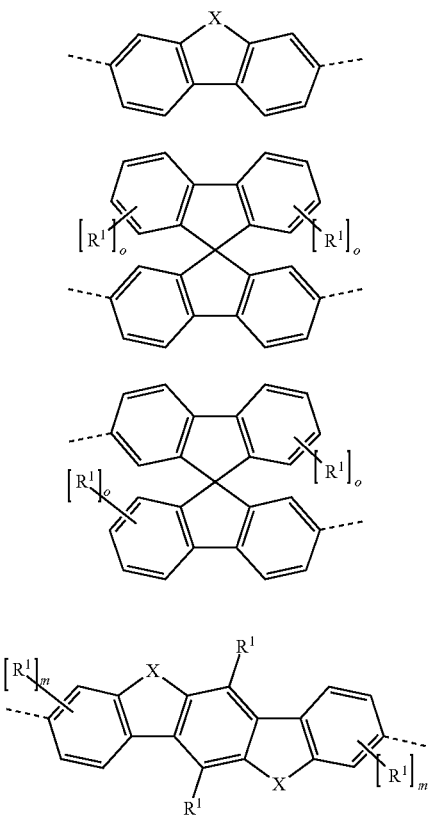

formula (16a)

formula (17a)

formula (18a)

formula (19a)

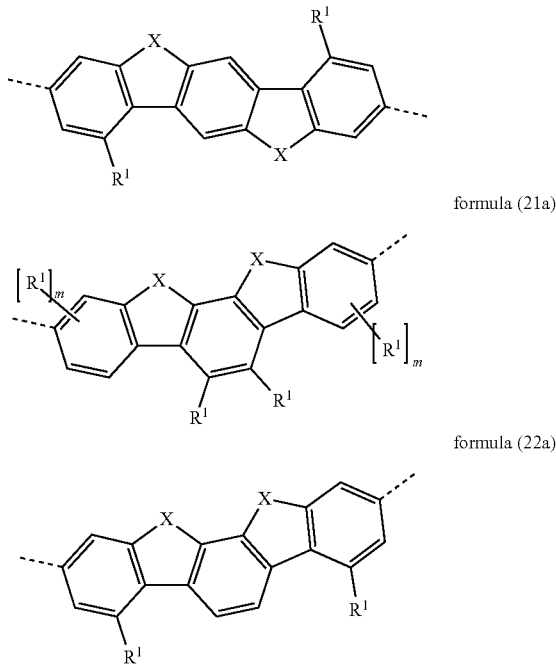

formula (20a)

formula (21a)

formula (22a)

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the formula (7) given above in which the group Ar² is selected from the formulae (15) to (21) given above, and Ar² is selected, identically or differently on each occurrence, from the formulae (8) to (14) given above or phenyl, 1- or 2-naphthyl, ortho-, meta- or para-biphenyl, each of which may be substituted by one or more radicals $R^1$, but are preferably unsubstituted.

Examples of suitable triazine derivatives are structures 1 to 150 depicted below.

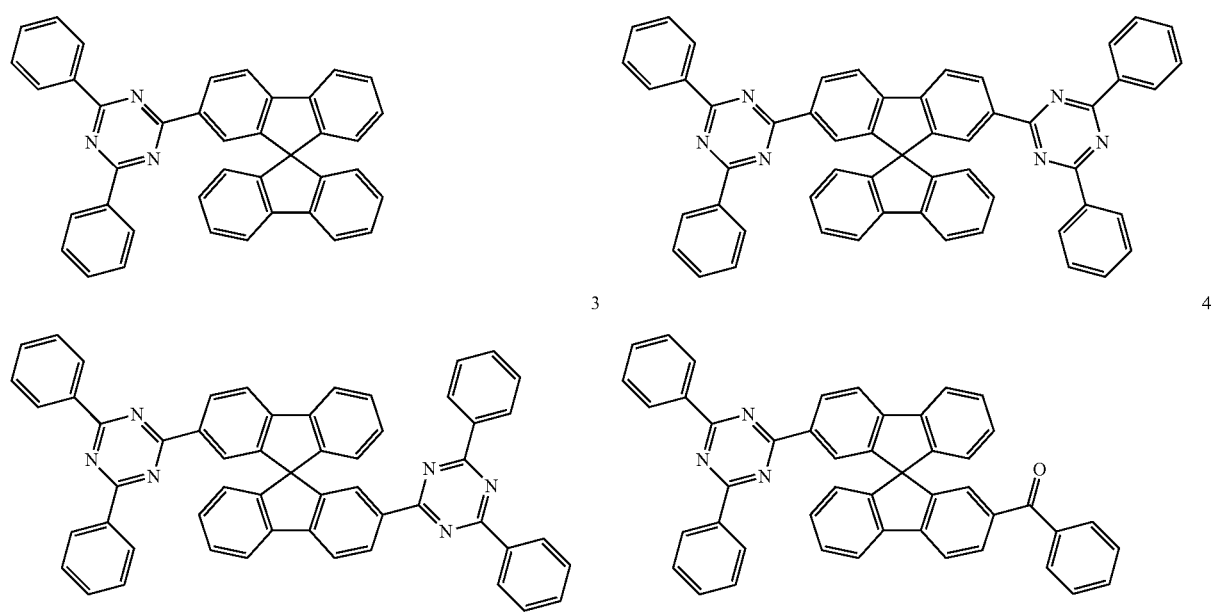

-continued
5
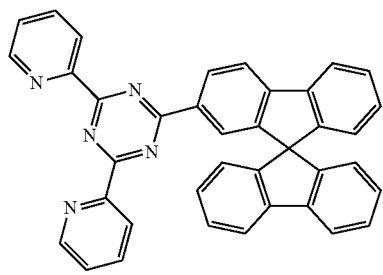
6
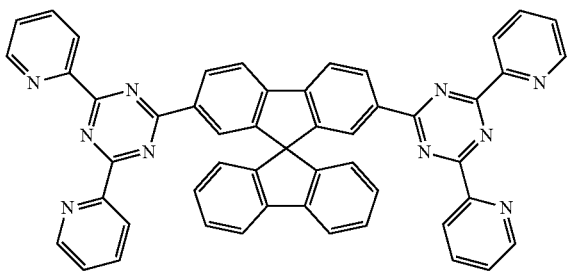
7
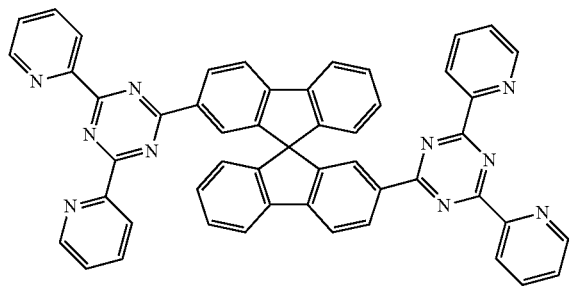
8
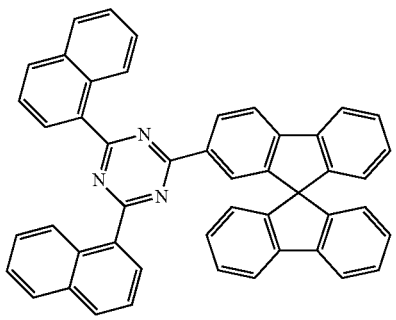
9
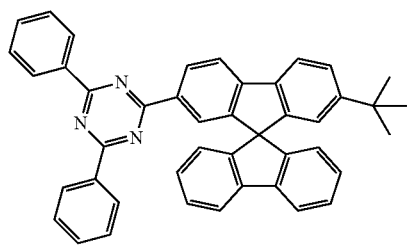
10
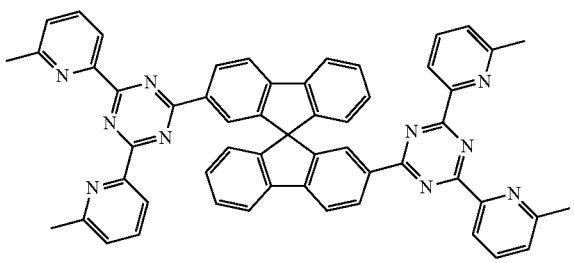
11
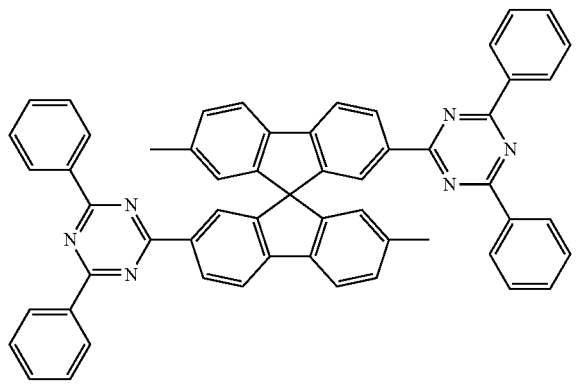
12
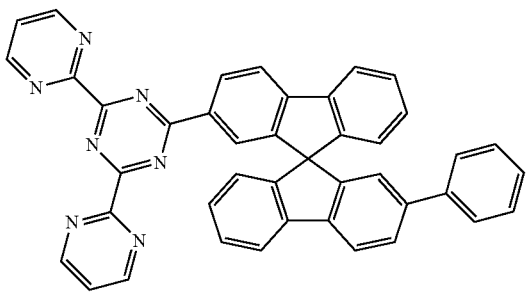

13
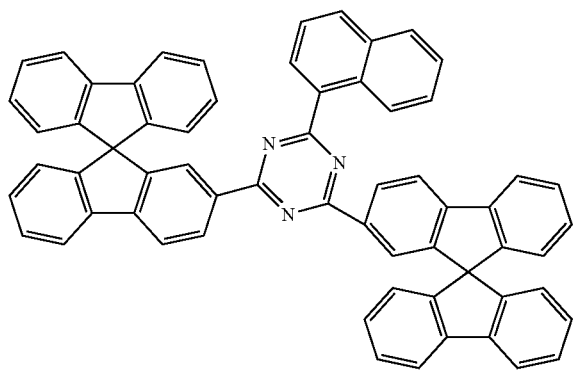
14
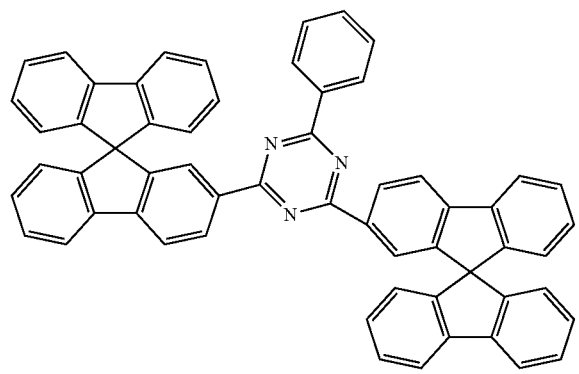
15
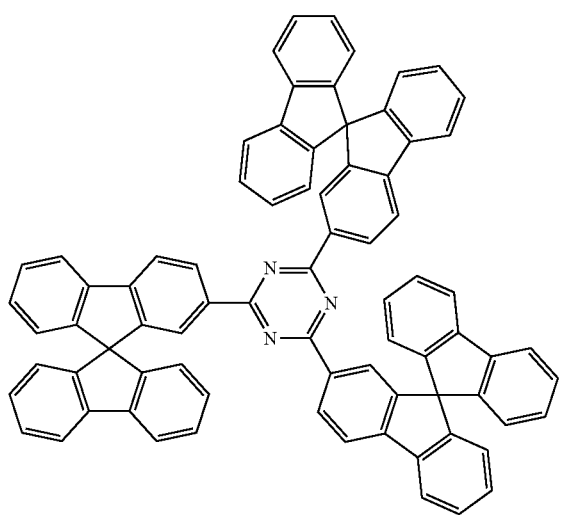
16
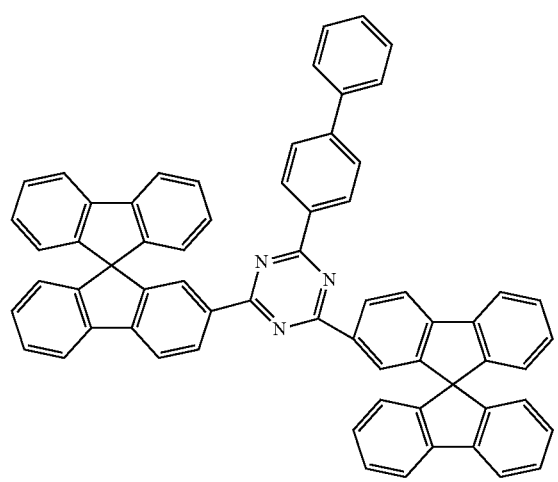
17
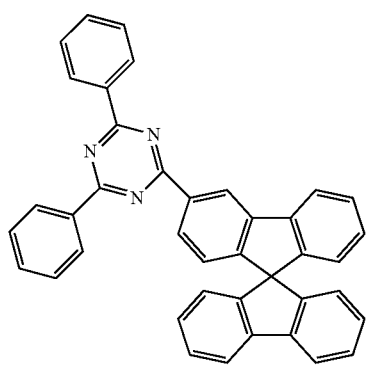
18
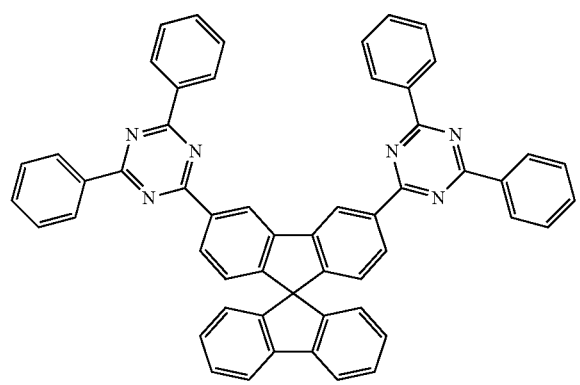

-continued
19
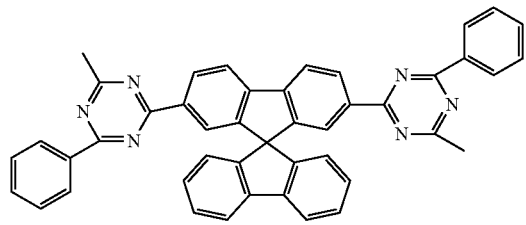
20
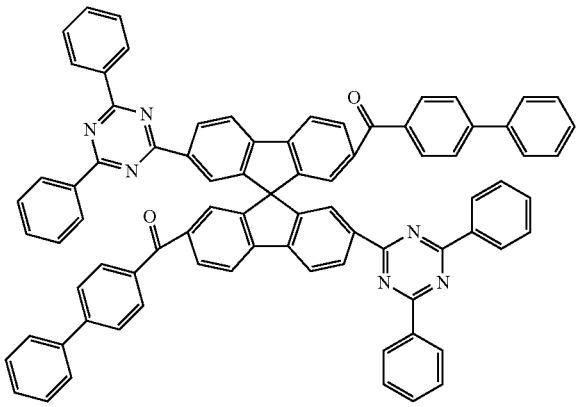
21
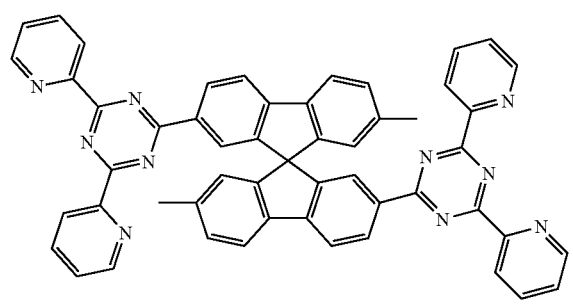
22
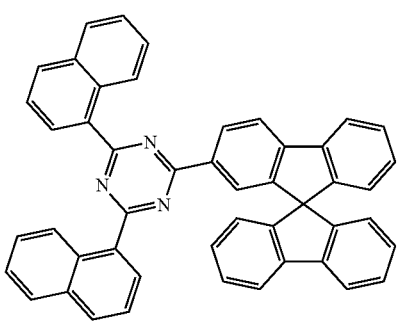
23
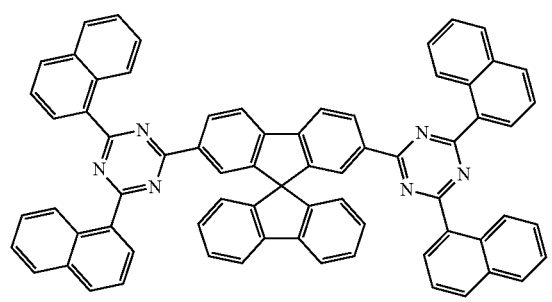
24
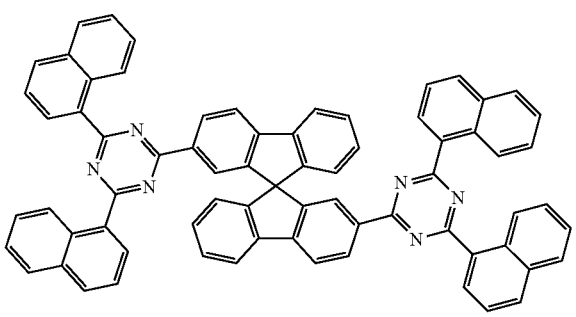
25
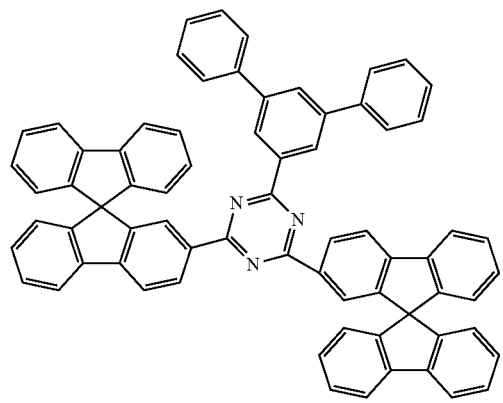
26
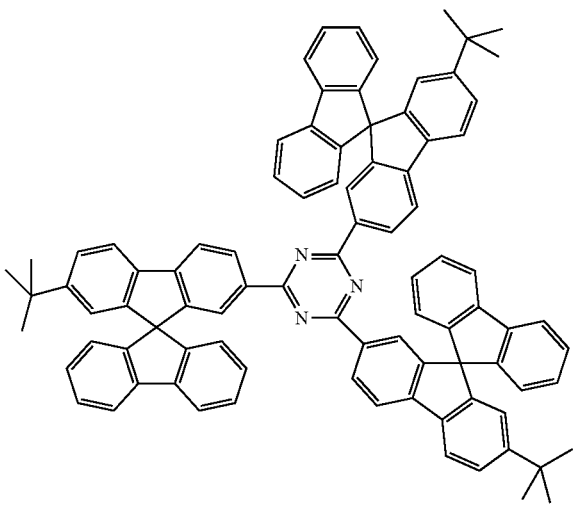

-continued
27
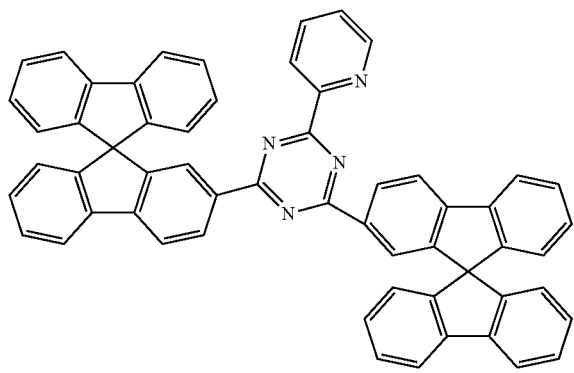
28
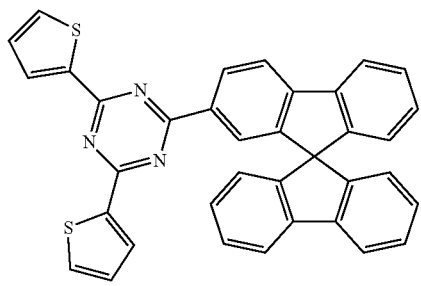
29
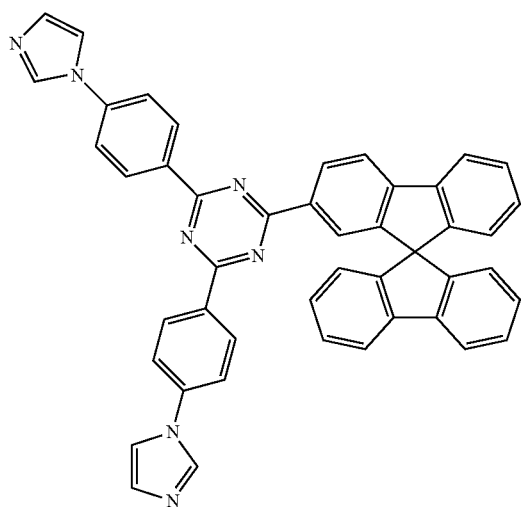
30
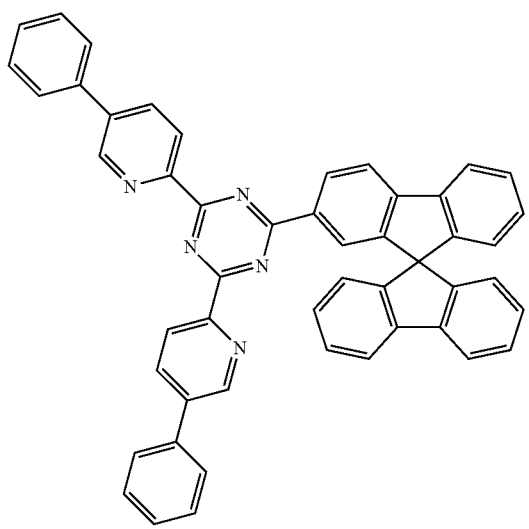
31
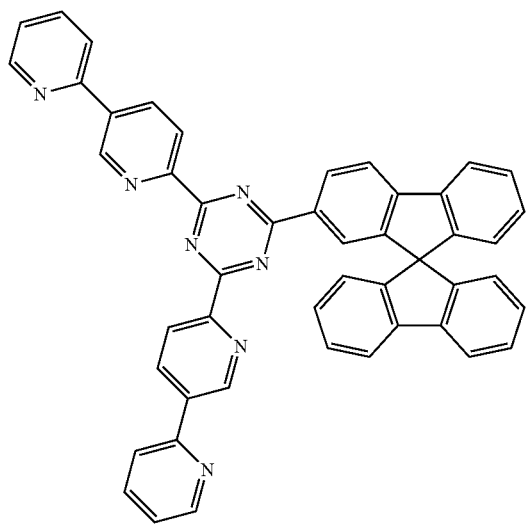
32
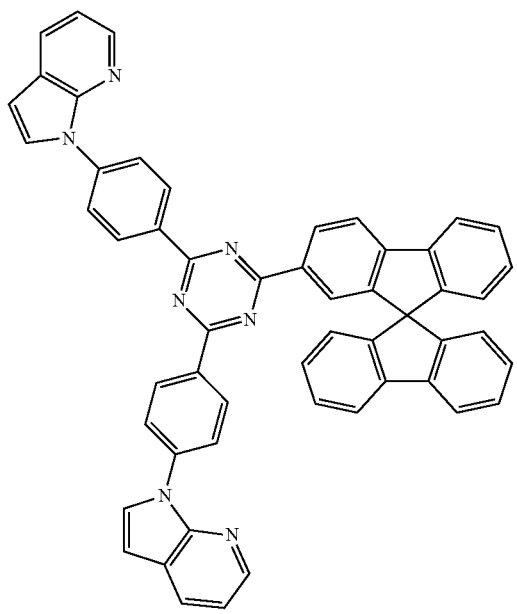

-continued
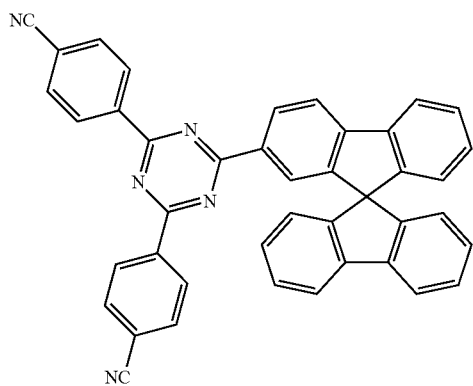
33
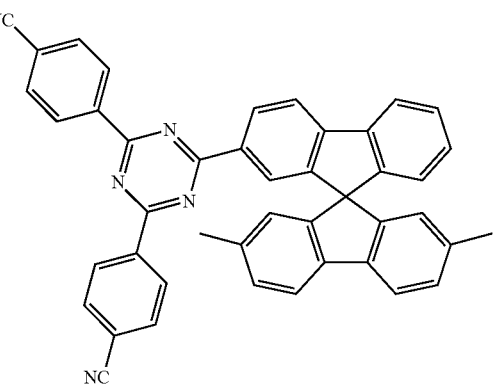
34
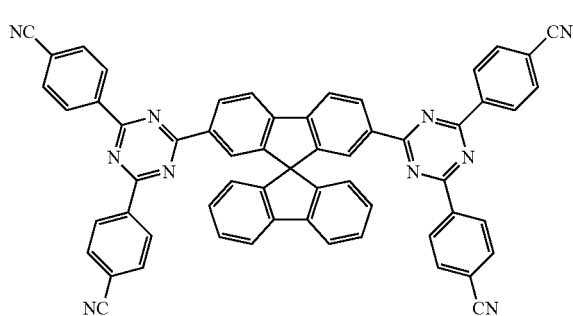
35
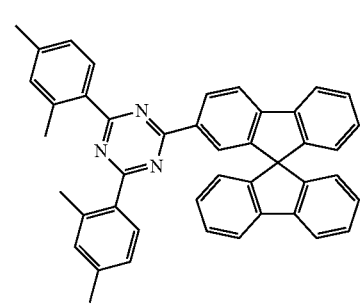
36
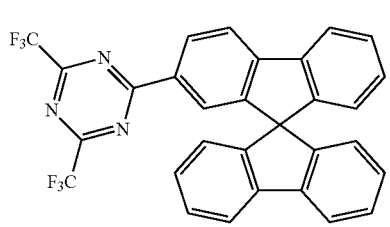
37
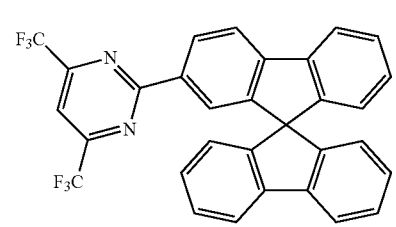
38
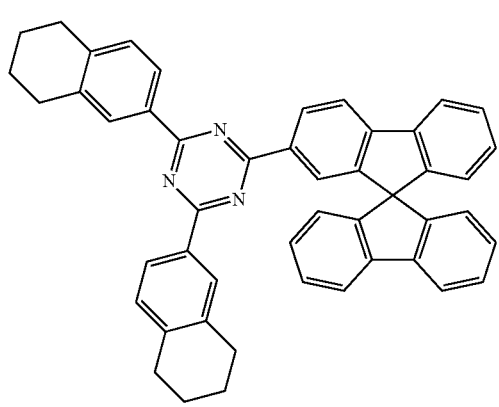
39
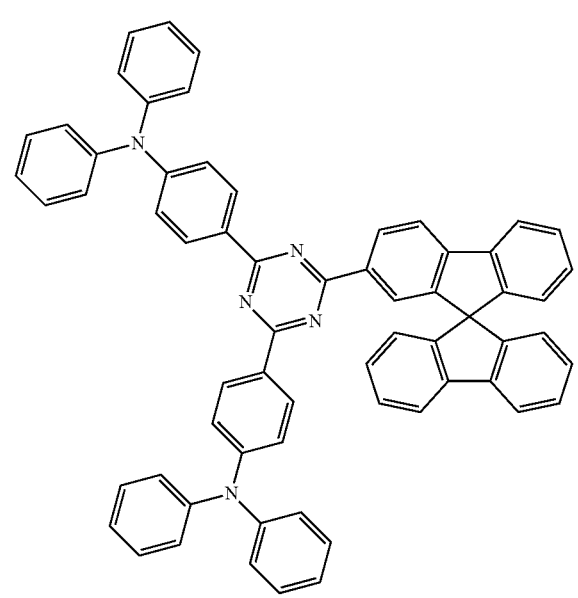
40

-continued
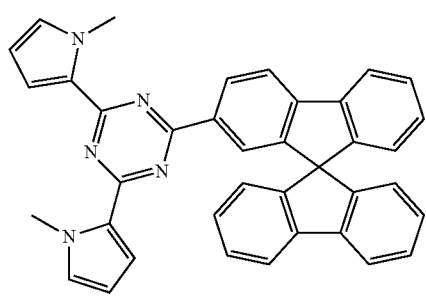
41
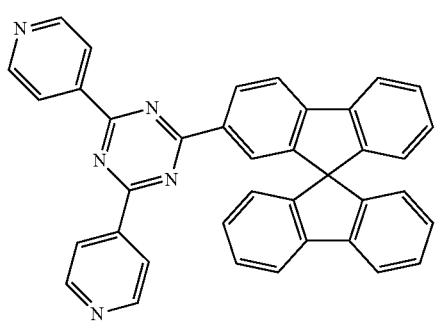
42
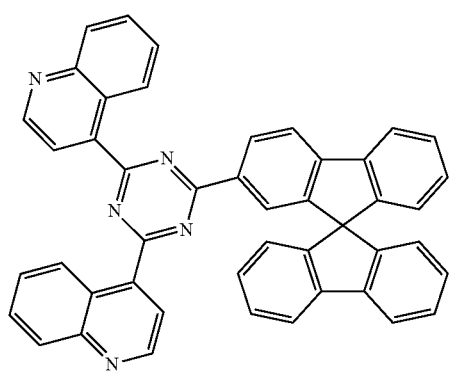
43
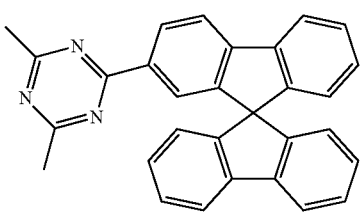
44
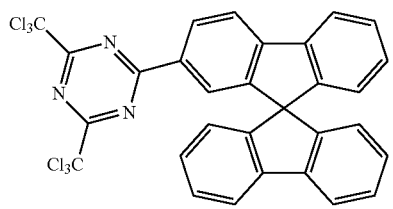
45
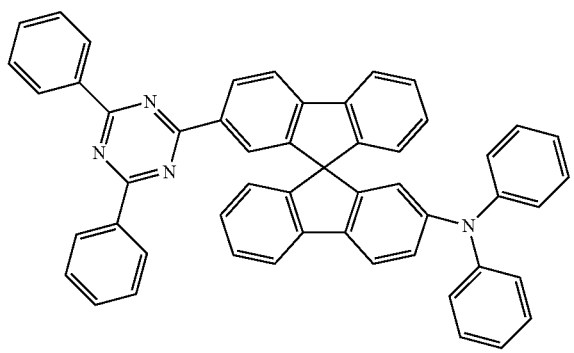
46
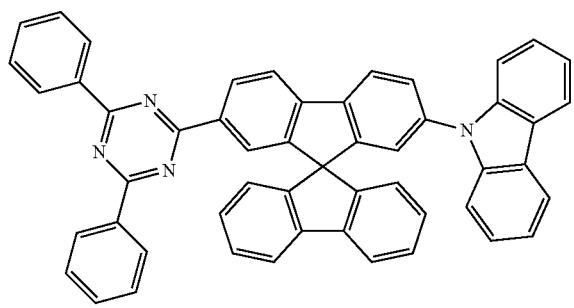
47
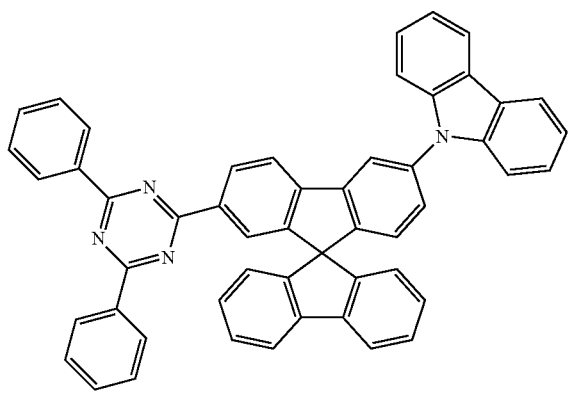
48

-continued
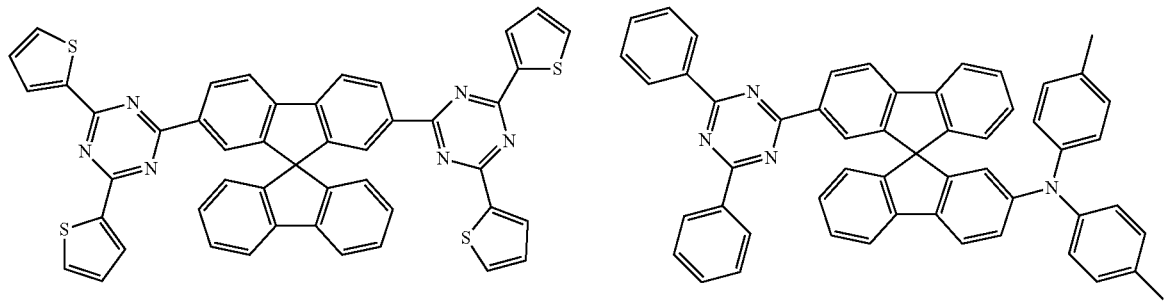
49
50
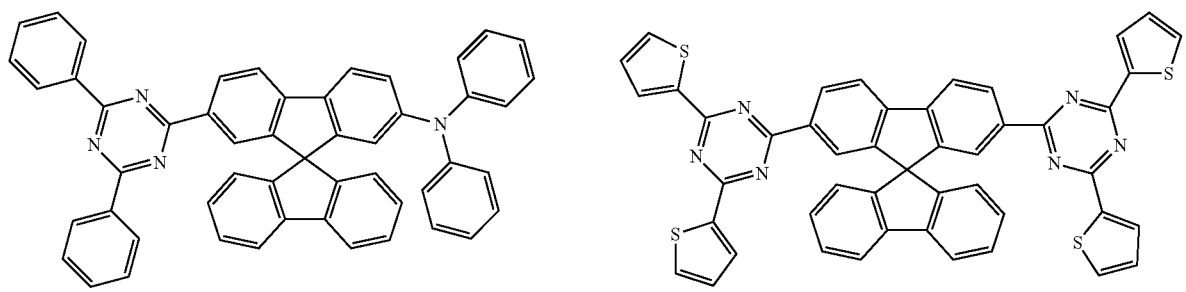
51
52
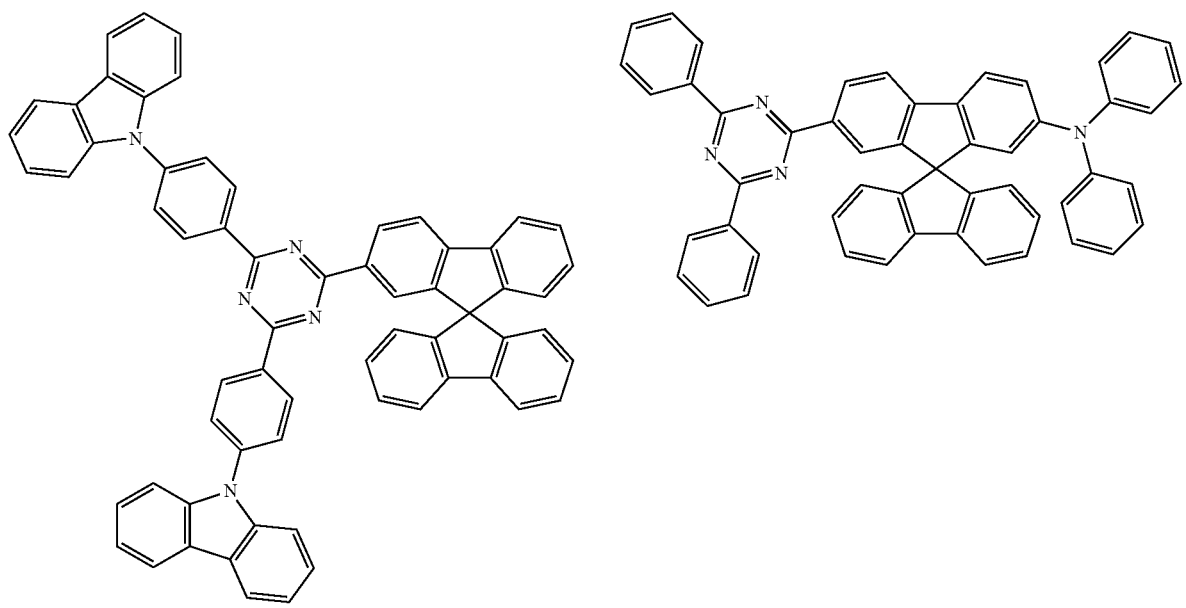
53
54

55
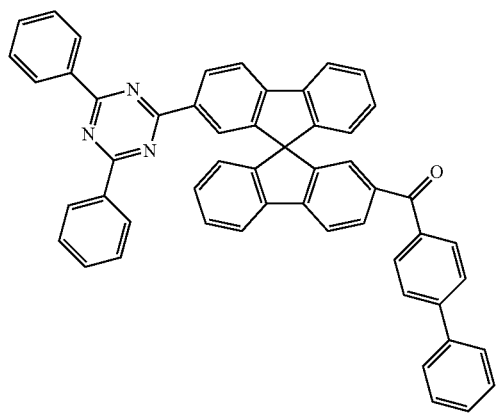
56
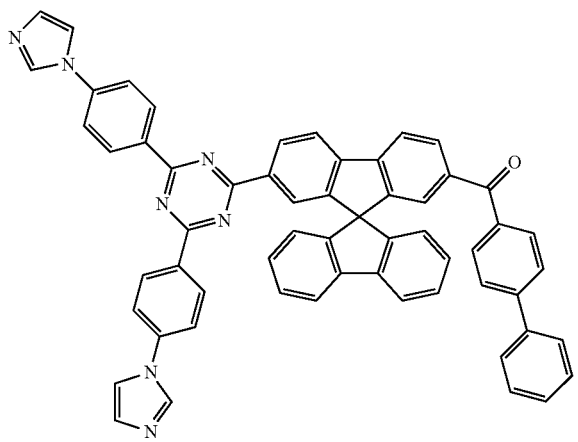
57
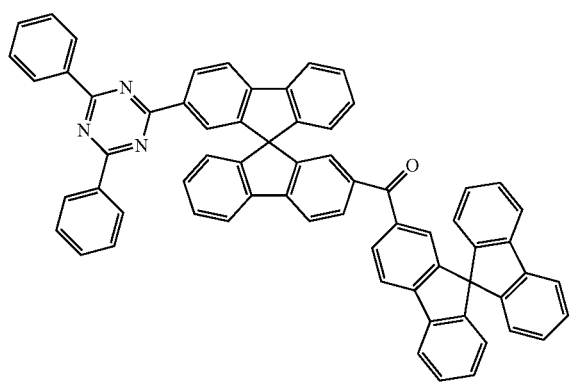
58
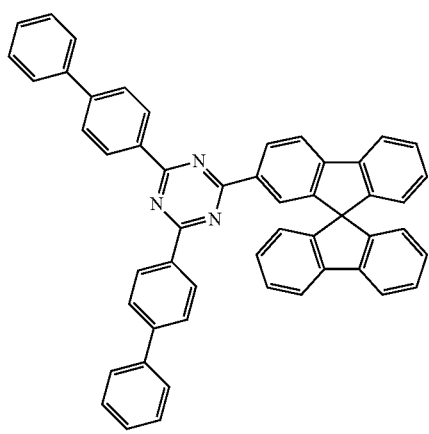
59
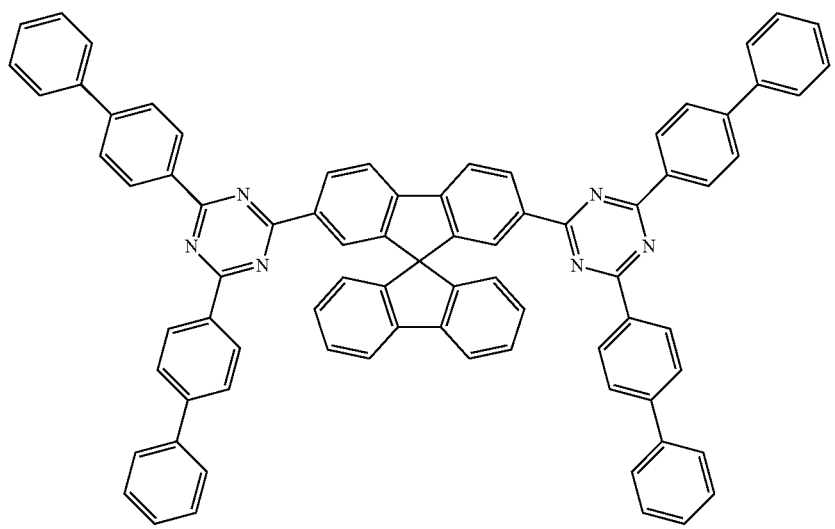

-continued
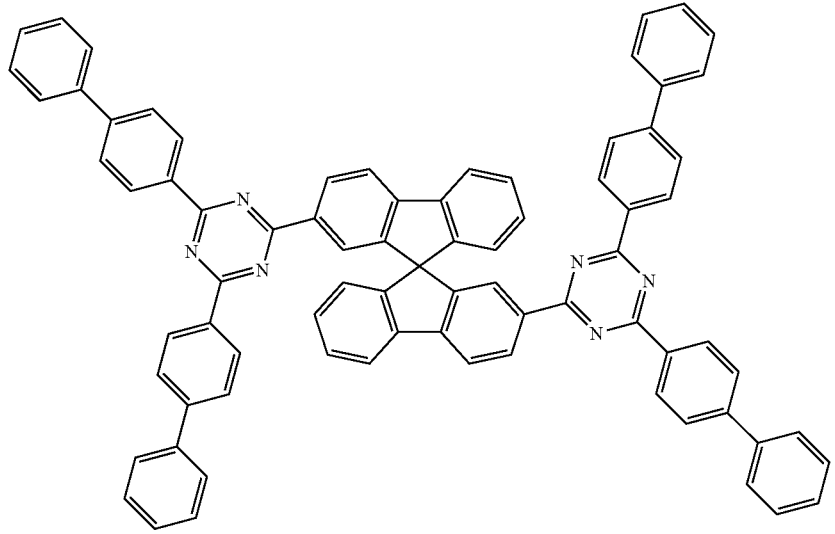
60
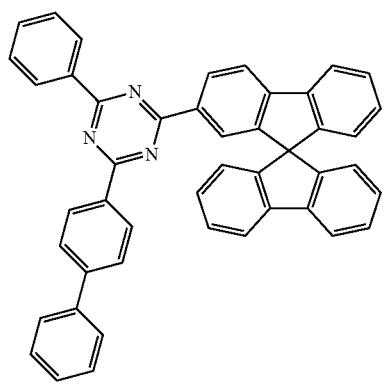
61
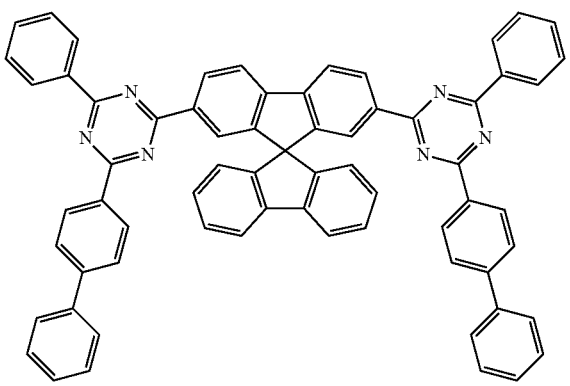
62
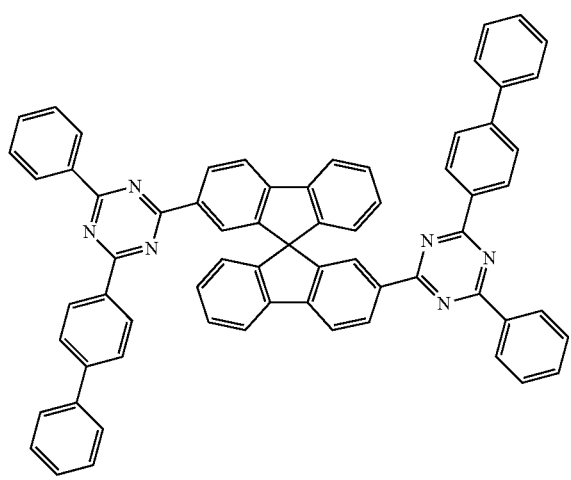
63
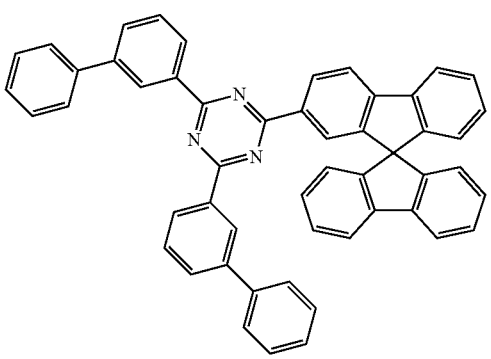
64

65
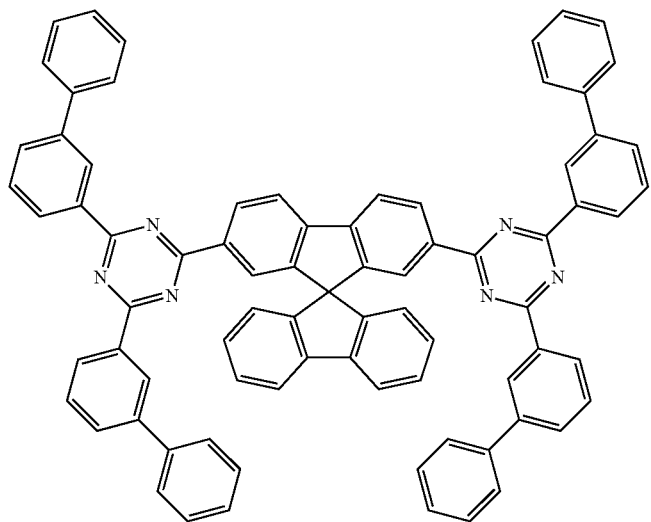
66
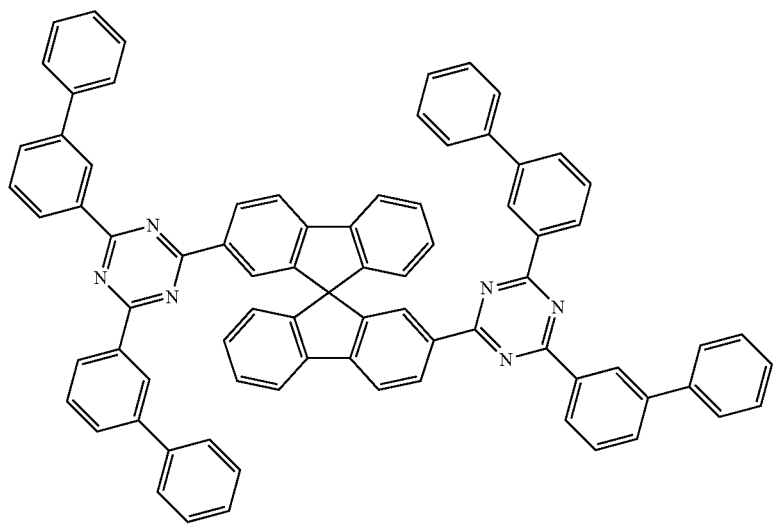
67
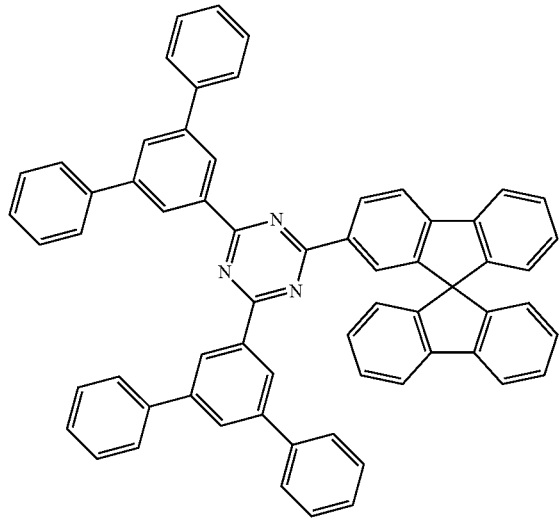

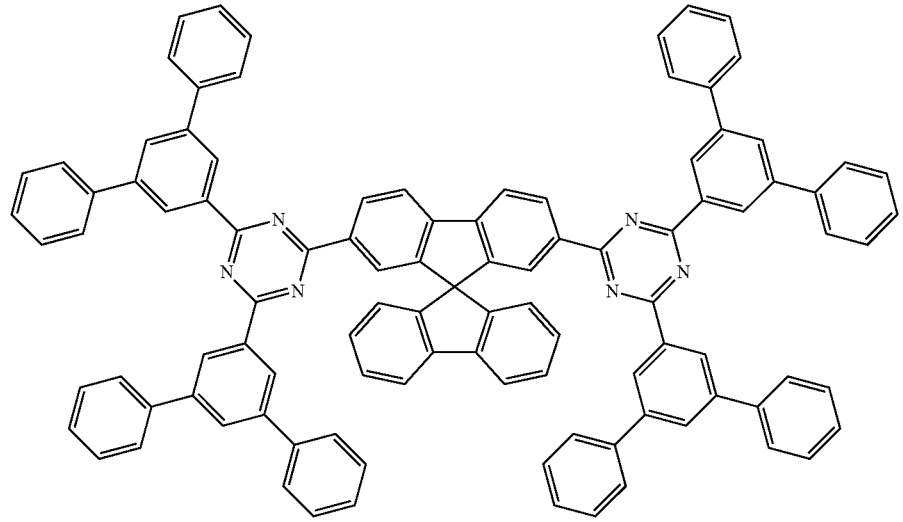
68
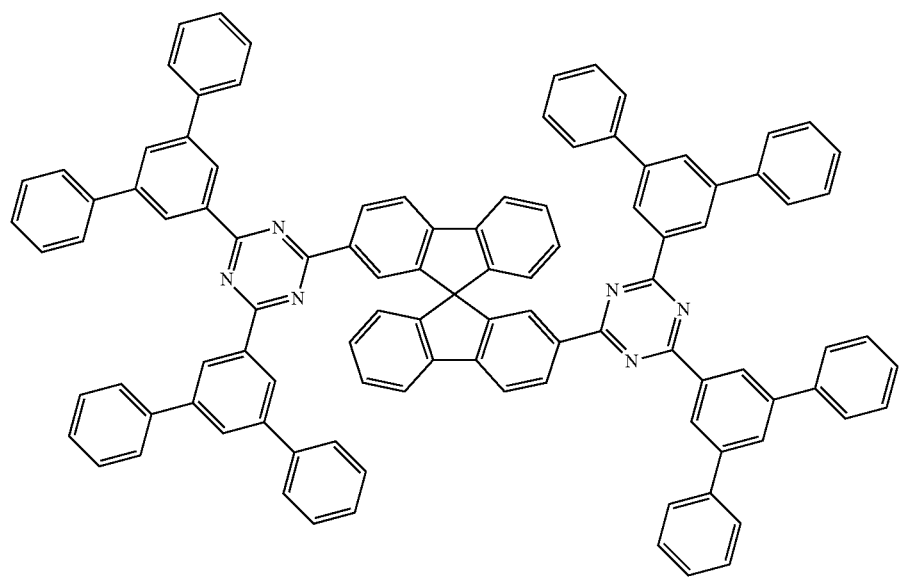
69
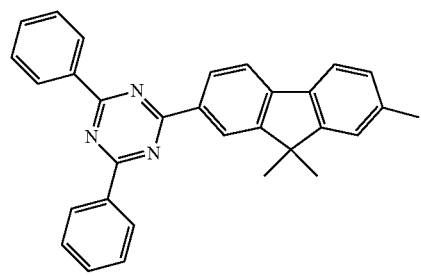
70
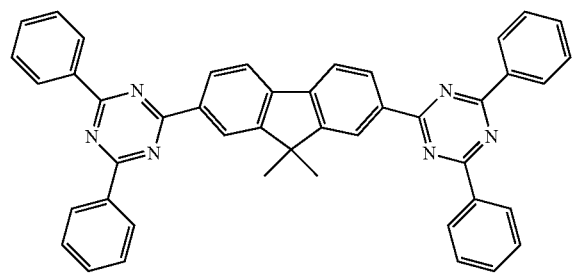
71

-continued
72
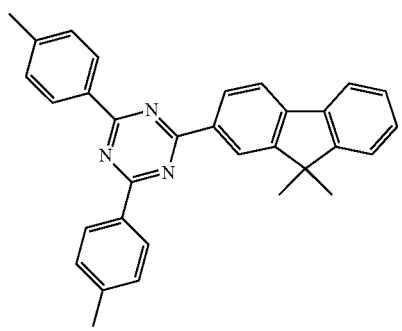
73
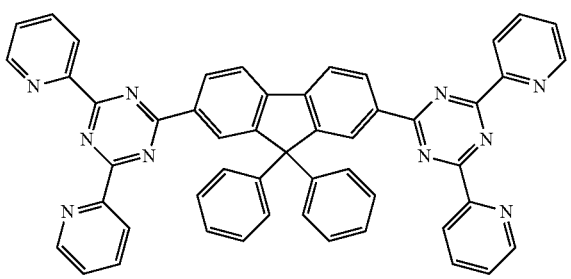
74
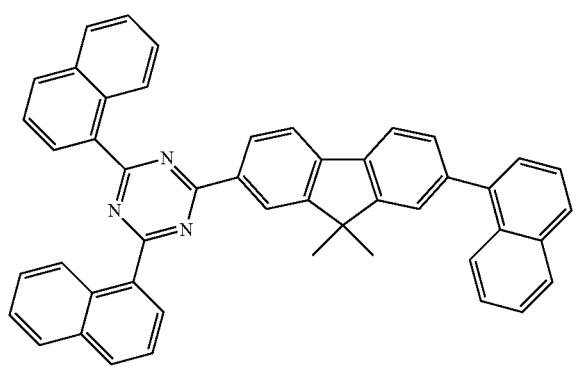
75
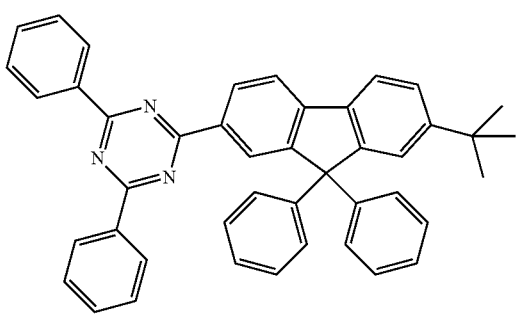
76
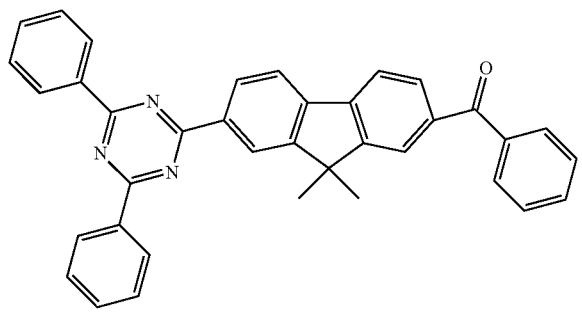
77
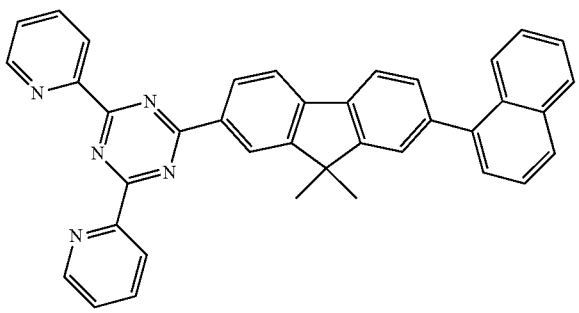
78
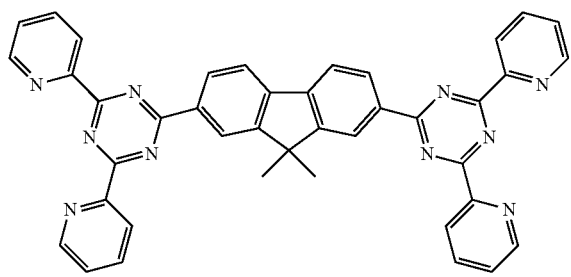
79
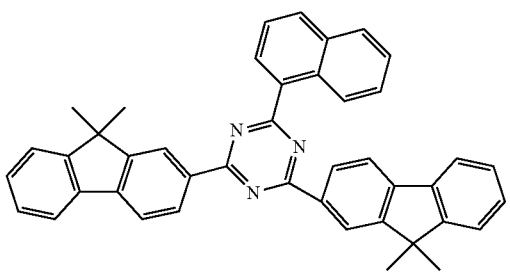

-continued
80
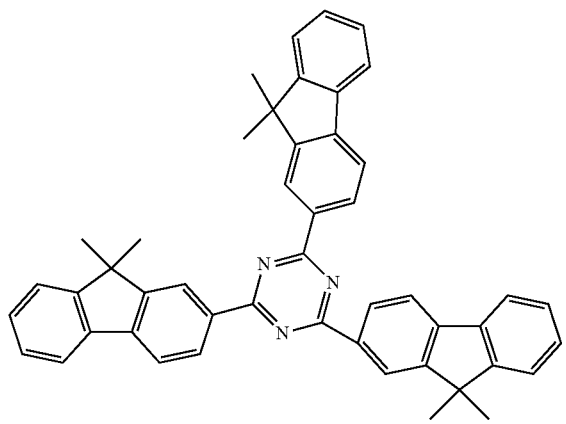
81
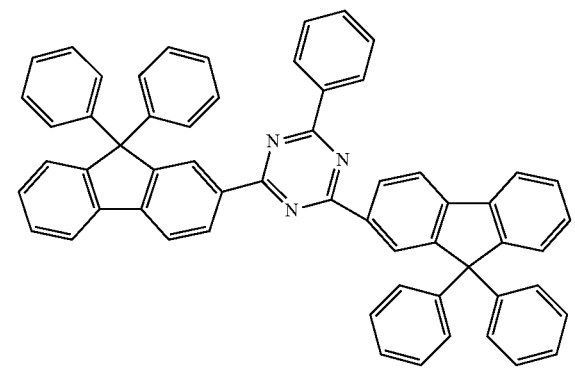
82
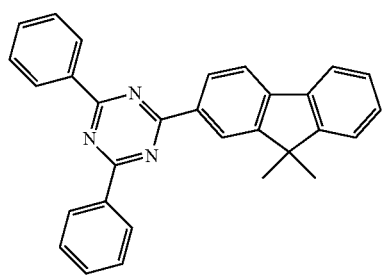
83
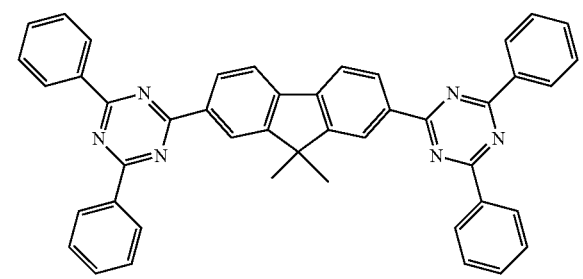
84
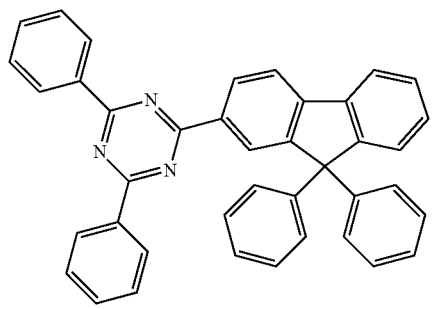
85
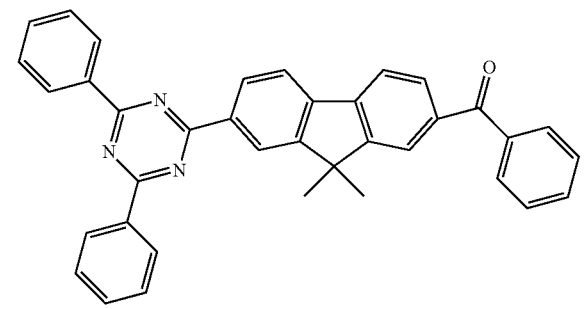
86
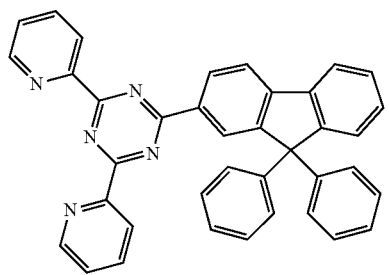
87
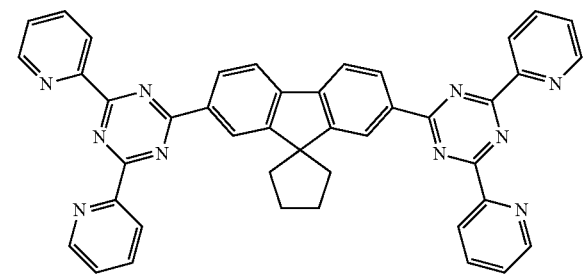

-continued
88
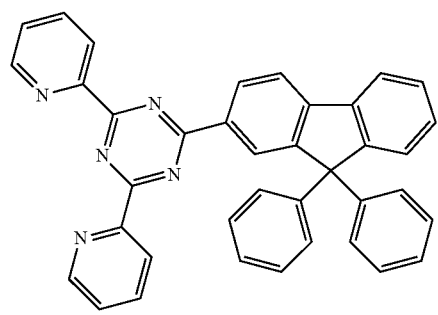
89
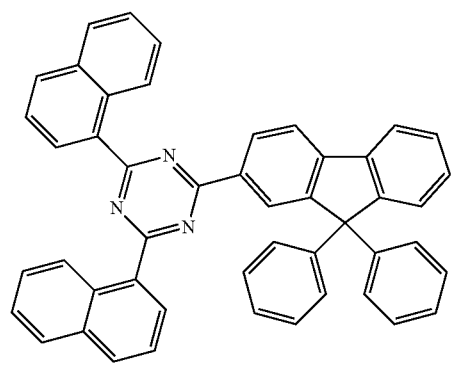
90
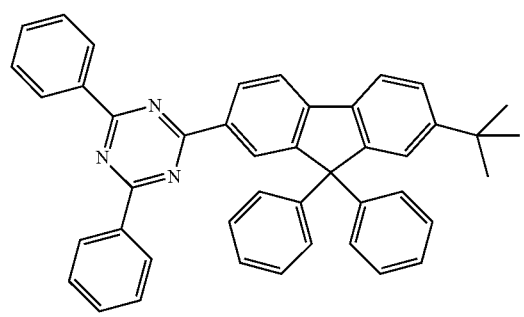
91
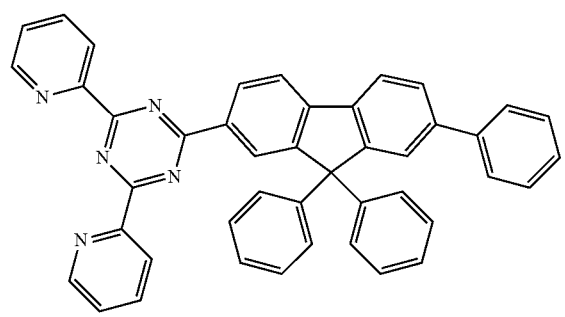
92
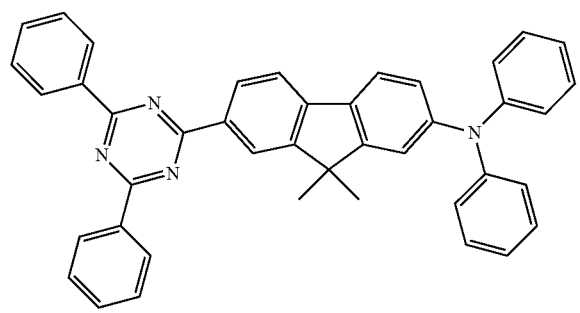
93
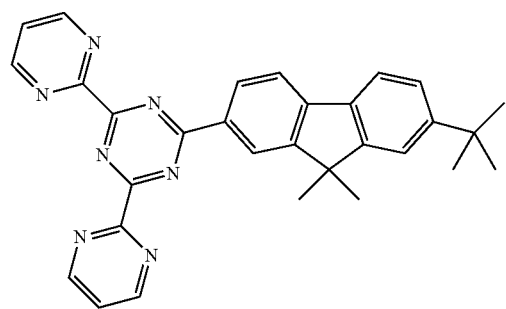
94
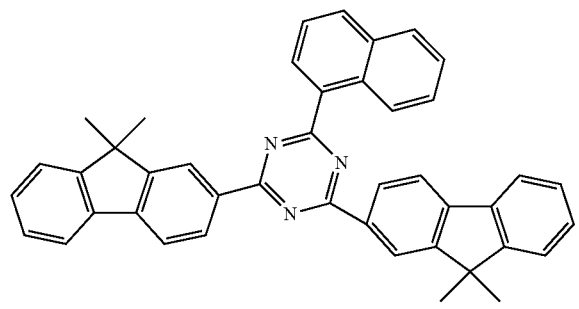
95
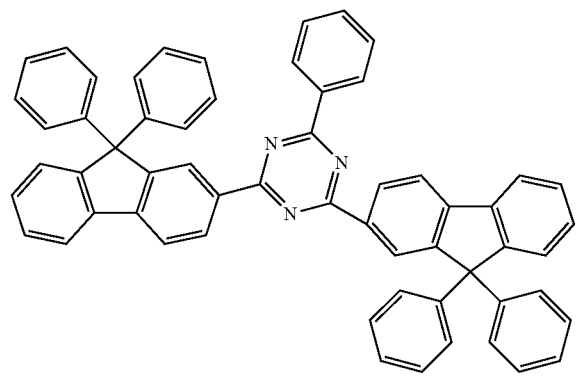

-continued
96
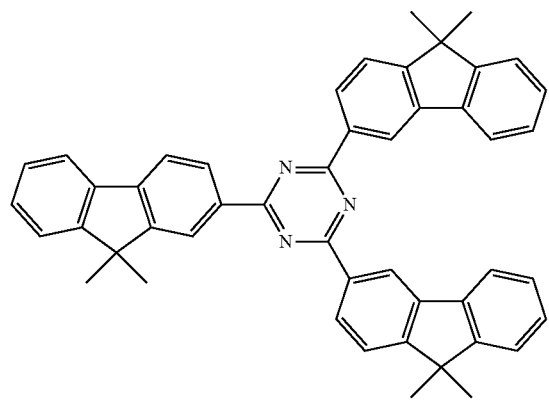
97
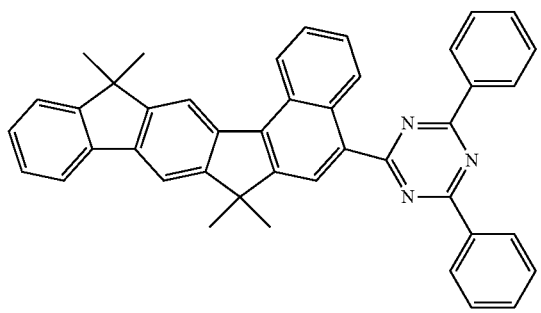
98
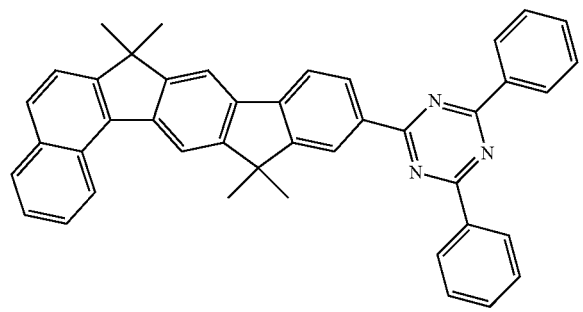
99
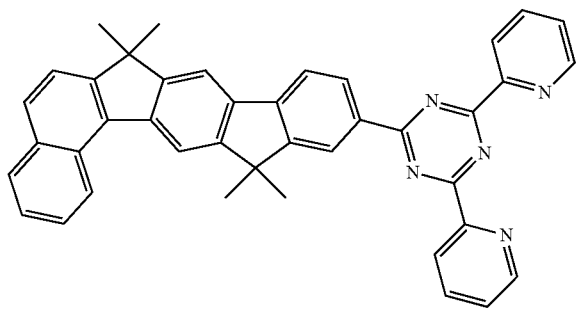
100
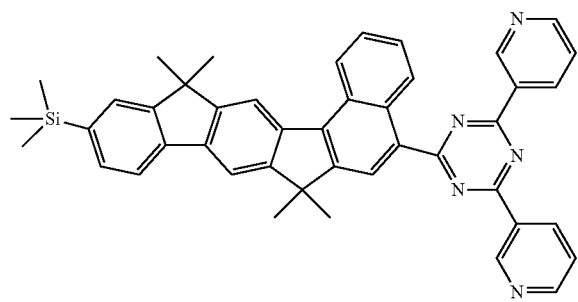
101
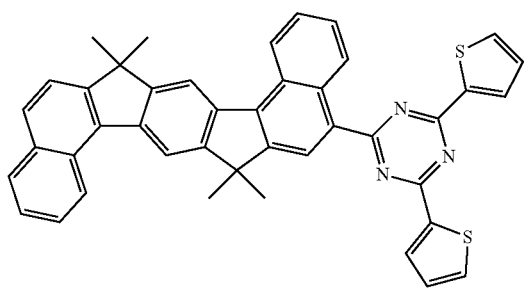
102
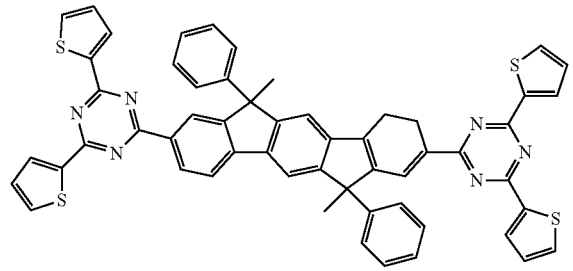
103
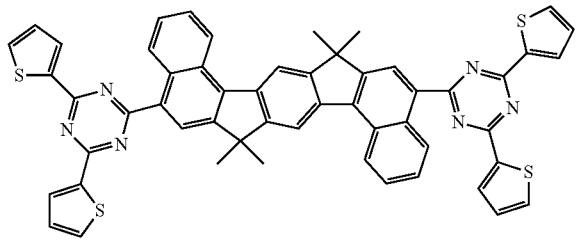

-continued
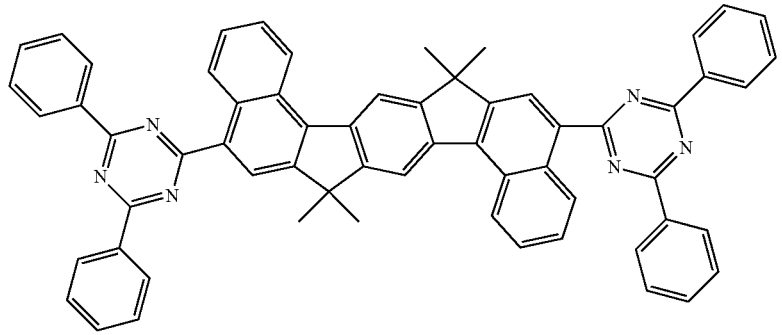
104
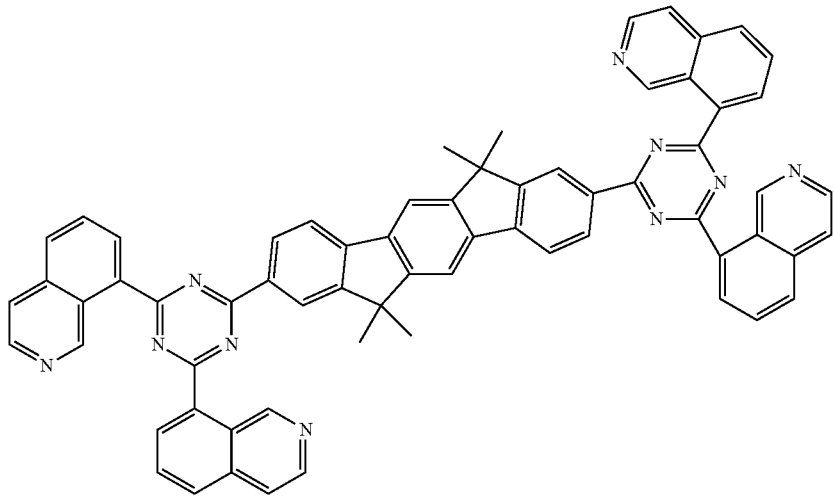
105
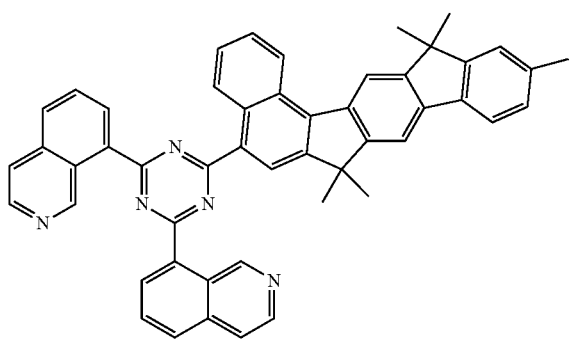
106
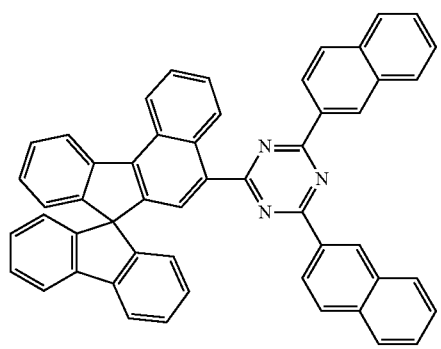
107
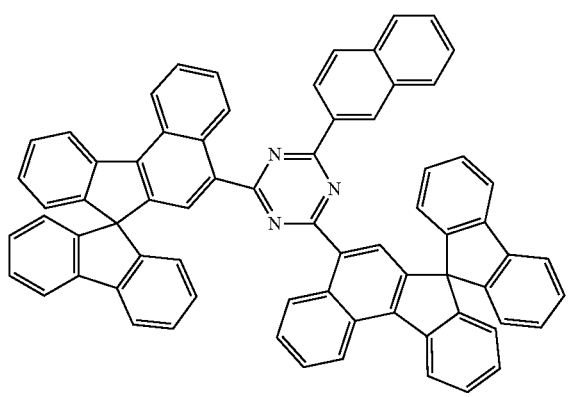
108
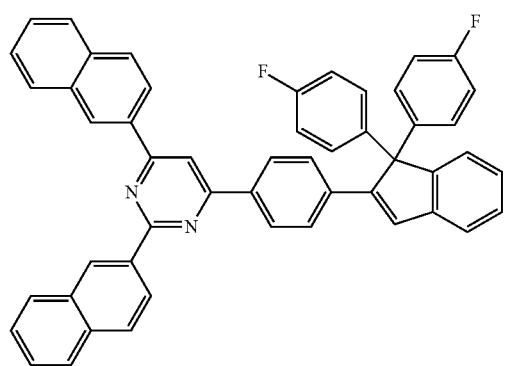
109

-continued
110
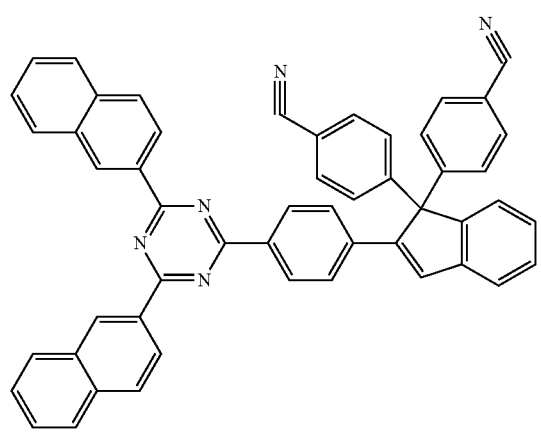
111
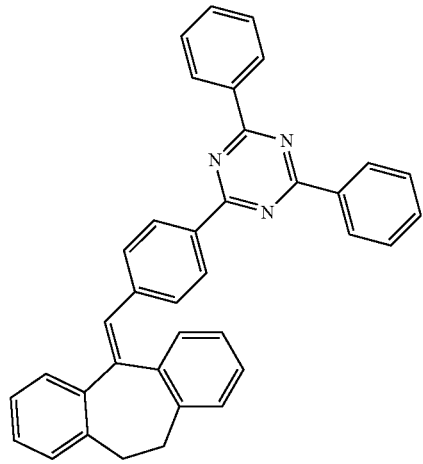
112
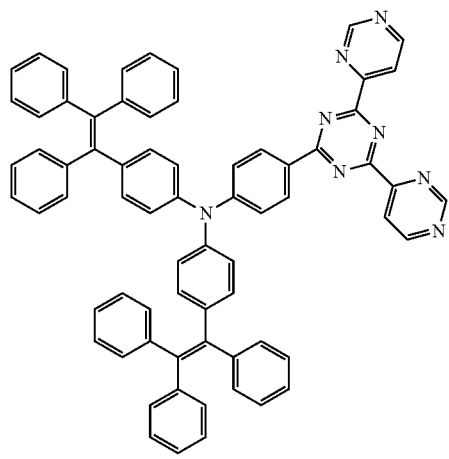
113
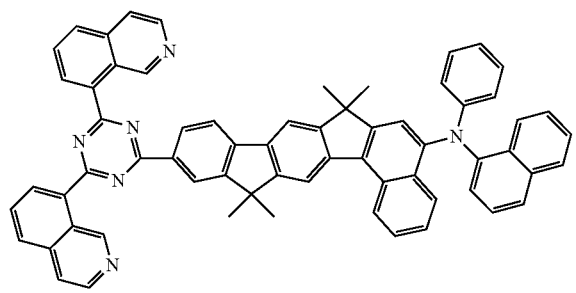
114
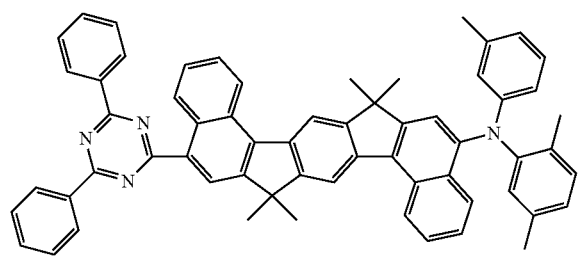
115
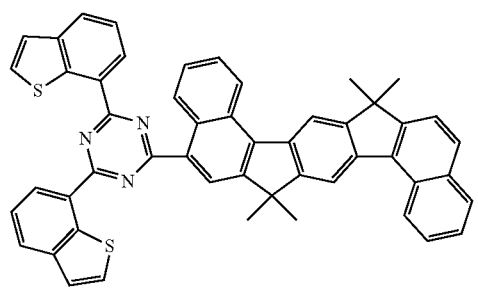

-continued
116
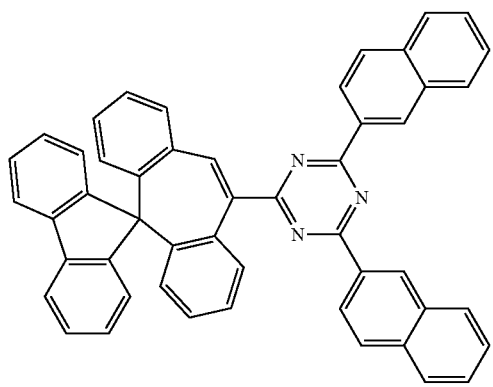
117
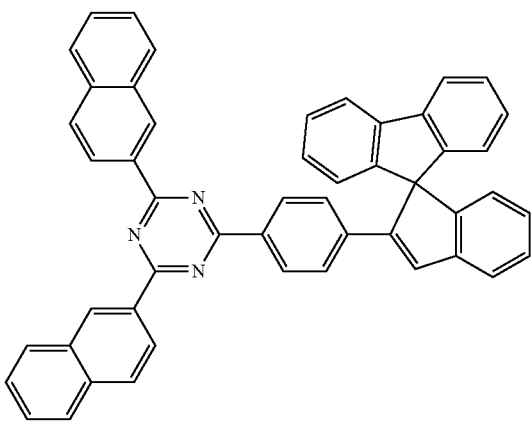
118
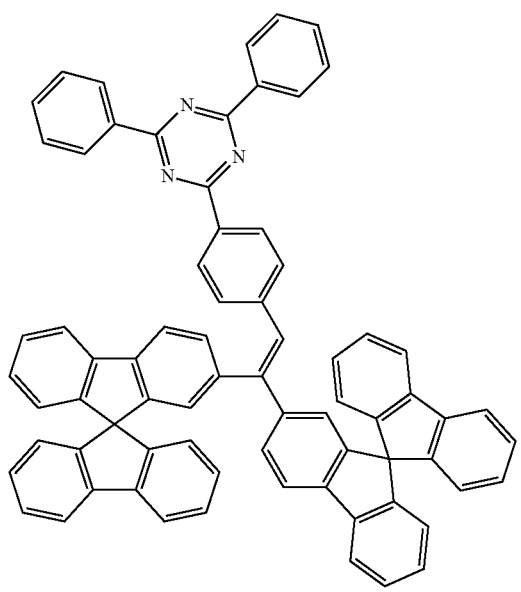
119
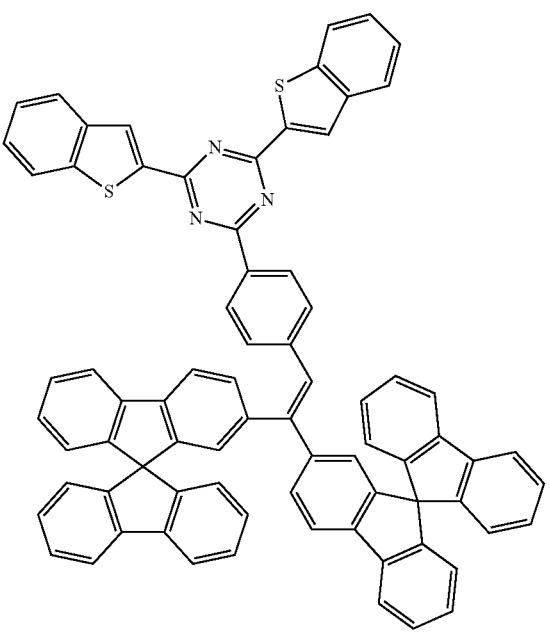
120
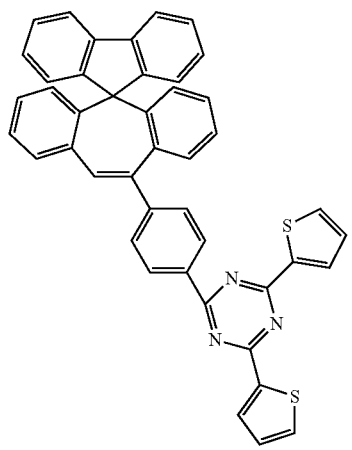
121
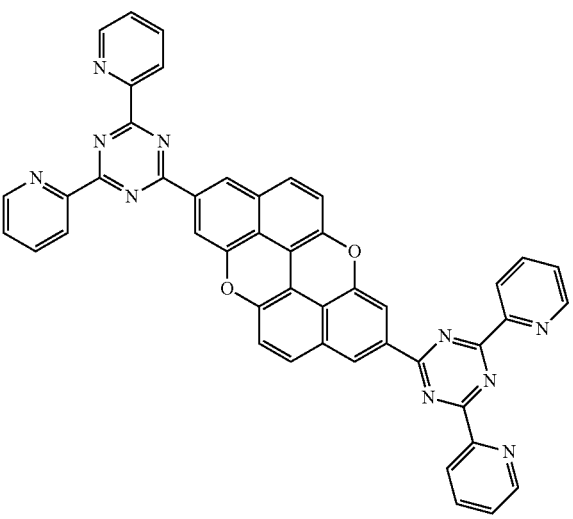

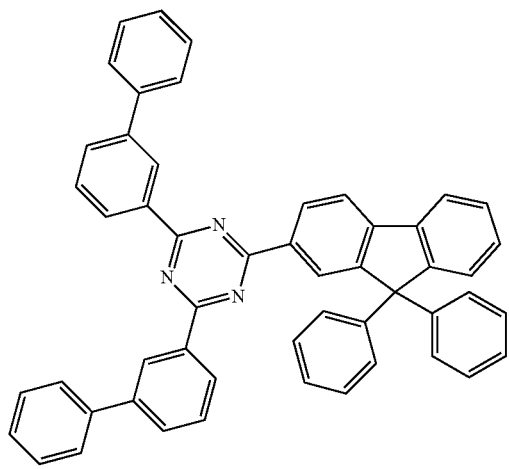
122
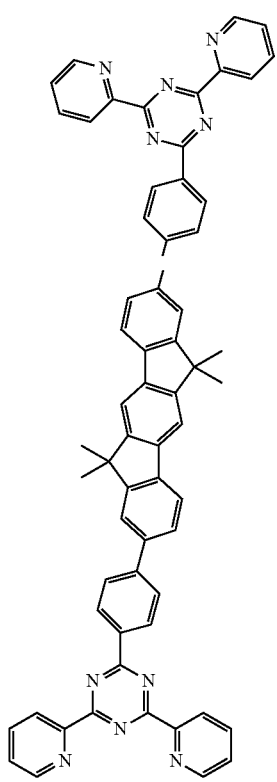
123

-continued
124
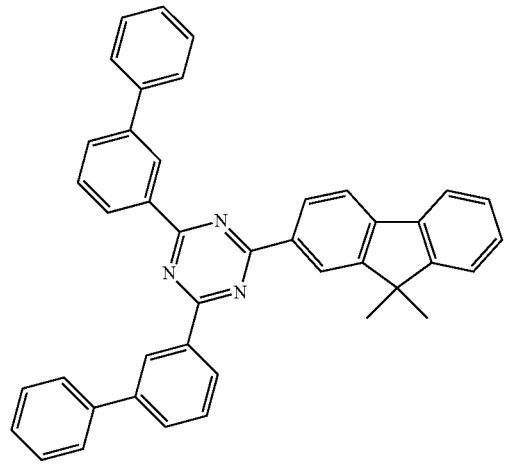
125
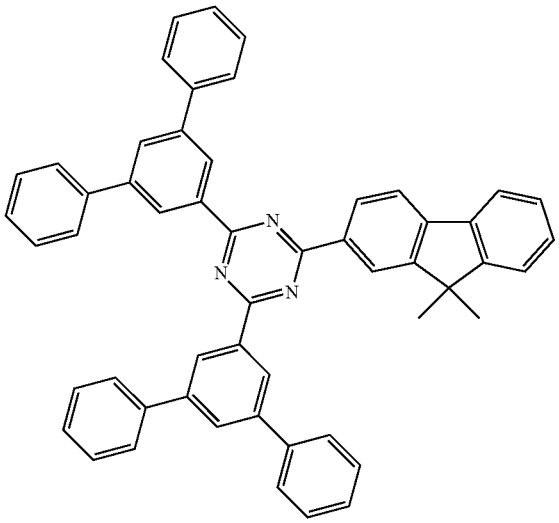
126
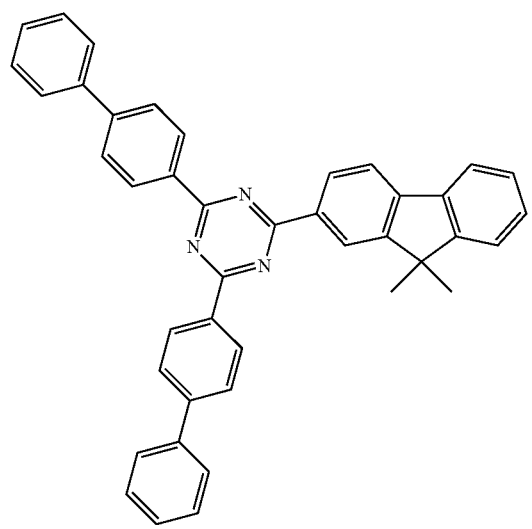
127
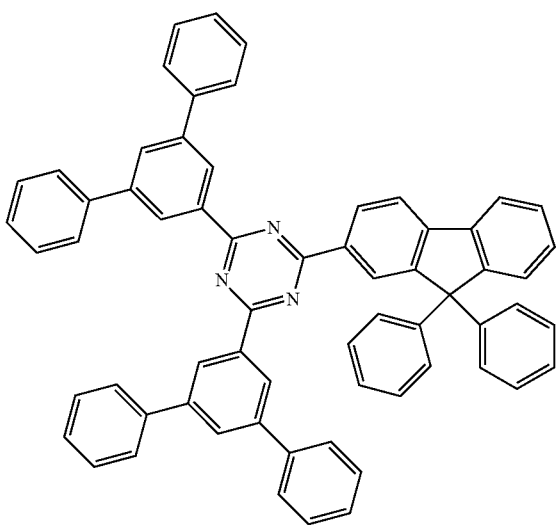
128
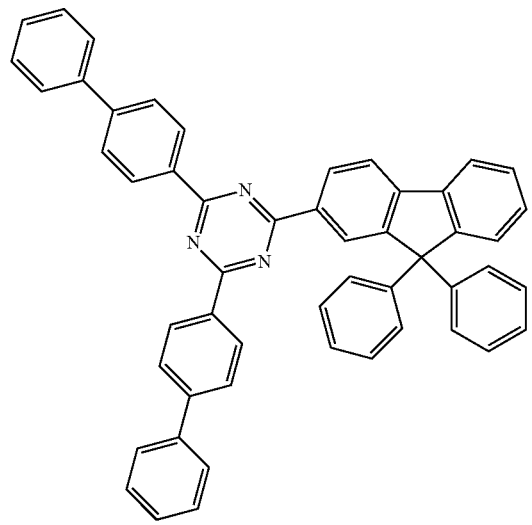
129
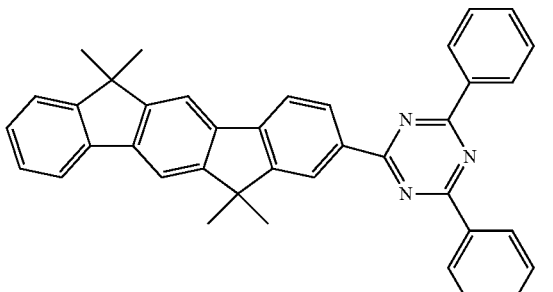

-continued
130
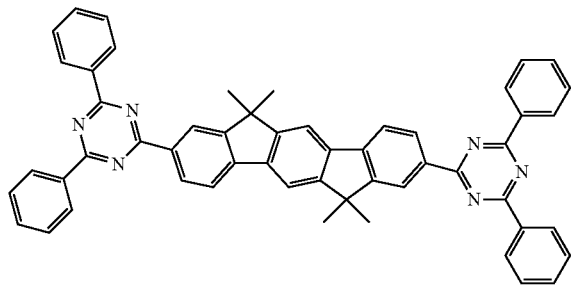
131
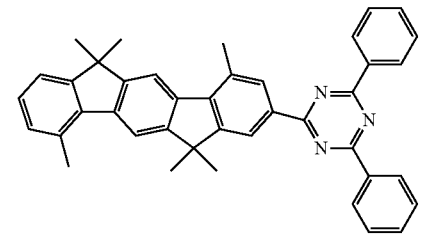
132
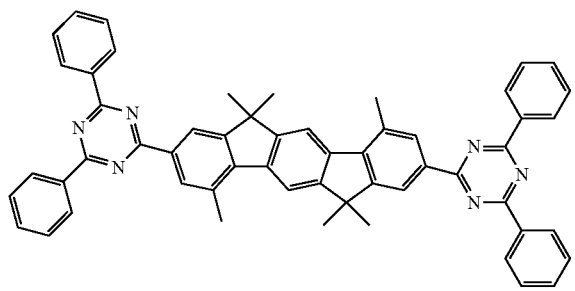
133
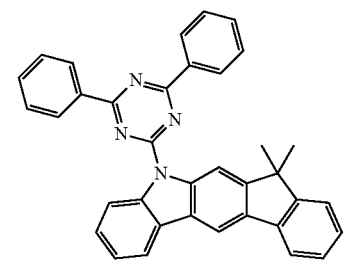
134
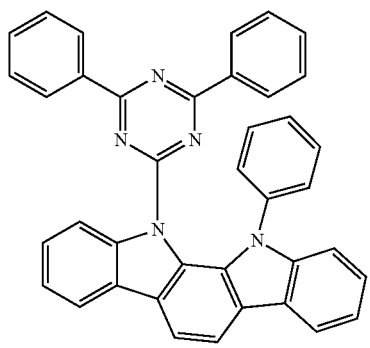
135
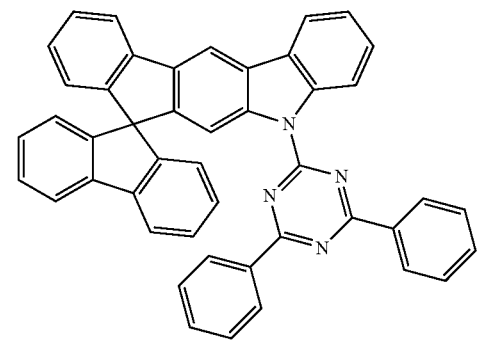
136
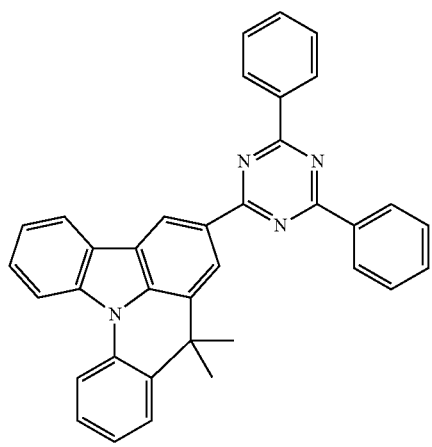
137
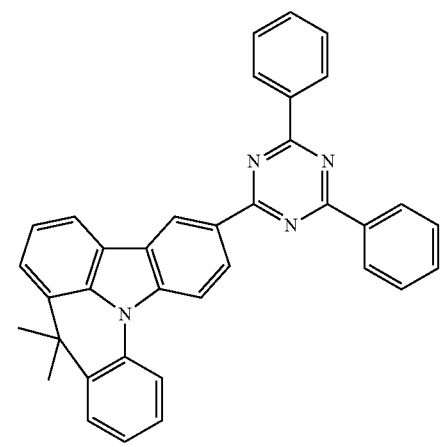

-continued
138
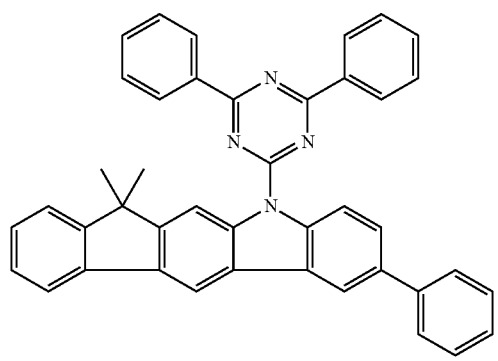
139
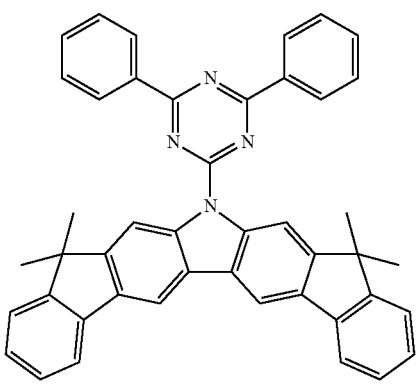
140
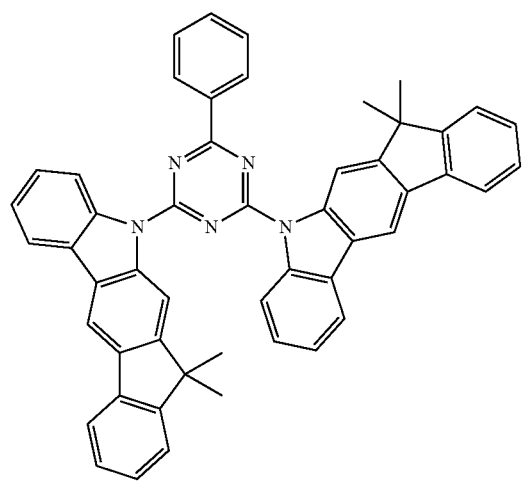
141
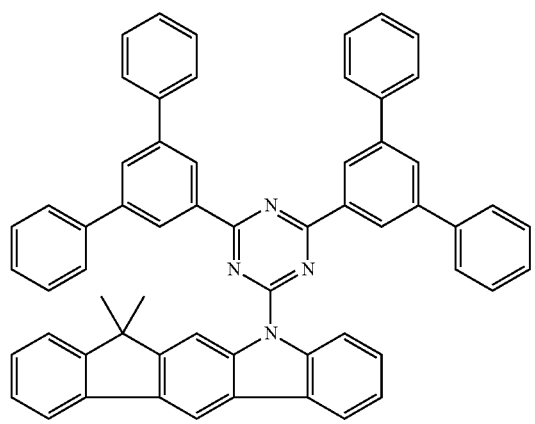
142
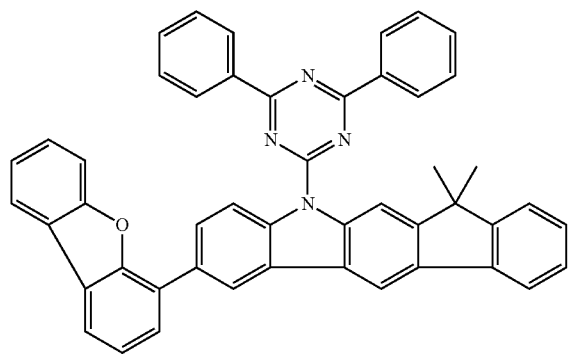
143
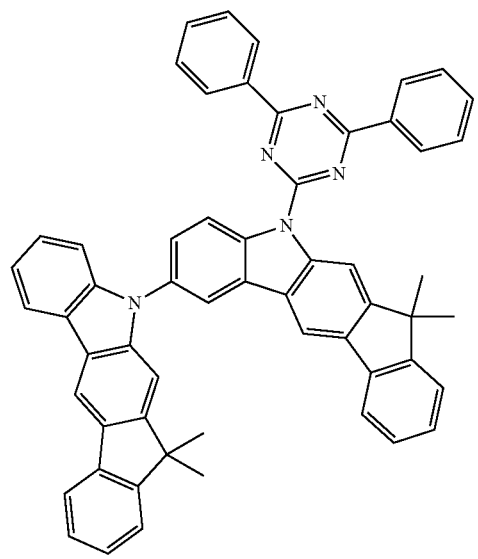

-continued
144
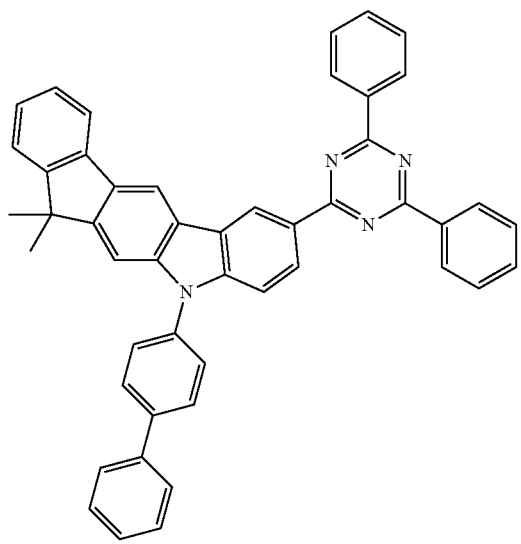
145
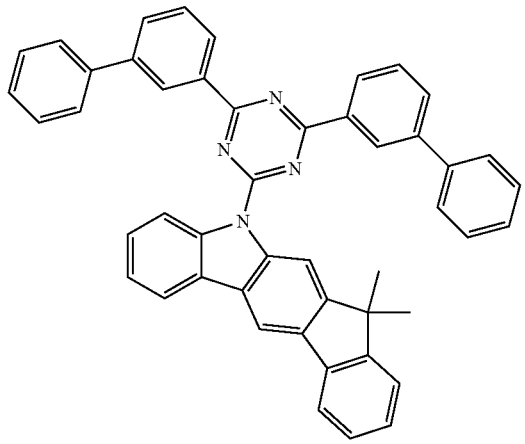
146
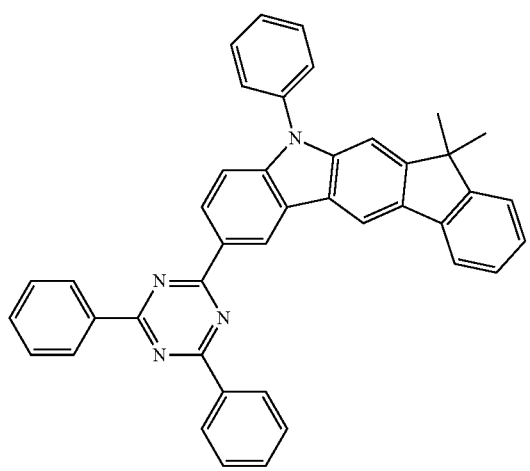
147
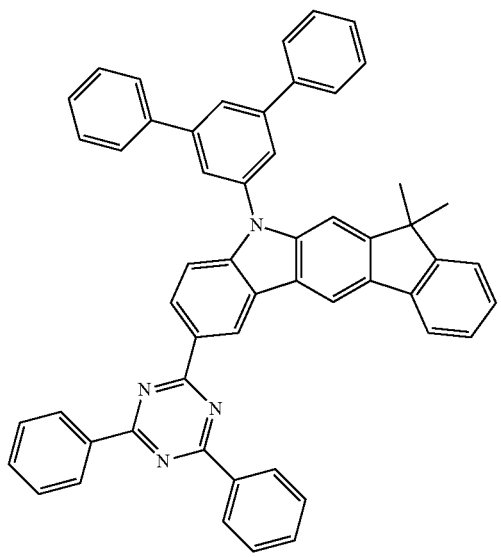
148
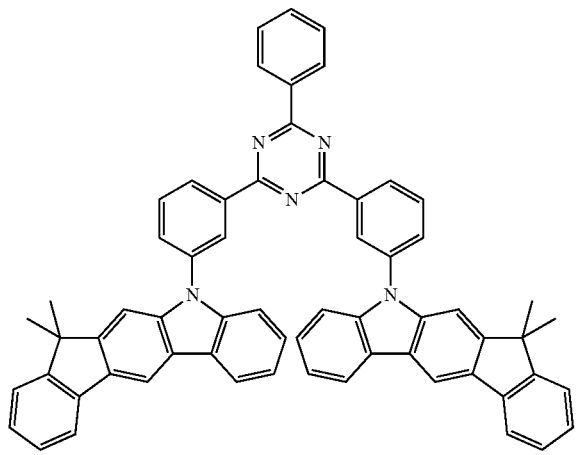
149
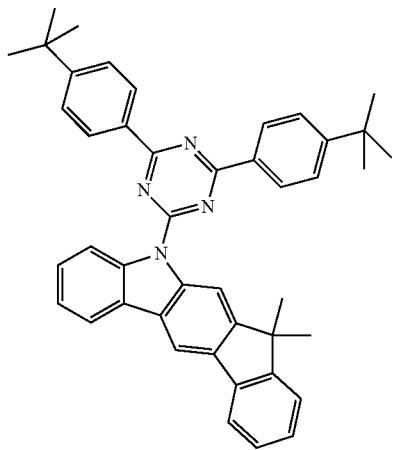

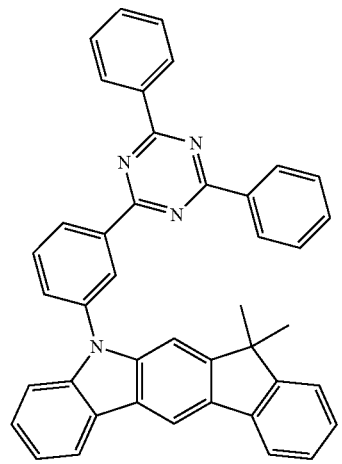

150

Likewise suitable are derivatives of the above-mentioned compounds which contain a pyrimidine group or a pyrazine group instead of the triazine group, where these groups may likewise be substituted.

The hole-conducting compound in the interlayer is preferably an aromatic diamine, triamine or tetramine.

Preferred aromatic amines are the compounds of the following formulae (23) to (28),

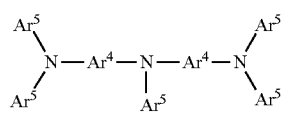
formula (23)

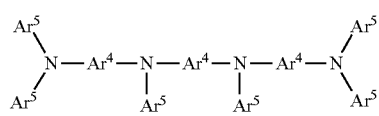
formula (24)

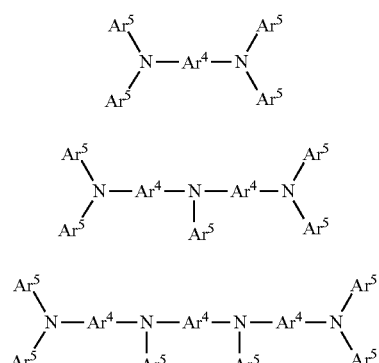
formula (25)

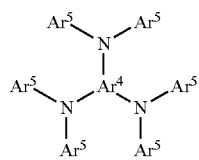
formula (26)

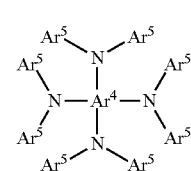
formula (27)

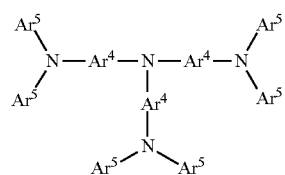
formula (28)

where $R^1$ has the meaning mentioned above, and the following applies to the other symbols used:

$Ar^4$ is on each occurrence, identically or differently, a divalent, trivalent or tetravalent aromatic or heteroaromatic ring system having 5 to 60 aromatic ring atoms, which may be substituted by one or more radicals $R^1$;

$Ar^5$ is on each occurrence, identically or differently, a monovalent aromatic or heteroaromatic ring system having 5 to 60 aromatic ring atoms, which may be substituted by one or more radicals $R^1$; two groups $Ar^5$ here which are bonded to the same nitrogen atom or one group $Ar^4$ with one group $Ar^5$ which are bonded to the same nitrogen atom may be linked to one another by a single bond or a bridge selected from the group consisting of $B(R^1)$, $C(R^1)_2$, $Si(R^1)_2$, $C=O$, $C=NR^1$, $C=C(R^1)_2$, O, S, $S=O$, $SO_2$, $N(R^1)$, $P(R^1)$ and $P(=O)R^1$.

If two groups $Ar^5$ or one group $Ar^4$ with one group $Ar^5$ which are each bonded to the same nitrogen atom are linked to one another by a single bond, a carbazole is thus formed.

$Ar^4$ in the compounds of the formulae (23), (24), (25) and (28) is a divalent group and $Ar^4$ in the compounds of the formula (26) is a trivalent group and $Ar^4$ in the compounds of the formula (27) is a tetravalent group.

It is preferred here for $Ar^4$ and $Ar^5$ to contain no condensed aryl or heteroaryl groups having more than 10 aromatic ring atoms.

Examples of suitable hole-conducting compounds in the interlayer are the aromatic amines depicted below.

81
82
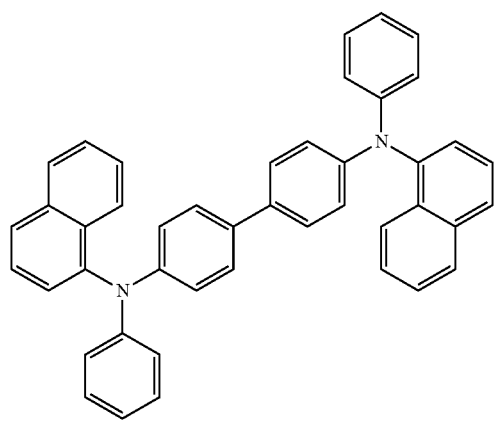
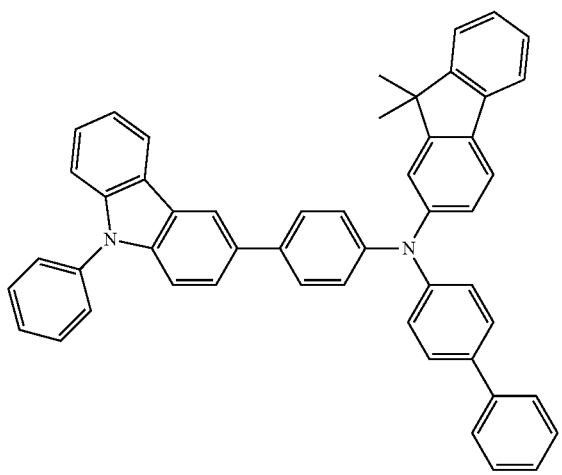
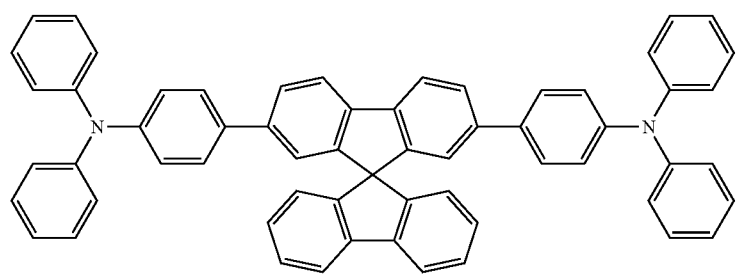
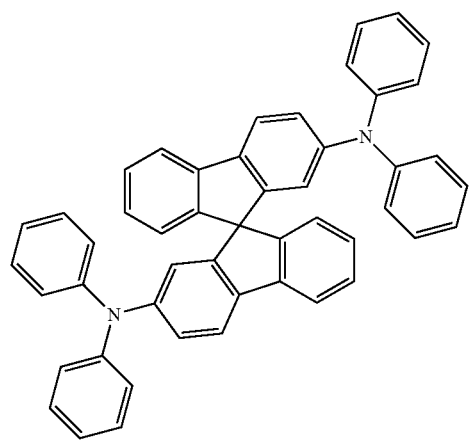

-continued
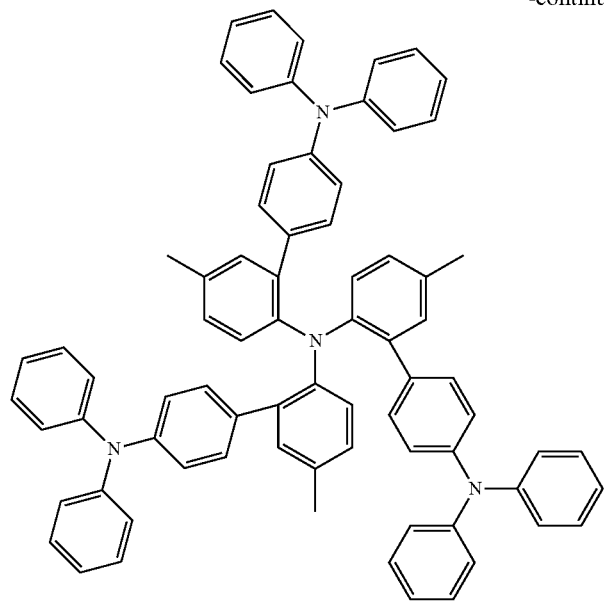
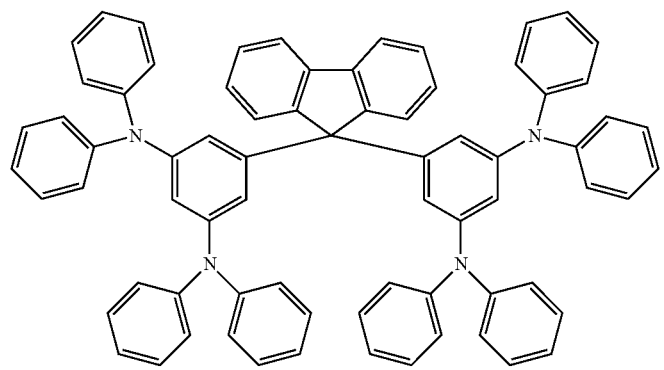
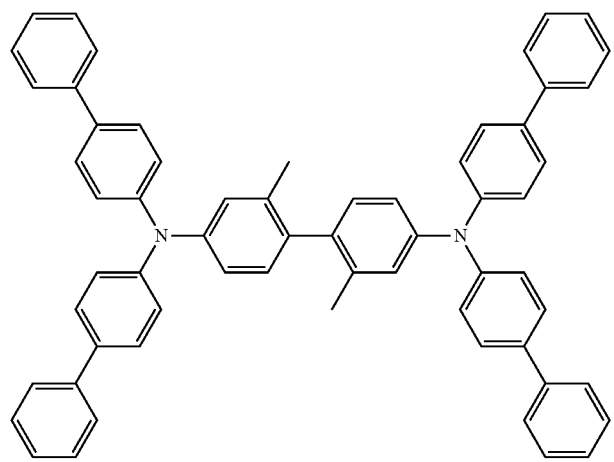

-continued
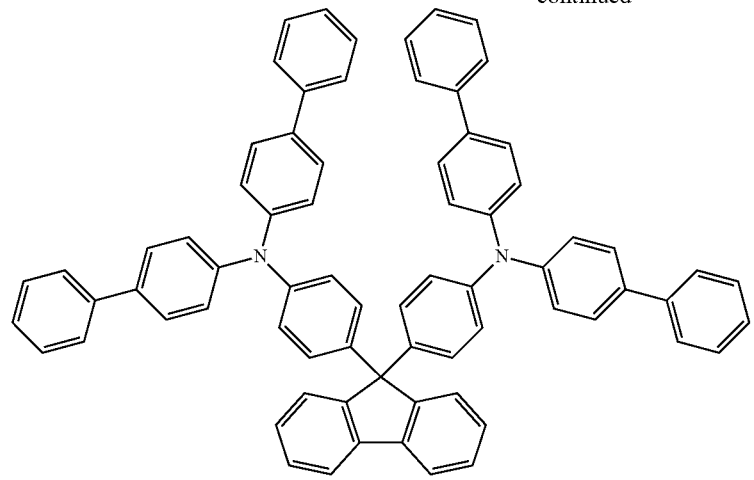
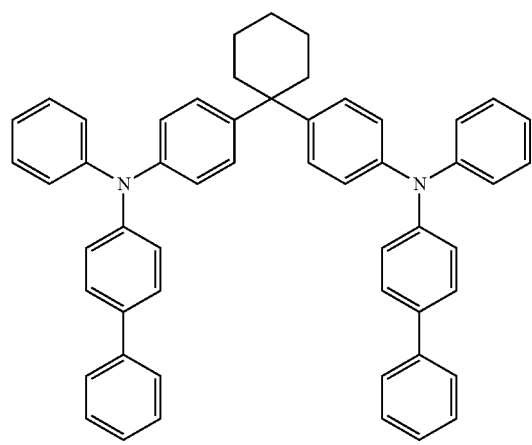
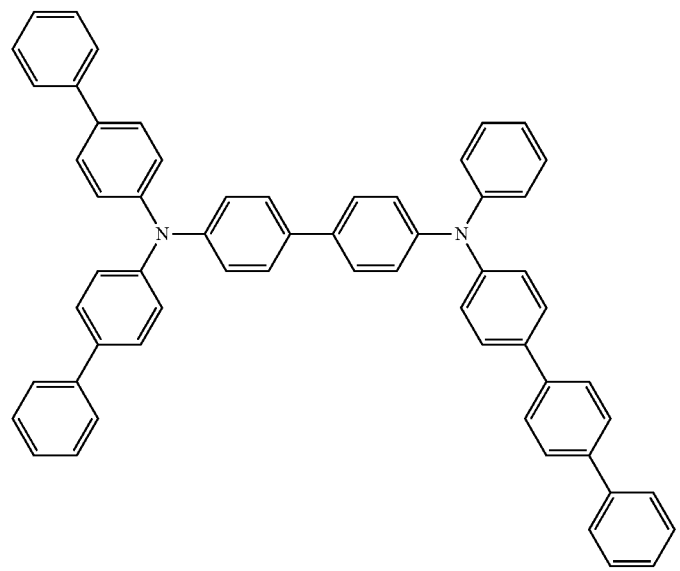

-continued
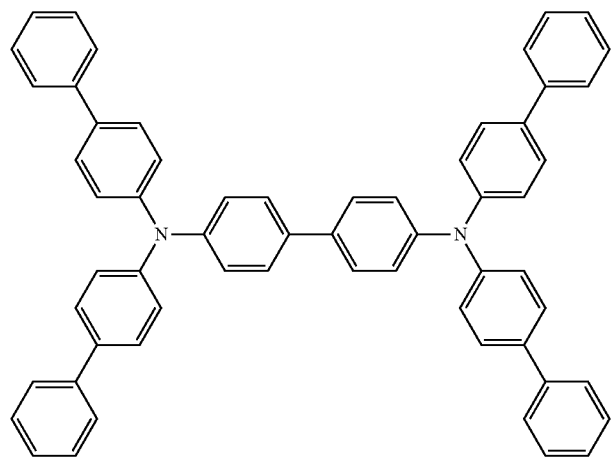
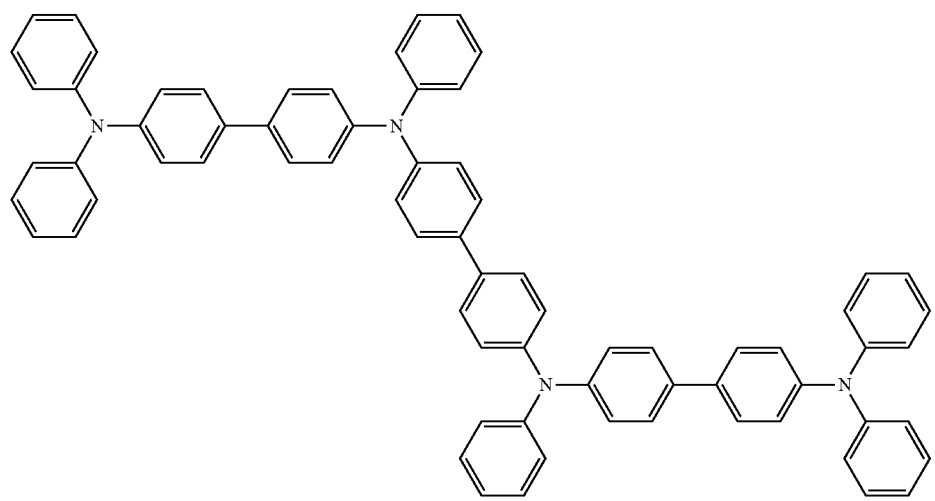
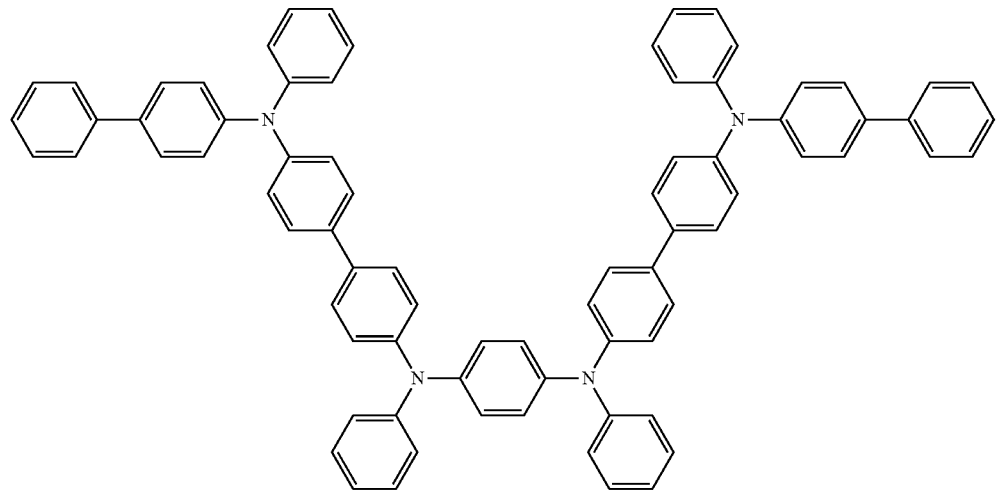

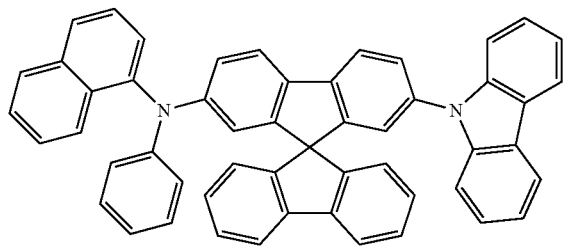
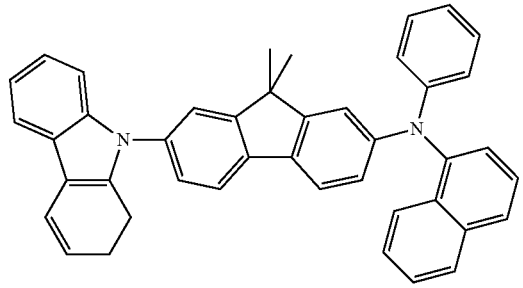

Further preferred hole-conducting compounds which can be employed in the interlayer are diazasilole and tetraazasilole derivatives, in particular having aromatic substituents, as described, for example, in WO 2010/054729.

The preferred embodiments of the emitting layers and of the other layers of the OLED are indicated below.

In the emitting layers, it is generally possible to use all materials as used in accordance with the prior art. As already described above, the emitting compound has been doped into a mixture of at least two matrix materials in at least one emitting layer.

Suitable as phosphorescent compound, as employed in the phosphorescent emitting layer, are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably transition metal compounds, in particular compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (29) to (32),

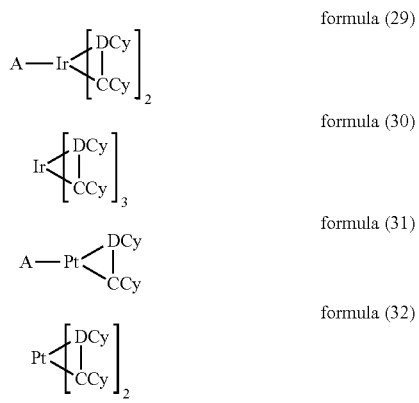

formula (29)

formula (30)

formula (31)

formula (32)

where $R^1$ has the same meaning as described above for formula (1), and the following applies to the other symbols used:
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are bonded to one another via a covalent bond;

CCy is, identically or differently on each occurrence, a cyclic group which contains a carbon atom via which the cyclic group is bonded to the metal and which may in turn carry one or more substituents $R^1$;
A is, identically or differently on each occurrence, a monoanionic, bidentate chelating ligand, preferably a diketonate ligand.

Due to formation of ring systems between a plurality of radicals $R^1$, a bridge may also be present between the groups DCy and CCy. Furthermore, due to formation of ring systems between a plurality of radicals $R^1$, a bridge may also be present between two or three ligands CCy-DCy or between one or two ligands CCy-DCy and the ligand A, giving a polydentate or polypodal ligand system.

Examples of the emitters described above are revealed by the applications WO 2000/70655, WO 2001/41512, WO 2002/02714, WO 2002/15645, EP 1191613, EP 1191612, EP 1191614, WO 2004/081017, WO 2005/033244, WO 2005/042550, WO 2005/113563, WO 2006/008069, WO 2006/061182, WO 2006/081973 and WO 2009/146770 In general, all phosphorescent complexes as used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with what emission colour.

Examples of suitable phosphorescent emitters are shown in the following table.

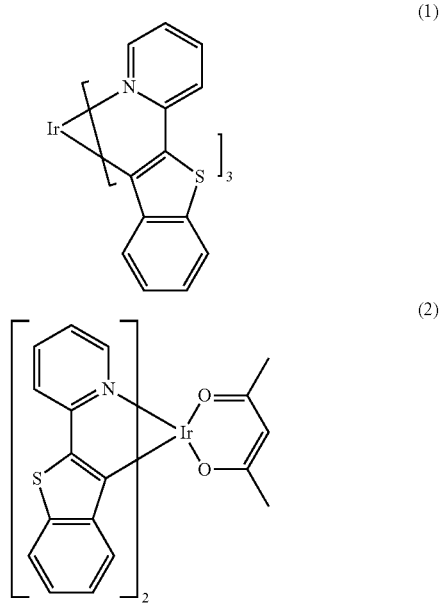

(1)

(2)

(3)
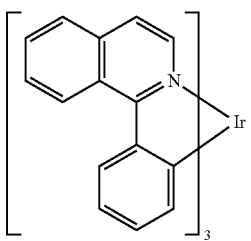
(4)
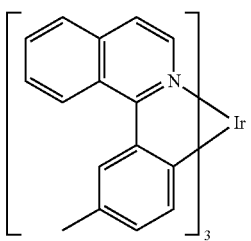
(5)
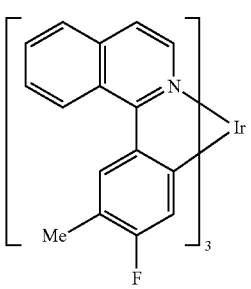
(6)
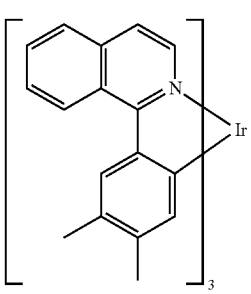
(7)
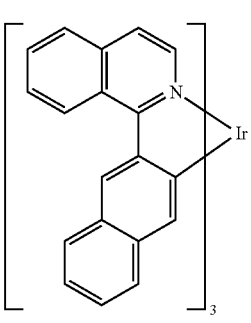
(8)
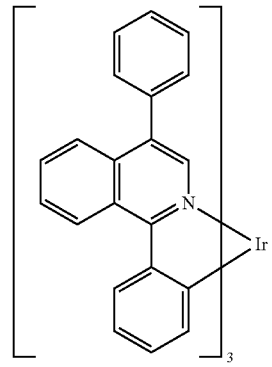
(9)
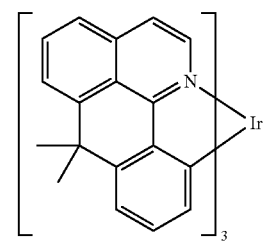
(10)
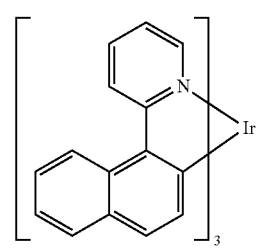
(11)
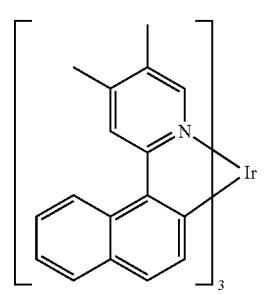
(12)
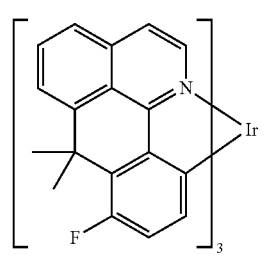

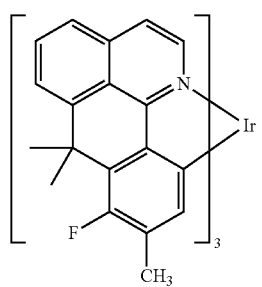
(13)
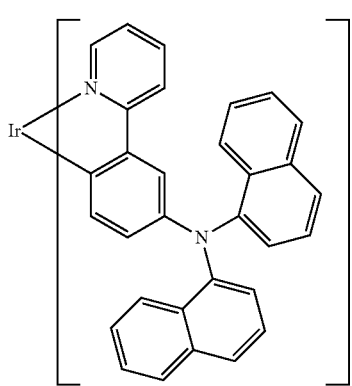
(17)
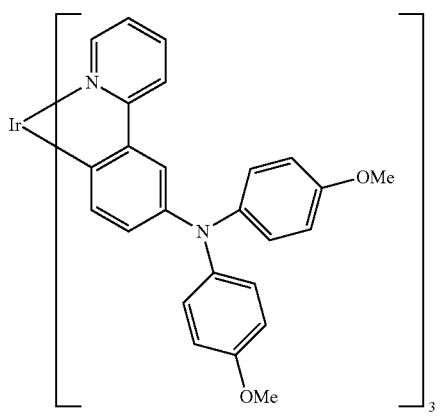
(14)
(15)
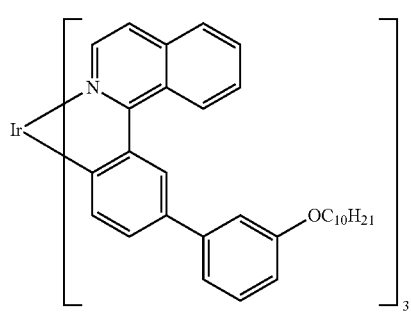
(18)
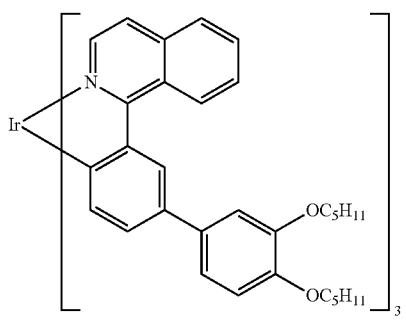
(19)
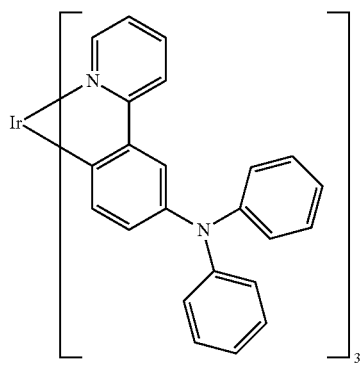
(16)
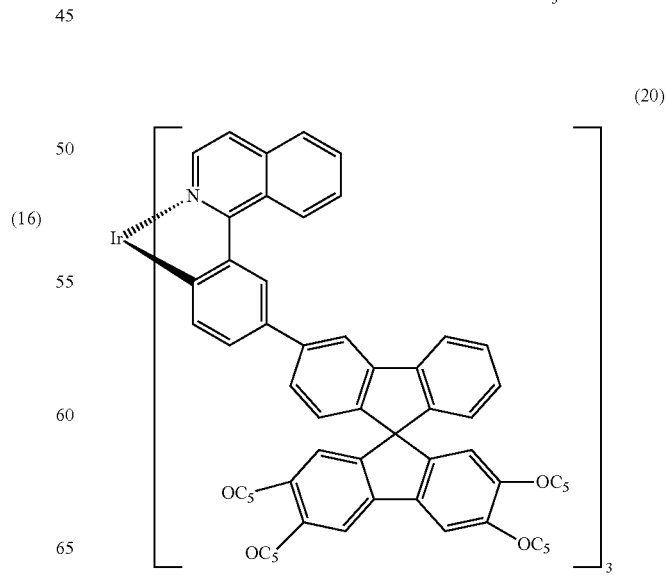
(20)

-continued
(21)
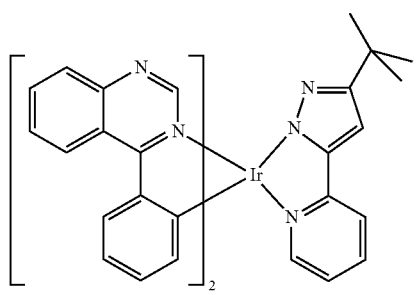
(22)
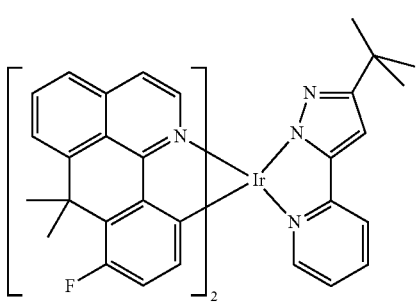
(23)
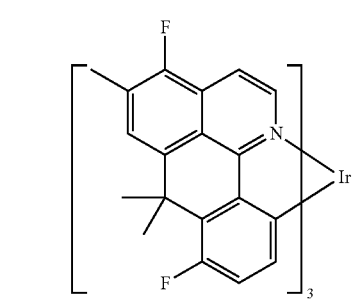
(24)
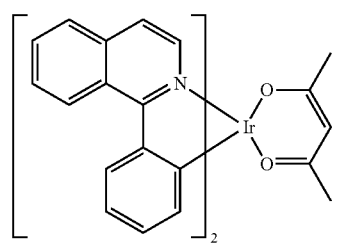
(25)
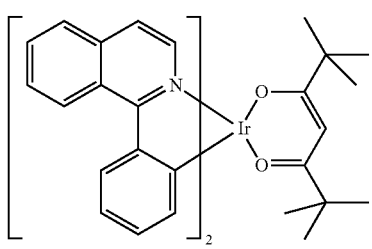
(26)
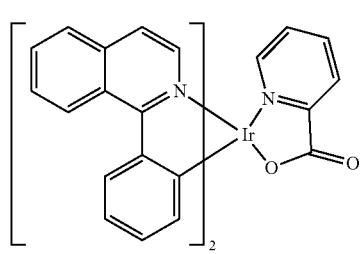
-continued
(27)
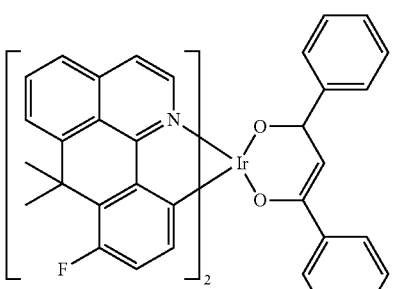
(28)
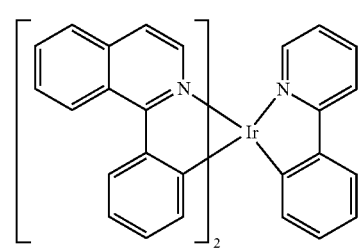
(29)
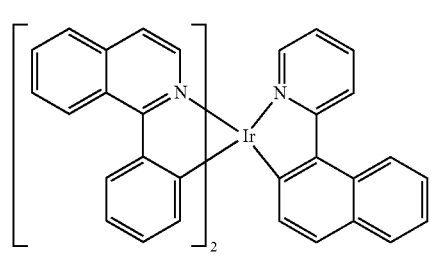
(30)
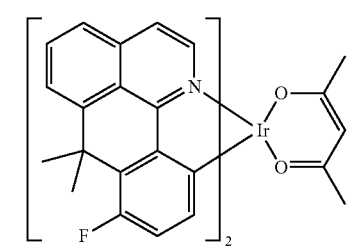
(31)
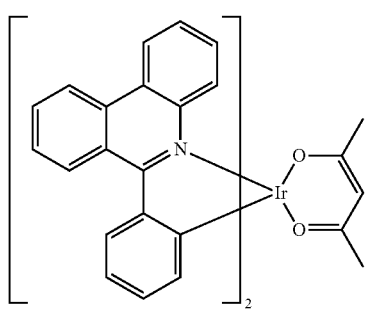
(32)
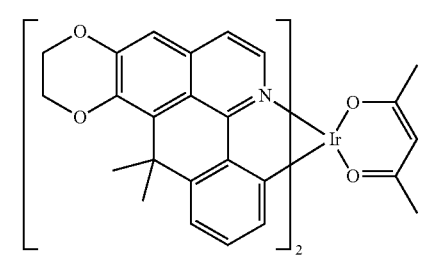

-continued
(33) 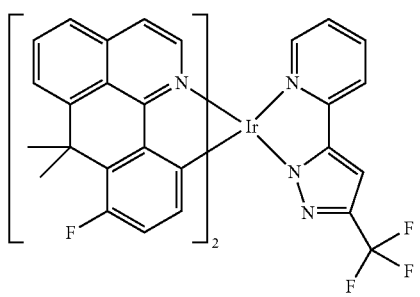
(34) 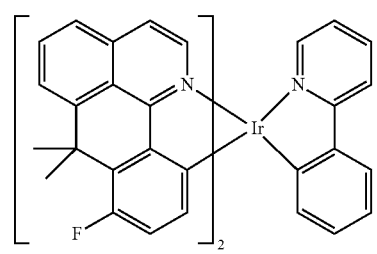
(35) 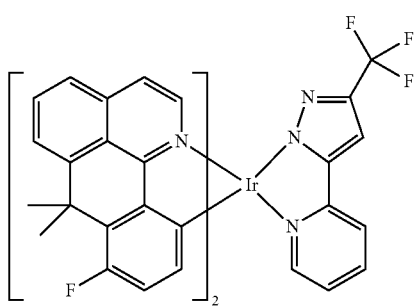
(36) 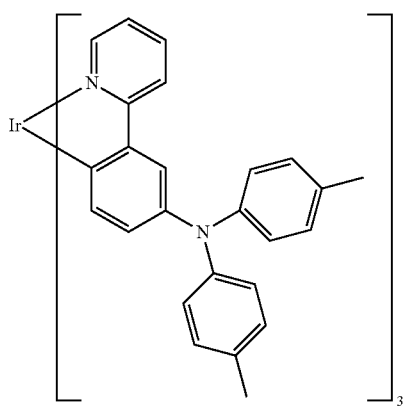
(37) 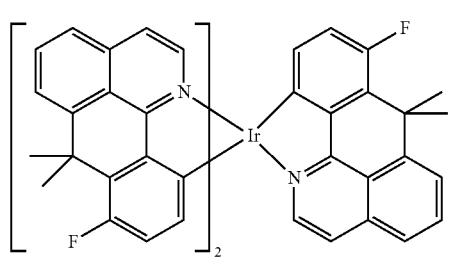
-continued
(38) 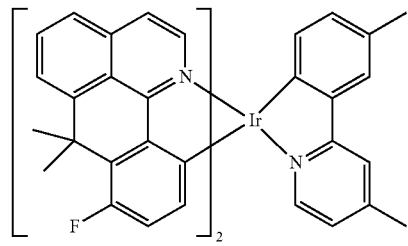
(39) 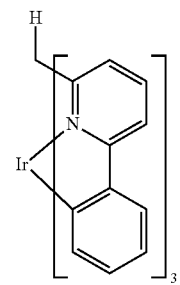
(40) 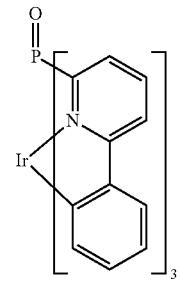
(41) 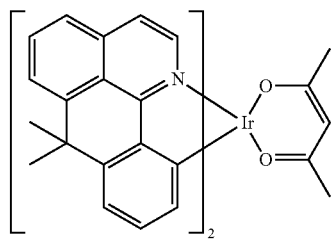
(42) 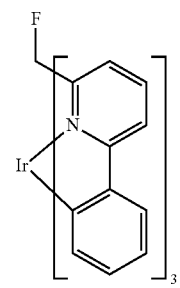
(43) 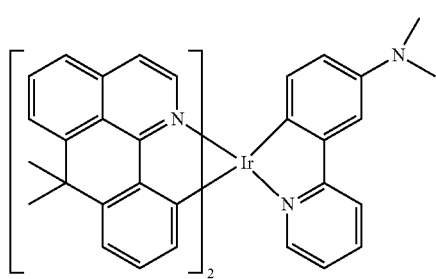

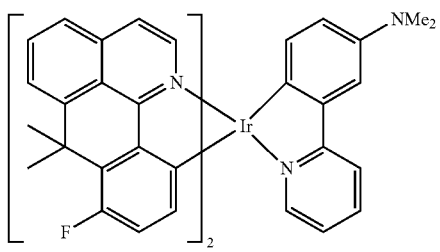
(44)
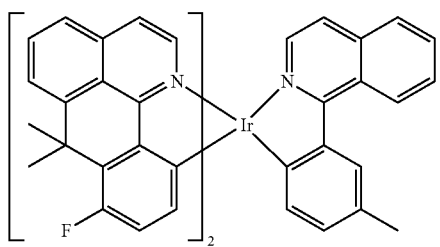
(45)
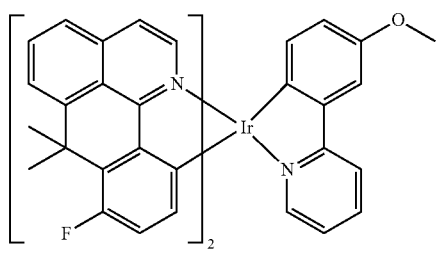
(46)
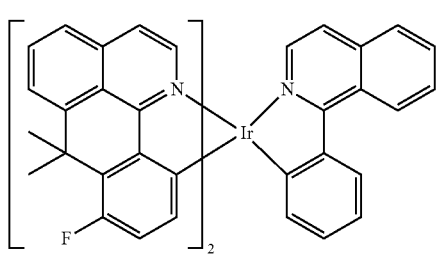
(47)
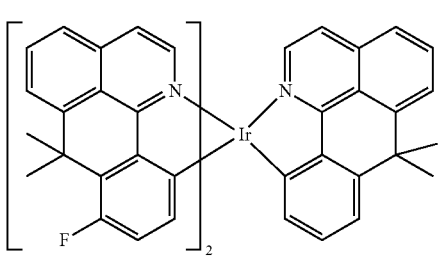
(48)
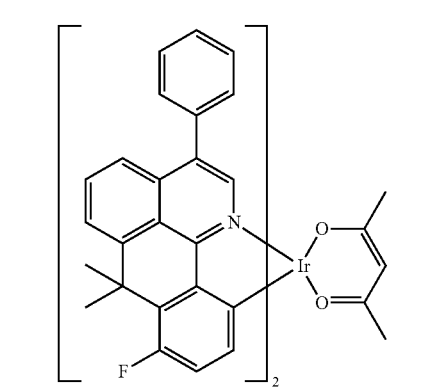
(49)
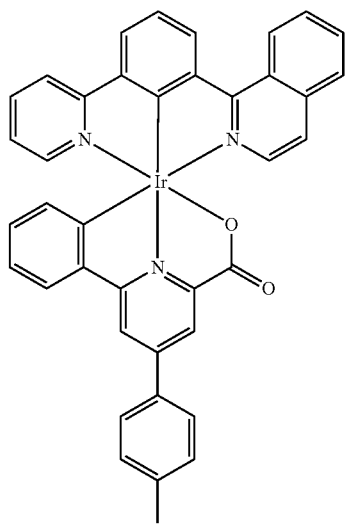
(50)
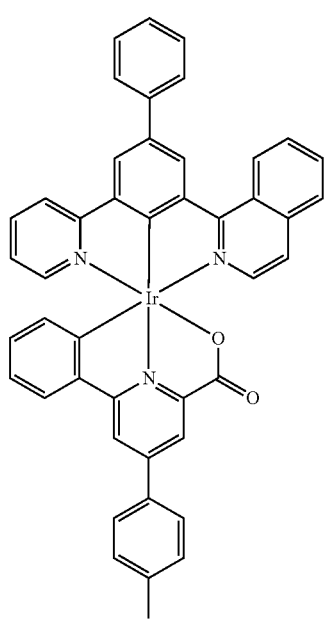
(51)
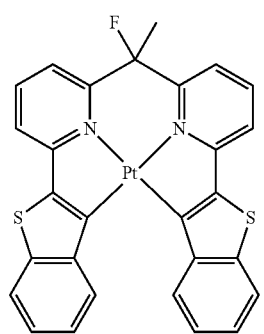
(52)

101
-continued
(53)
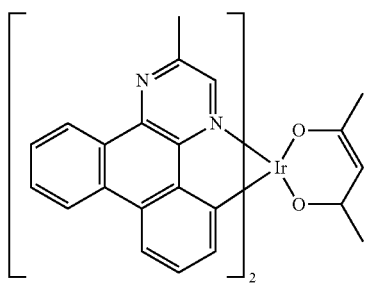
(54)
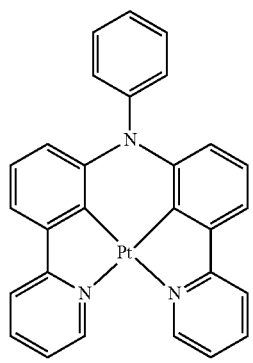
(55)
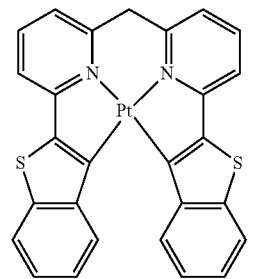
(56)
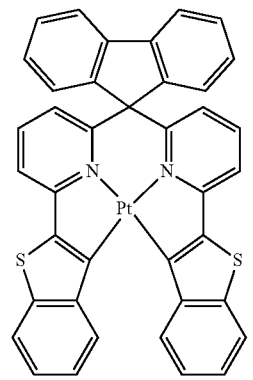
(57)
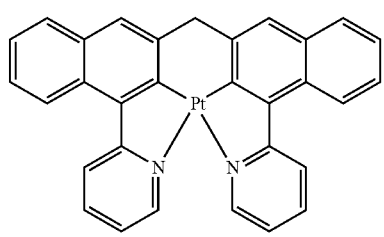
102
-continued
(58)
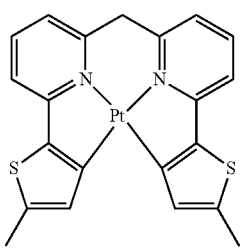
(59)
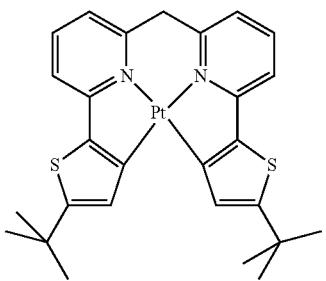
(60)
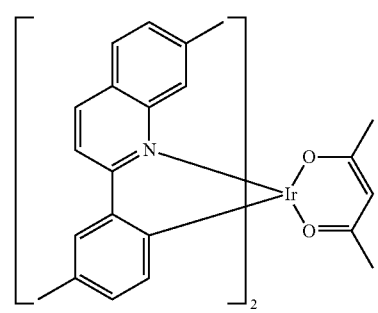
(61)
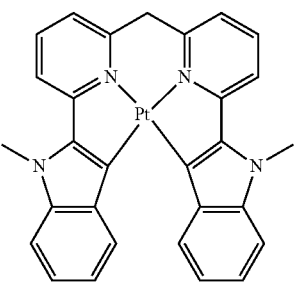
(62)
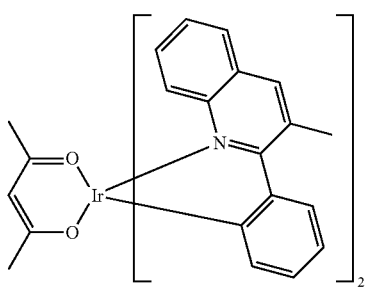

(63)
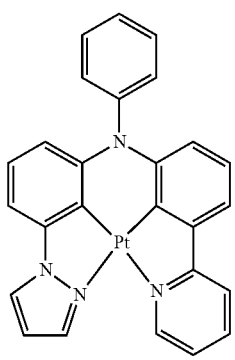
(64)
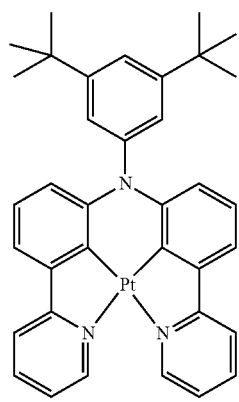
(65)
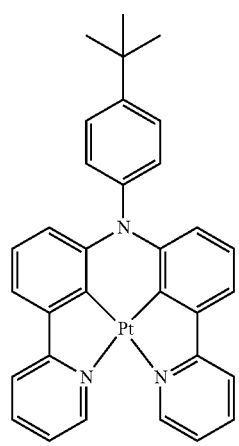
(66)
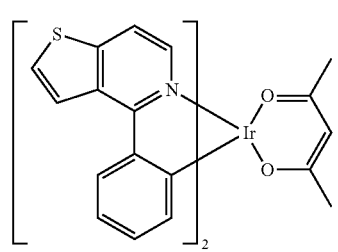
(67)
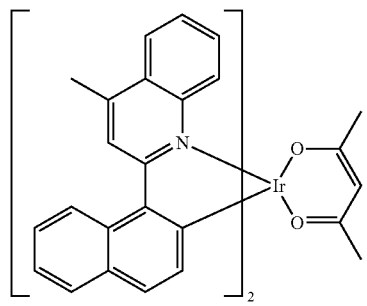
(68)
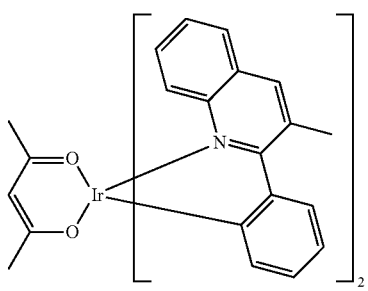
(69)
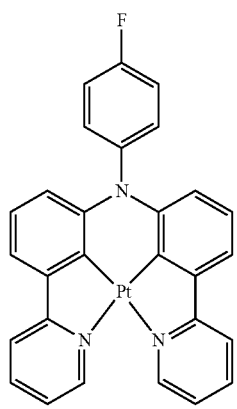
(70)
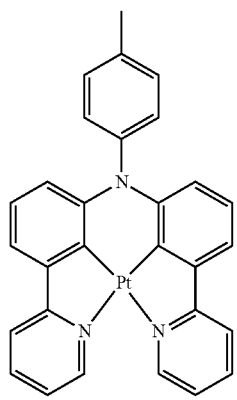

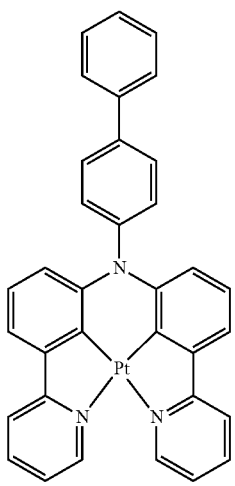 (71)
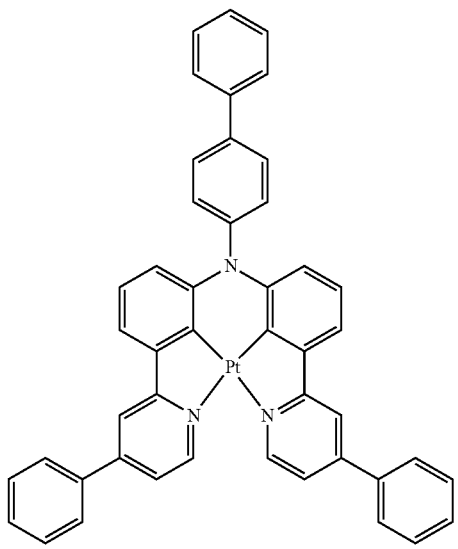 (74)
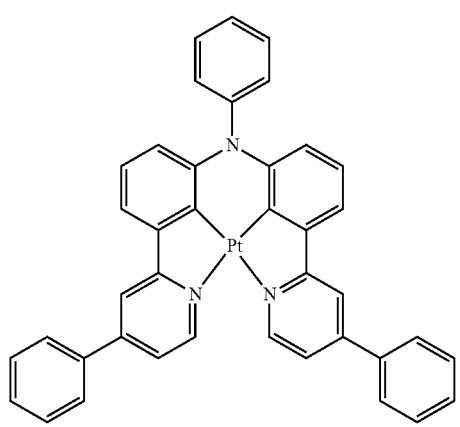 (72)
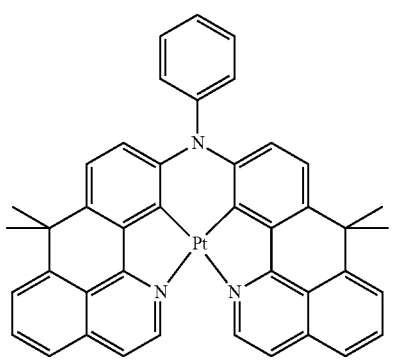 (75)
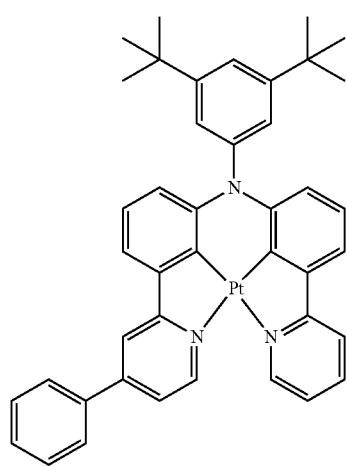 (73)
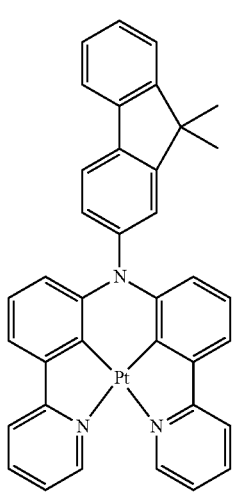 (76)

(77)

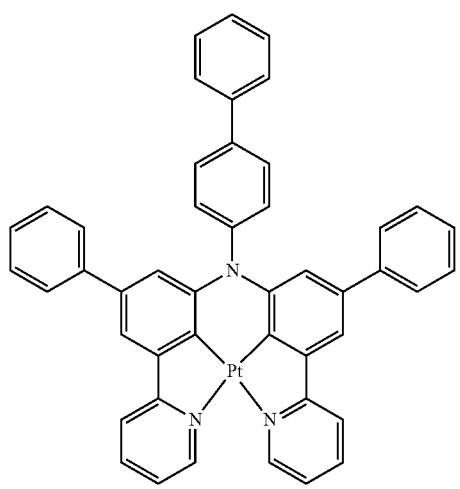

(78)

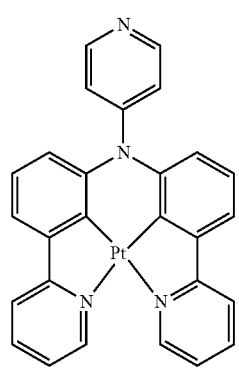

(79)

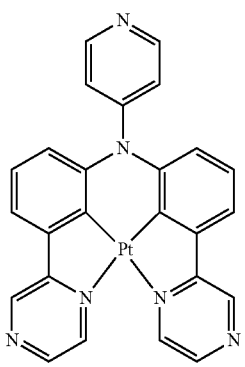

(80)

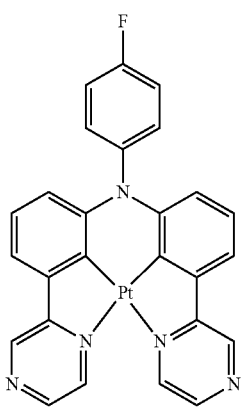

(81)

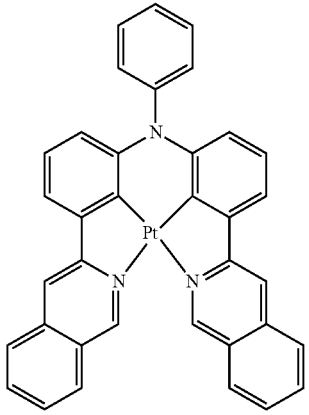

(82)

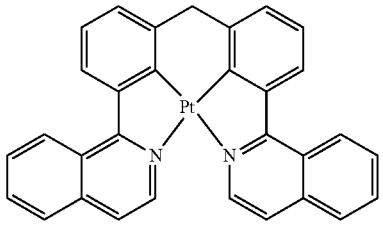

(83)

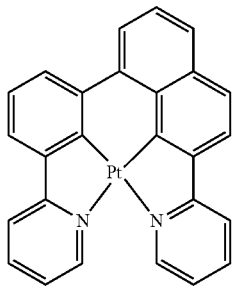

(84)

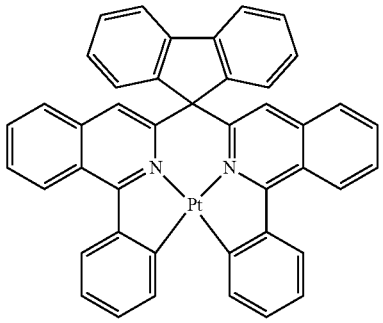

Suitable matrix materials for the phosphorescent compound are various materials as used in accordance with the prior art as matrix materials for phosphorescent compounds. Suitable matrix materials for the phosphorescent emitter are aromatic ketones, in particular selected from compounds of the formula (1) to (5) depicted above or aromatic phosphine oxides or aromatic sulfoxides or sulfones, for example in accordance with WO 2004/013080, WO 2004/093207, WO 2006/005627 or WO 2010/006680, triarylamines, for example NPB, carbazole derivatives, for example CBP (N,N-biscarbazolylbiphenyl), mCBP or the carbazole derivatives disclosed in WO 2005/039246, US 2005/0069729, JP 2004/288381, EP 1205527 or WO 2008/086851, indolocarbazole derivatives, for example in accordance with WO 2007/

063754 or WO 2008/056746, indenocarbazole derivatives, for example in accordance with WO 201 0/1 361 09 and WO 2011/000455, azacarbazole derivatives, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, triazine derivatives, in partiocular selected from compounds of the formula (6) or (7) depicted above, for example in accordance with WO 2010/015306, WO 2007/063754 or WO 2008/056746, zinc complexes, for example in accordance with EP 652273 or WO 2009/062578, diazasilole or tetraazasilole derivatives, for example in accordance with WO 2010/054729, or diazaphosphole derivatives, for example in accordance with WO 2010/054730.

If only precisely one matrix material is used for the phosphorescent emitter, it is preferably a hole-conducting matrix material. This is defined as a compound having an HOMO of >−5.6 eV, preferably >−5.3 eV. It is particularly preferably an arylamine, in particular an arylamine as defined above by the formulae (23) to (28). Examples of suitable hole-conducting matrix materials are NPB or N,N,N',N'-tetrakis(biphenyl)-4,4'-diaminobiphenyl or the other compounds depicted above.

In a further preferred embodiment of the invention, the matrix material for the phosphorescent compound, if it is a hole-conducting matrix material, is the same material which is also used as hole-conducting material in the interlayer.

In a preferred embodiment of the invention, the phosphorescent emitter is doped into a mixture of at least two matrix materials, preferably precisely two matrix materials. The mixing ratio here depends on whether the phosphorescent emitter layer is on the anode side or cathode side. If the phosphorescent emitter layer is on the anode side, the ratio of the hole-conducting matrix material to the electron-conducting matrix material is preferably between 95:5 and 50:50, particularly preferably between 90:10 and 70:30, in each case based on the volume.

Preference is given here to the use of a mixture of a hole-conducting matrix material and an electron-conducting matrix material. This enables the colour location of the white-emitting organic electroluminescent device to be set simply and reproducibly. The hole-conducting compound here is defined as a compound having an HOMO of >−5.6 eV, preferably >−5.3 eV. It is then particularly preferably an arylamine, in particular an arylamine as defined above by the formulae (23) to (28). Examples of suitable hole-conducting matrix materials are NPB or N,N,N',N'-tetrakis-(biphenyl)-4,4'-diaminobiphenyl or the other compounds depicted above.

Furthermore, the electron-conducting compound is defined as a compound having an LUMO of <−2.4 eV, preferably <−2.6 eV. It is particularly preferably a triazine derivative, as defined above by the formulae (6) or (7), or a corresponding pyrimidine or pyrazine derivative or an aromatic ketone, as defined above by the formulae (1) to (5).

In a preferred embodiment of the invention, the matrix material for the phosphorescent compound, if it is an electron-conducting matrix material, is the same material which is also used as electron-conducting material in the interlayer.

In a preferred embodiment of the invention, a mixture of in each case one hole-conducting material and one electron-conducting material is used both in the phosphorescent emitter layer and also in the interlayer. Particularly preferably, the same hole-conducting compounds and the same electron-conducting compounds are used in the phosphorescent emitter layer and in the interlayer.

Furthermore, it may be advantageous to use a mixture of a charge-transporting matrix material and a further matrix material which has neither electron-conducting nor hole-conducting properties in the phosphorescent emitter layer. The charge-transporting matrix material here is a hole-conducting material if the phosphorescent emitter layer is on the anode side, and an electron-conducting material if the phosphorescent emitter layer is on the cathode side. This enables the efficiency and lifetime of the organic electroluminescent device to be increased.

In a preferred embodiment of the invention, the fluorescent emitter layer comprises a fluorescent dopant, in particular a blue-fluorescent dopant, and at least one matrix material. The fluorescent emitter layer particularly preferably comprises a fluorescent dopant, in particular a blue-fluorescent dopant, and precisely one matrix material.

Suitable fluorescent dopants, in particular blue-fluorescent dopants, are selected, for example, from the group of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic pyrenamines, aromatic pyrenediamines, aromatic chrysenamines or aromatic chrysene-diamines. An aromatic anthracenamine is taken to mean a compound in which a diarylamino group is bonded directly to an anthracene group, preferably in the 9-position or in the 2-position. Aromatic pyrenamines, pyrene-diamines, chrysenamines and chrys-enediamines are defined analogously thereto, where the diarylamino groups on the pyrene are preferably bonded in the 1-position or in the 1,6-position. Further preferred dopants are selected from indenofluorenamines or indenofluorenediamines, for example in accordance with WO 2006/108497 or WO 2006/122630, benzoindenofluorenamines or benzoindenofluorenediamines, for example in accordance with WO 2008/006449, and dibenzoindenofluorenamines or dibenzoindenofluorenediamines, for example in accordance with WO 2007/140847. Examples of dopants from the class of the styrylamines are substituted or unsubstituted tristilbenamines or the dopants described in WO 2006/000388, WO 2006/058737, WO 2006/000389, WO 2007/065549 and WO 2007/115610. Furthermore suitable fluorescent dopants are the condensed hydrocarbons disclosed in WO 2010/012328.

Suitable host materials (matrix materials) for the fluorescent dopants, in particular for the above-mentioned dopants, are selected, for example, from the classes of the oligoarylenes (for example 2,2',7,7-tetraphenyl-spirobifluorene in accordance with EP 676461 or dinaphthylanthracene), in particular the oligoarylenes containing condensed aromatic groups, in particular anthracenes, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052), the benzanthracene derivatives (for example benz[a]anthracene derivatives in accordance with WO 2008/145239 or in accordance with the unpublished DE 102009034625.2) and the benzophenanthrene derivatives (for example benz[c]phenanthrene derivatives in accordance with WO 2010/083869). Particularly preferred host materials are selected from the classes of the oligoarylenes, containing naphthalene, anthracene, benzanthracene, in particular benz[a]anthracene, benzophenanthrene, in particular benz[c]phenanthrene, and/or pyrene, or atropisomers of these compounds. Very particularly preferred matrix materials for the fluorescent emitter are anthracene derivatives. An oligoarylene in the sense of this invention is intended to be taken to mean a compound in which at least three aryl or arylene groups are bonded to one another.

If the fluorescent emitter layer comprises a mixture of two matrix materials, then one of the two matrix materials is preferably selected from the group of the oligoarylenes, as described above, in particular the anthracene derivatives. The second matrix material of the mixture is then preferably a hole-conducting material, which is defined by an HOMO of >−5.6 eV, preferably >−5.3 eV. It is then particularly preferably an arylamine, in particular an arylamine as defined above by the formulae (23) to (28). Examples of suitable hole-conducting matrix materials are NPB or N,N,N',N'-tetrakis(biphenyl)-4,4'-diaminobiphenyl.

Apart from cathode, anode, the emitting layers and the interlayer which have been described above, the organic electroluminescent device may also comprise further layers which are not depicted in FIG. 1. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. Furthermore, the layers, in particular the charge-transport layers, may also be doped. The doping of the layers may be advantageous for improved charge transport. However, it should be pointed out that each of these layers does not necessarily have to be present, and the choice of the layers is always dependent on the compounds used.

The use of layers of this type is known to the person skilled in the art, and he will be able, without inventive step, to use all materials in accordance with the prior art which are known for layers of this type for this purpose.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.), likewise organic alkali-metal complexes, for example Liq (lithium quinolinate). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent or partially transparent in order to facilitate the coupling-out of light. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, also in combination with the interlayers according to the invention.

Suitable charge-transport materials, as can be used in the hole-injection or hole-transport layer or in the electron-transport layer of the organic electroluminescent device according to the invention, are, for example, the compounds disclosed in Y. Shirota et al., Chem. Rev. 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 2006/122630 or WO 2006/100896), the amine derivatives disclosed in EP 1661888, hexaazatriphenylene derivatives (for example in accordance with WO 2001/049806), amine derivatives containing condensed aromatic ring systems (for example in accordance with U.S. Pat. No. 5,061,569), the amine derivatives disclosed in WO 95/09147, monobenzoindenofluorenamines (for example in accordance with WO 2008/006449) or dibenzoindenofluorenamines (for example in accordance with WO 2007/140847). Hole-transport and hole-injection materials which are furthermore suitable are derivatives of the compounds depicted above, as disclosed in JP 2001/226331, EP 676461, EP 650955, WO 2001/049806, U.S. Pat. No. 4,780,536, WO 98/30071, EP 891121, EP 1661888, JP 2006/253445, EP 650955, WO 2006/073054 and U.S. Pat. No. 5,061,569.

Suitable hole-transport or hole-injection materials are furthermore, for example, the materials listed in the following table.

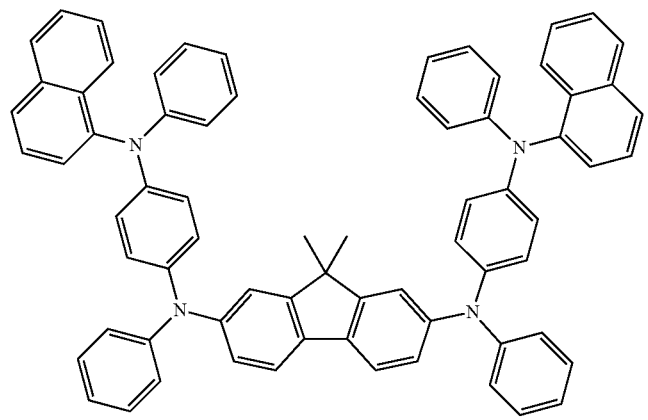
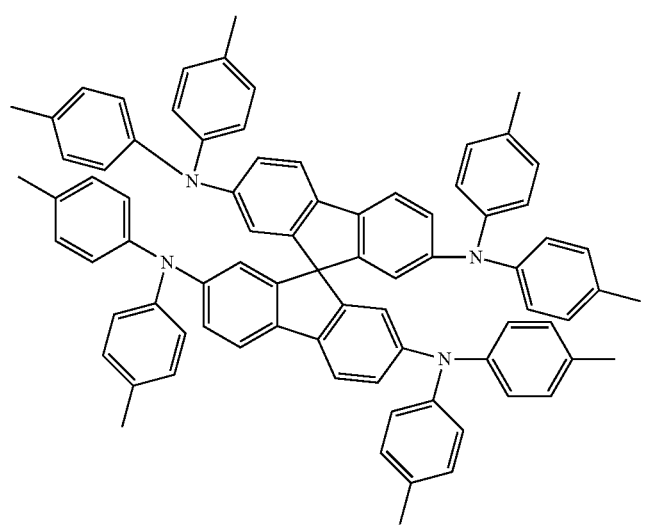
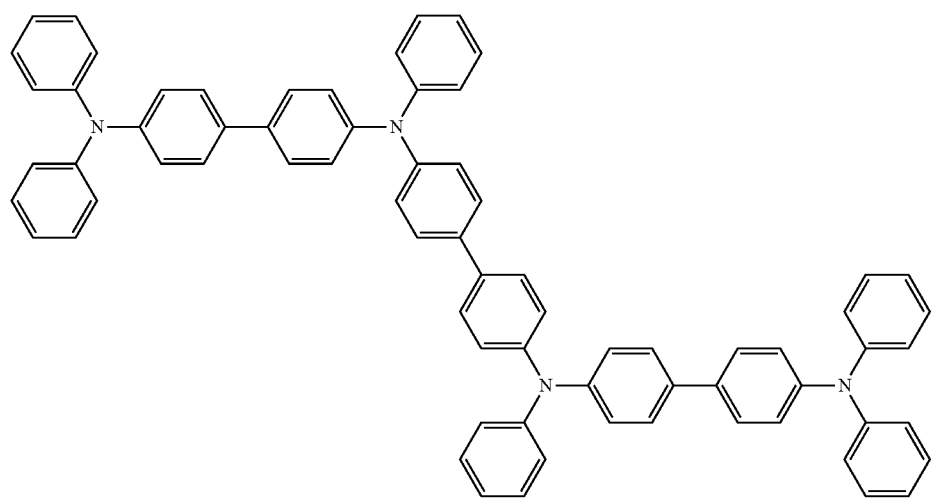

-continued
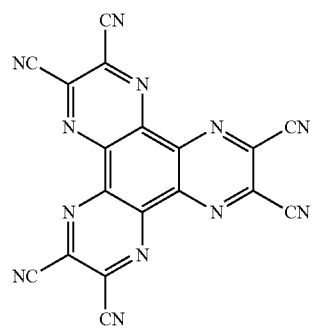
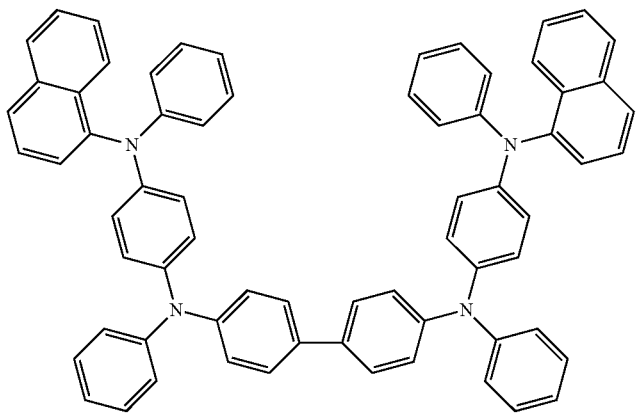
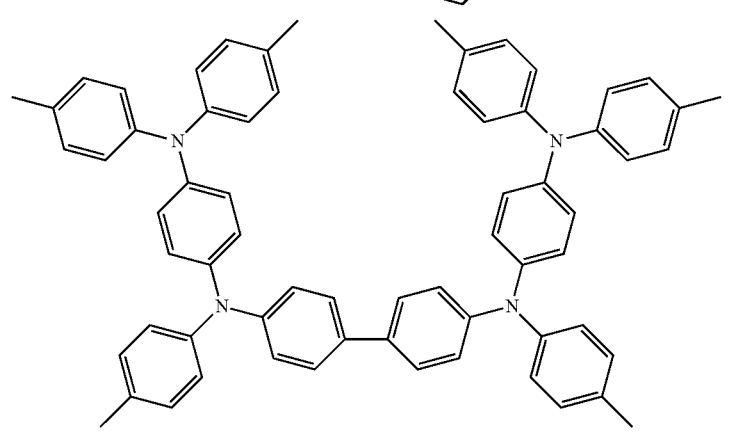
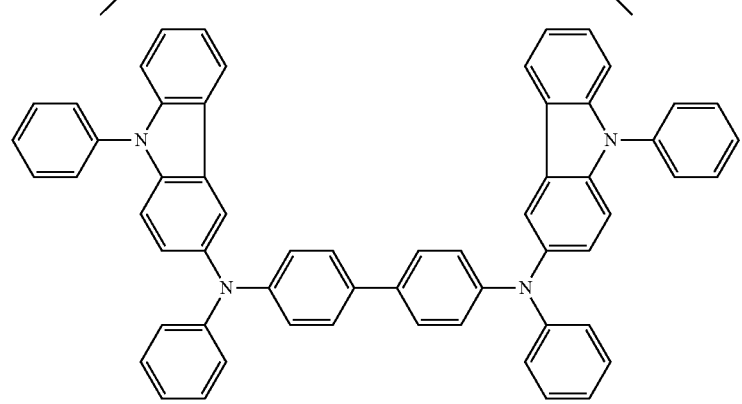
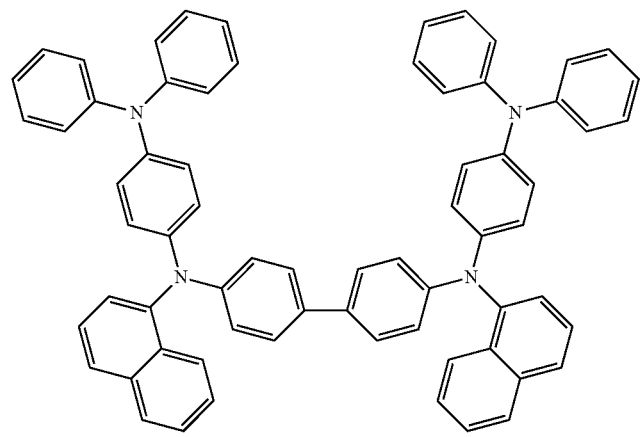

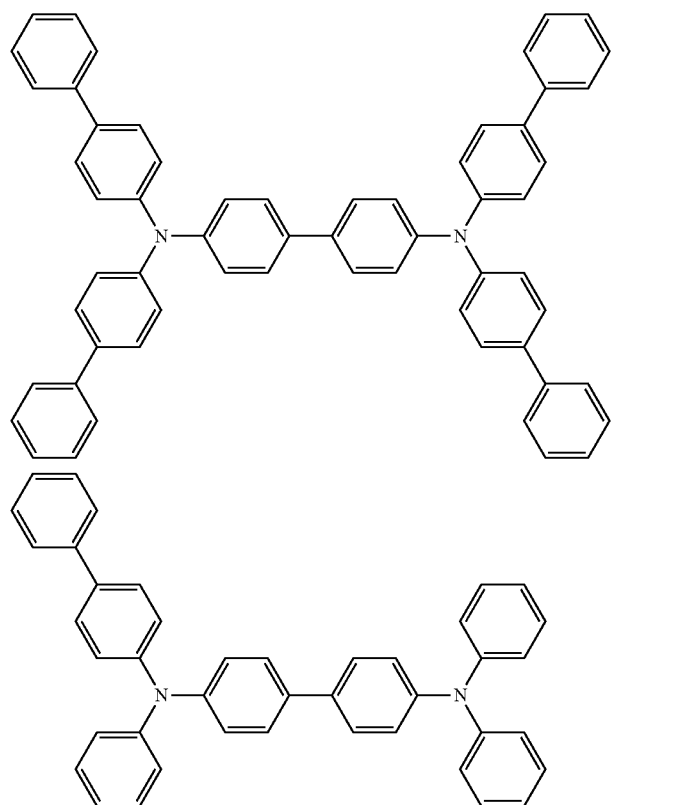
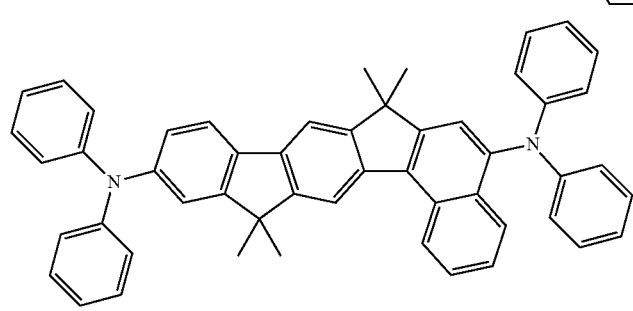
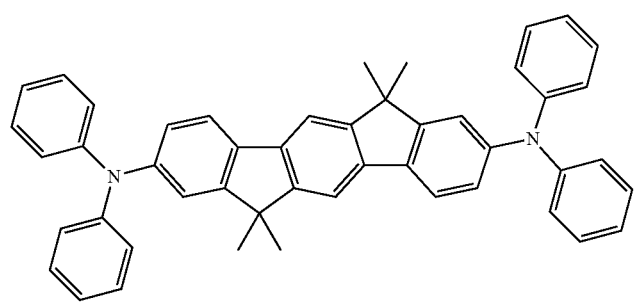

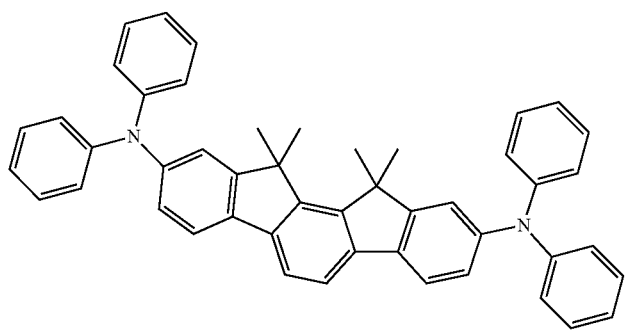
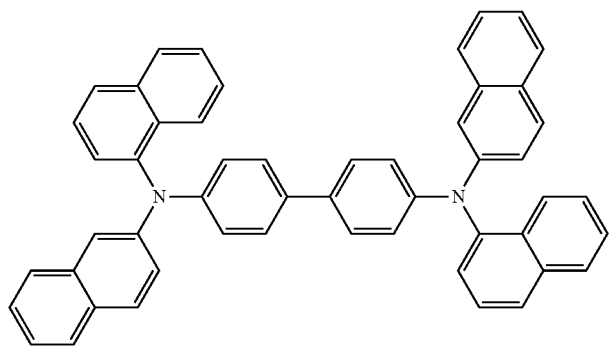
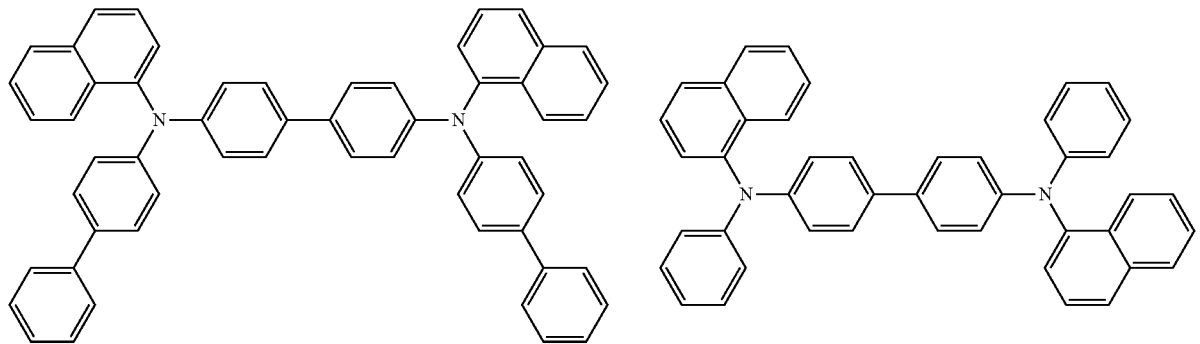
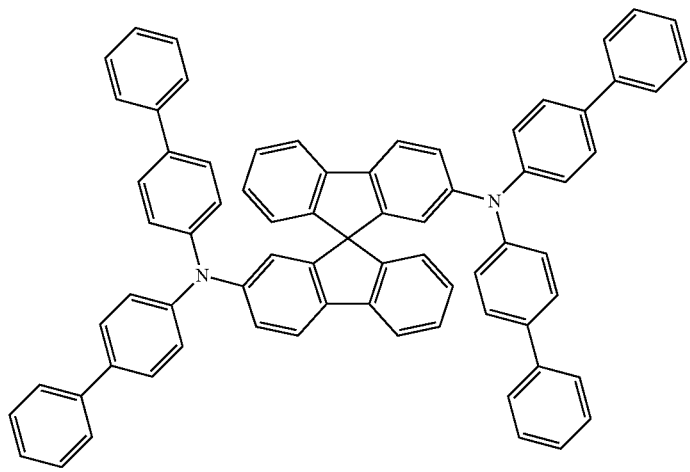

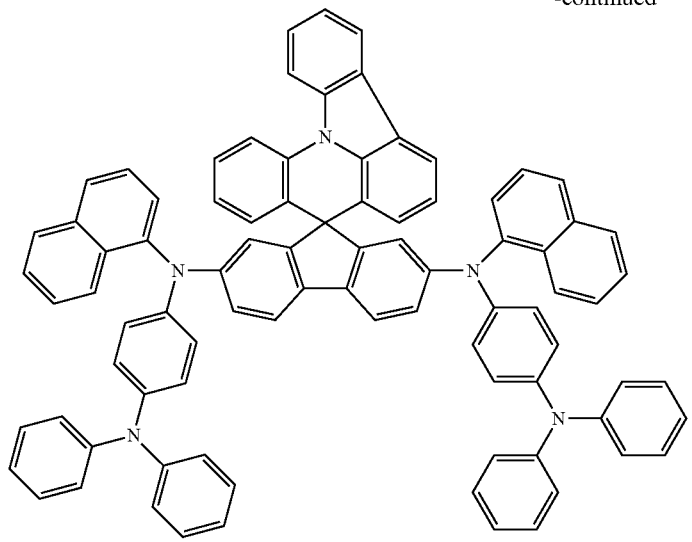

Materials which can be used for the electron-transport layer are all materials as used in accordance with the prior art as electron-transport materials in the electron-transport layer. Particularly suitable are aluminium complexes, for example $Alq_3$, zirconium complexes, for example $Zrq_4$, benzimidazole derivatives, triazine derivatives, for example compounds of the above-mentioned formulae (6) or (7), or aromatic ketones, for example compounds of the formulae (1) to (5) given above. Suitable materials are, for example, the materials listed in the following table. Other suitable materials are derivatives of the compounds depicted above, as disclosed in JP 2000/053957, WO 2003/060956, WO 2004/028217 and WO 2004/080975.

It may also be preferred to employ two separate electron-transport layers. This may have advantages with respect to the luminance dependence of the colour location of the electroluminescent device (see, for example, WO 2010/102706).

It is furthermore possible for the electron-transport layer to be doped. Suitable dopants are alkali metals or alkali-metal compounds, such as, for example, Liq (lithium quinolinate). In a preferred embodiment of the invention, the electron-transport layer is doped, in particular, when the electron-transport material is a benzimidazole derivative or a triazine derivative. The preferred dopant is then Liq.

Preference is furthermore given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), ink-jet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

These processes are generally known to the person skilled in the art and can be applied by him without inventive step to the organic electroluminescent devices according to the invention.

The organic electroluminescent device according to the invention has the following surprising advantages over the prior art:

1. The organic electroluminescent device according to the invention has very high efficiency.
2. The organic electroluminescent device according to the invention at the same time has a very good operating lifetime.
3. In the case of organic electroluminescent device according to the invention, the colour location can be set simply and reproducibly by variation of the mixing ratio of the matrix materials in the emitting layer which comprises at least two matrix materials, and/or by variation of the mixing ratio of the hole-conducting material and electron-conducting material of the interlayer.
4. The organic electroluminescent device according to the invention has high stability of the colour location at different luminances.

The invention is described in greater detail by the following examples without wishing to restrict it thereby. The person skilled in the art will be able, without being inventive, to carry out the invention throughout the range disclosed and thus produce further organic electroluminescent devices according to the invention.

EXAMPLES
Production and Characterisation of Organic Electroluminescent Devices in Accordance with the Invention
Electroluminescent devices according to the invention can be produced as described, for example, in WO 2005/003253. The structures of the materials used are depicted below for clarity.
HIM
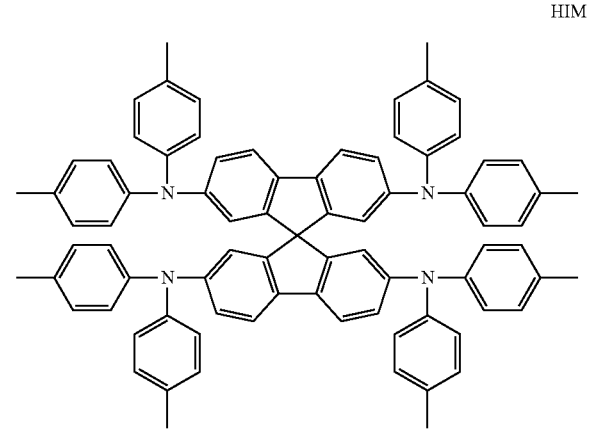
NPB
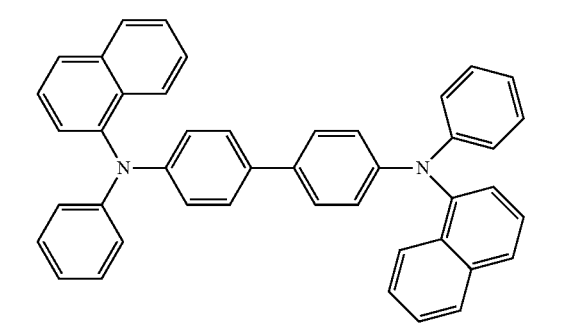
TER1
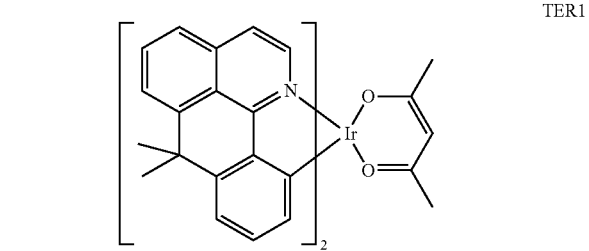
TER2
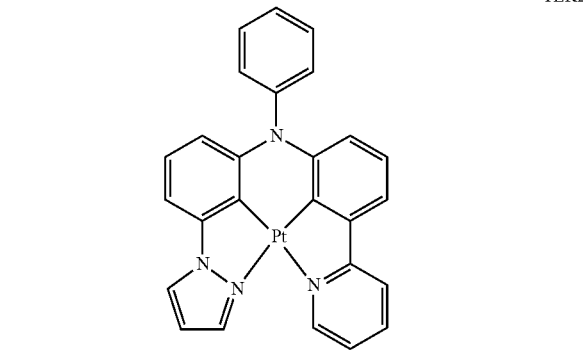
TER3
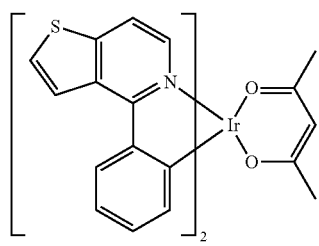
TMM
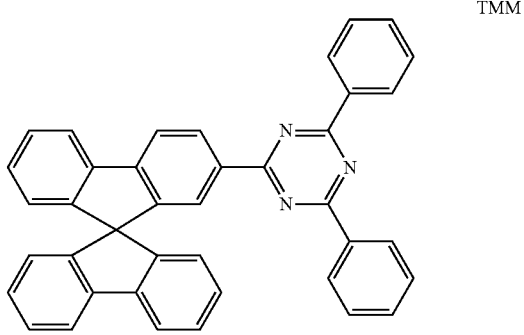
BH
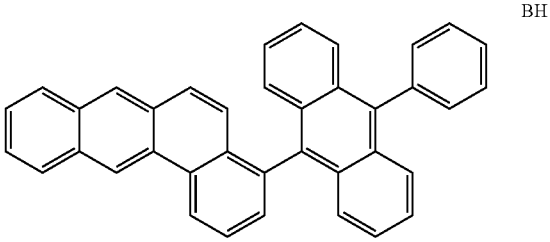
BD
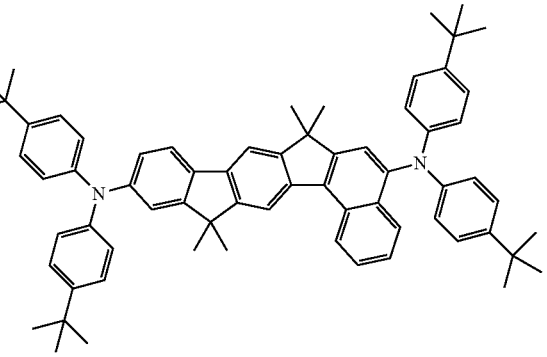

-continued

ETM

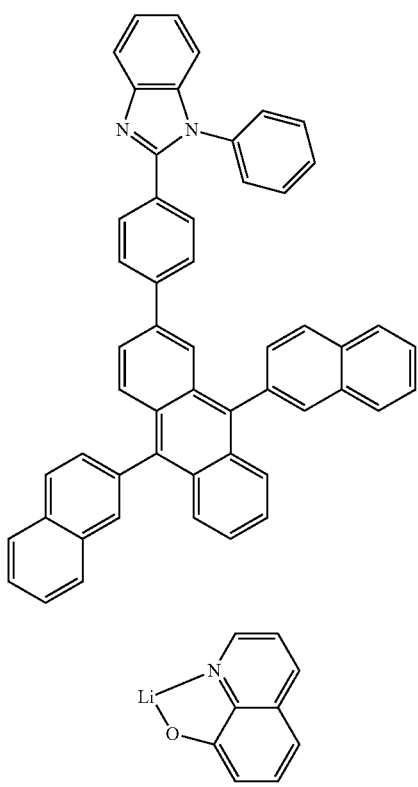

Liq

These as yet unoptimised OLEDs are characterised by standard methods; for this purpose, the electroluminescence spectra and colour coordinates (in accordance with CIE 1931), the efficiency (measured in cd/A) as a function of the luminance, the operating voltage, calculated from current-voltage-luminous density characteristic lines (IUL characteristic lines), and the lifetime are determined. The results obtained are summarised in Table 1.

The results for various white OLEDs are compared below. These are each hybrid-white OLEDs. They contain (in this sequence starting with the anode) a phosphorescent orange or yellow emission layer, an interlayer and a fluorescent blue emission layer. The per cent figures for the individual substances in the layers relate to % by vol.

Example 1

Examples 1 a-c according to the invention are achieved by the following layer structure: 150 nm of HIM, 10 nm of NPB, 20 nm of mixed layer consisting of (in case 1a) TMM (38%), NPB (55%), TER1 (7%); (in case 1 b) TMM (18%), NPB (75%), TER1 (7%); (in case 1c) TMM (5%), NPB (88%), TER1 (7%), 5 nm of interlayer consisting of TMM (50%) and NPB (50%), 40 nm of BH doped with 5% of BD, 20 nm of BH, 10 nm of mixed layer consisting of ETM (50%) and Liq (50%) 100 nm of Al.

In this example, the mixing ratio of the interlayer is left constant and the mixing ratio of the host materials in the phosphorescent emitter layer is varied. It can be seen that this enables the colour to be adjusted. Although the use of TER1 as emitter, which typically emits colour coordinates of CIE 1931 0.62/0.38 in the monochrome device, results in departure from the Planck curve in this case on increasing tuning into the red, this can, however, in principle be avoided by the use of an emitter which emits more yellow (see Examples 5 and 6). However, the principle is also evident with TER1. At the same time, it can be seen that the emission has good efficiency, which could not be achieved through the use of two fluorescent emission layers and which allows the conclusion that significant extinction of emission does not occur. This in turn shows that the interlayer does its job. In addition, the OLEDs produced have a long operating lifetime, which is also not impaired by the interlayer (see also Comparative Example 3)

Examples 2 a-d

Examples 2 a-d according to the invention are achieved by the following layer structure: 150 nm of HIM, 10 nm of NPB, 20 nm of mixed layer consisting of TMM (8%), NPB (85%), TER1 (7%), 10 nm of interlayer consisting of (in case a) TMM (20%) and NPB (80%); (in case b) TMM (40%) and NPB (60%); (in case c) TMM (60%) and NPB (40%); (in case d) TMM (80%) and NPB (20%), 40 nm of BH doped with 5% of BD, 20 nm of BH, 10 nm of mixed layer consisting of ETM (50%) and Liq (50%) 100 nm of Al.

In this example, it is demonstrated how the emission colour can be tuned over a very broad range by changing the mixing ratio in the interlayer. Various hues can be achieved from bluish white at CIE 0.28/0.28 via pure white at CIE 0.33/0.31 to reddish white at 0.54/0.37.

Example 3 (Comparative Example)

In Example 3, which serves as comparative example, the following layer structure is achieved: 150 nm of HIM, 10 nm of NPB, 20 nm of mixed layer consisting of TMM (8%), NPB (85%), TER1 (7%), 40 nm of BH doped with 5% of BD, 20 nm of BH, 10 nm of mixed layer consisting of ETM (50%) and Liq (50%) 100 nm of Al.

The comparative example corresponds to the layer structure from Example 2a, only that the interlayer is now omitted. It can be seen that the emission in this case is less efficient than on use of the interlayer according to the invention.

Example 4 (Comparative Example)

In Examples 4a and 4b, which serve as comparative examples, the following layer structure is achieved: 150 nm of HIM, 10 nm of NPB, 20 nm of mixed layer (in case a) comprising TMM (93%) and TER1 (7%); (in case B) comprising NPB (93%) and TER1 (7%), 40 nm of BH doped with 5% of BD, 20 nm of BH, 10 nm of mixed layer consisting of ETM (50%) and Liq (50%) 100 nm of Al.

The comparative examples show that without the use of the mixture according to the invention of two host materials in the phosphorescent emitter layer, the desired white emission is not achieved. On use of exclusively TMM as host material, exclusively the phosphorescent emitter layer emits. The emission colour of 0.62/0.38 corresponds to the colour of a monochrome OLED using TER1. On use of exclusively NPB as host material, by contrast, the phosphorescent emitter layer makes virtually no contribution to the emission, and a relatively ineffective pale-blue emission is obtained. The measured operating lifetimes of Comparative Examples 4a and 4b are also below the values obtained in the components according to the invention from Examples 1 and 2.

Example 5

Example 5 is achieved by the following layer structure: 150 nm of HIM, 10 nm of NPB, 20 nm of mixed layer consisting of TMM (18%), NPB (75%), TER2 (7%), 5 nm of interlayer consisting of TMM (66%) and NPB (34%), 40 nm of BH doped with 5% of BD, 20 nm of BH, 10 nm of mixed layer consisting of ETM (50%) and Liq (50%) 100 nm of Al.

In this example, in contrast to the previous examples, phosphorescent emitter TER2, which is yellower compared with TER1, is used. This is useful, in particular, in order to obtain a warm-white hue in the vicinity of illuminant A (CIE 0.45/0.41), for example for lighting applications. A suitable choice of the mixing ratios in the phosphorescent emitter layer and in the interlayer enables a colour of CIE 0.44/0.41 to be achieved here, where the emission simultaneously has high efficiency and a long operating lifetime.

Example 6

Example 6 is achieved by the following layer structure: 150 nm of HIM, 10 nm of NPB, 20 nm of mixed layer consisting of TMM (38%), NPB (55%), TER3 (7%), 5 nm of interlayer consisting of TMM (66%) and NPB (34%), 40 nm of BH doped with 5% of BD, 20 nm of BH, 10 nm of mixed layer consisting of ETM (50%) and Liq (50%) 100 nm of Al.

In this example, phosphorescent emitter TER3 is used. Here too, a suitable choice of the mixing ratios in the phosphorescent emitter layer enables a warm-white colour of, in the specific case, CIE 0.45/0.45 to be achieved. Here too, the emission simultaneously has high efficiency and a long operating lifetime.

Overall, the examples make it clear that the combination of the inventive features—a) use of precisely two emitter layers, namely one phosphorescent layer and one fluorescent layer, and b) use of a mixture of two host materials in an emitter layer, c) use of an interlayer consisting of a mixture of two materials—enables a number of advantages of the OLEDs produced to be achieved simultaneously: 1. ability to set the colour location in a very wide range which is relevant for industrial applications in display and lighting, 2. high efficiency, 3. long operating lifetime.

It is true that the use of two phosphorescent emitters or two fluorescent emitters is not shown explicitly as comparative example. This would require other emitters and also other OLED designs, which would make a direct comparison with the examples shown impossible in any case. However, it is generally known that purely fluorescent white OLEDs have lower efficiency than mixed fluorescent/phosphorescent (=hybrid) white OLEDs and that purely phosphorescent white OLEDs generally have an only moderate operating lifetime. The OLED according to the invention is therefore a special design of a hybrid OLED which functions particularly well, with the materials described being particularly suitable for this purpose.

TABLE 1

Device results

| Ex. (*= cmp.) | 1st emission layer (+emitter see description) | Interlayer | Efficiency [cd/A] at 1000 cd/m² | Voltage [V] at 1000 cd/m² | CIE x/y at 1000 cd/m² | Lifetime 50% [h], initial luminance 1000 cd/m² |
|---|---|---|---|---|---|---|
| 1a | TMM(38%):NPB(55%) | TMM:NPB (1:1) | 21 | 4.6 | 0.43/0.33 | 8000 |
| 1b | TMM(18%):NPB(75%) | TMM:NPB (1:1) | 21 | 4.5 | 0.42/0.32 | 15000 |
| 1c | TMM(5%):NPB(88%) | TMM:NPB (1:1) | 15 | 4.9 | 0.36/0.32 | 9000 |
| 2a | TMM(8%):NPB(85%) | TMM:NPB (1:4) | 13 | 5.0 | 0.28/0.28 | 12000 |
| 2b | TMM(8%):NPB(85%) | TMM:NPB (2:3) | 14 | 5.0 | 0.33/0.31 | 10000 |
| 2c | TMM(8%):NPB(85%) | TMM:NPB (3:2) | 16 | 5.0 | 0.40/0.33 | 8000 |
| 2d | TMM(8%):NPB(85%) | TMM:NPB (4:1) | 20 | 5.0 | 0.54/0.37 | 4000 |
| 3* | TMM(8%):NPB(85%) | — | 9 | 5.0 | 0.28/0.28 | 10000 |
| 4a* | TMM(93%) | — | 25 | 5.0 | 0.62/0.38 | 5000 |
| 4b* | NPB(93%) | — | 7 | 4.8 | 0.23/0.27 | 7000 |
| 5 | TMM(18%):NPB(75%) | TMM:NPB (2:1) | 22 | 5.2 | 0.44/0.40 | 14000 |
| 6 | TMM(38%):NPB(55%) | TMM:NPB (2:1) | 26 | 5.2 | 0.45/0.45 | 10000 |

The invention claimed is:

1. An organic electroluminescent device comprising anode, cathode, and two emitting layers, wherein one emitting layer comprises a phosphorescent compound and the other emitting layer comprises a fluorescent compound, and wherein at least one non-emitting interlayer is present between the two emitting layers, and wherein the phosphorescent compound is doped into a mixture of at least two matrix materials.

2. The organic electroluminescent device of claim 1, wherein the layer emitting at longer wavelength comprises the phosphorescent compound and the layer emitting at shorter wavelength comprises the fluorescent compound.

3. The organic electroluminescent device of claim 1, wherein said organic electroluminescent device is a white-emitting organic electroluminescent device which emits light having CIE color coordinates in the range 0.25<CIE x<0.45 and 0.25<CIE y<0.48.

4. The organic electroluminescent device of claim 1, wherein the layer comprising a fluorescent compound is a blue-emitting layer and the layer comprising the phosphorescent compound is a yellow-, orange- or red-emitting emitter layer.

5. The organic electroluminescent device of claim 1, wherein the layer comprising a phosphorescent compound is on the anode side and the layer comprising a fluorescent compound is on the cathode side.

6. The organic electroluminescent device of claim 1, wherein said interlayer comprises a mixture of at least one hole-conducting material and at least one electron-conducting material, and wherein the triplet energy of said hole-conducting material and said electron-conducting material is greater than the triplet energy of the emitter of the adjacent layer comprising a phosphorescent compound.

7. The organic electroluminescent device of claim 6, wherein said hole-conducting material has an HOMO of >−5.4 eV, and wherein the electron-conducting has an LUMO of <−2.4 eV.

8. The organic electroluminescent device of claim 6, wherein said electron-conducting material is selected from the group consisting of aromatic ketones, triazine, and pyrimidine or pyrazine derivatives substituted by at least one aromatic or heteroaromatic ring system.

9. The organic electroluminescent device of claim 6, wherein said hole-conducting compound is an aromatic diamine, triamine, or tetramine, or a diazasilole or tetraazasilole derivative.

10. The organic electroluminescent device of claim 1, wherein the matrix material for the phosphorescent compound is selected from the group consisting of aromatic ketones, aromatic phosphine oxides, aromatic sulfoxides or sulfones, triarylamines, carbazole derivatives, indolocarbazole derivatives, indenocarbazole derivatives, azacarbazole derivatives, bipolar matrix materials, silanes, azaboroles, boronic esters, triazine derivatives, zinc complexes, diazasilole or tetraazasilole derivatives, and diazaphosphole derivatives.

11. The organic electroluminescent device of claim 1, wherein if precisely one matrix material is used for the phosphorescent compound, it is a hole-conducting matrix material having an HOMO of >−5.6 eV, and wherein, if a mixture of a hole-conducting matrix material and an electron-conducting matrix material is used, said hole-conducting matrix material has a HOMO of >−5.6 eV and said electron-conducting matrix material has a LUMO of <−2.4 eV.

12. The organic electroluminescent device of claim 1, wherein if the matrix material for the phosphorescent compound is a hole-conducting matrix material, it is the same material used as hole-conducting material in the interlayer, or wherein if the matrix material for the phosphorescent compound is an electron-conducting matrix material, it is the same material used as electron-conducting material in the interlayer, or wherein if a mixture of one hole-conducting material and one electron-conducting material is used both in the layer comprising a phosphorescent compound and also in the interlayer, the same hole-conducting compounds and the same electron-conducting compounds are used.

13. The organic electroluminescent device of claim 1, wherein a mixture of a charge-transporting matrix material and a further matrix material which has neither electron-conducting nor hole-conducting properties is used in the layer comprising a phosphorescent compound.

14. The organic electroluminescent device of claim 1, wherein the layer comprising a fluorescent compound further comprises a fluorescent dopant selected from the group consisting of monostyrylamines, distyrylamines, tristyrylamines, tetrastyrylamines, styrylphosphines, styryl ethers, arylamines, and condensed hydrocarbons, and wherein the layer comprising a fluorescent compound further comprises a matrix material selected from the group consisting of oligoarylenes, oligoarylenevinylenes, polypodal metal complexes, hole-conducting compounds, electron-conducting compounds, boronic acid derivatives, anthracene derivatives, benzanthracene derivatives, and benzophenanthrene derivatives.

15. A process for the production of the organic electroluminescent device of claim 1 comprising coating one or more layers by means of a sublimation process, organic vapour phase deposition, with the aid of carrier-gas sublimation, or from solution or by means of a printing process.

16. The organic electroluminescent device of claim 14, wherein the matrix material comprises at least one oligoarylenese containing condensed aromatic groups.

* * * * *